(12) United States Patent
Uchimaru et al.

(10) Patent No.: US 7,427,443 B2
(45) Date of Patent: Sep. 23, 2008

(54) LOW DIELECTRIC CONSTANT INSULATING MATERIAL AND SEMICONDUCTOR DEVICE USING THE MATERIAL

(75) Inventors: Yuko Uchimaru, Tsukuba (JP); Masami Inoue, Tokyo (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 97 days.

(21) Appl. No.: 10/809,704

(22) Filed: Mar. 26, 2004

(65) Prior Publication Data

US 2006/0097393 A1  May 11, 2006

(30) Foreign Application Priority Data

Sep. 8, 2003  (JP) ............... 2003-315923

(51) Int. Cl.
*B32B 9/04* (2006.01)
*C08G 77/56* (2006.01)

(52) U.S. Cl. ............... 428/447; 528/4; 528/7; 528/25; 528/31; 528/37

(58) Field of Classification Search ............... None
See application file for complete search history.

(56) References Cited

FOREIGN PATENT DOCUMENTS

| JP | 2968244 | 8/1999 |
|---|---|---|
| JP | 3041424 | 3/2000 |
| JP | 2002-155143 | * 5/2002 |
| JP | 2002-317049 | 10/2002 |
| JP | 2002-359240 | 12/2002 |
| JP | 2003-119289 | 4/2003 |

OTHER PUBLICATIONS

"Evaluation of Low-k Polymer Film containing Borazine Unit" authored by Uchimaru et al. and published in Extended Abstracts (the 62nd Autumn Meeting, 2001); The Japan Society of Applied Physics and Related Societies, Sep. 11-14, 2001, p. 656.*
"Borazine-Siloxane Polymer and it's Application" authored by Inoue et al. and published in the Proceedings of the Symposium on Semiconductors and Integrated Circuits Technology, 2002, 63, p. 96-101.*
International Technology Roadmap for Semiconductors 2002 Update, 2002 Update Tables, p. 75, "Table 62A MPU Interconnect Technology Requirements—Near-Term", 2002.
S. Shinmiyahara, et al., Cu-Interconnect Technology, p. 227, "Latest Development of Cu Wiring Techniques", (with partial English translation), May 30, 1998.

* cited by examiner

*Primary Examiner*—Marc S Zimmer
(74) *Attorney, Agent, or Firm*—Oblon, Spivak, McClelland, Maier & Neustadt, P.C.

(57) ABSTRACT

The use of a material possessing a six-member borazine ring consisting of at least boron and nitrogen elements in the form of a low dielectric constant insulating film in a hard mask, a Cu diffusion barrier layer and an etching stopper which are necessary when low dielectric constant interlayer insulating films and Cu wiring in the multilayer interconnection of an LSI allows the parasitic capacity between the multilayer wirings to be suppressed and enables the ULSI to produce a high-speed operation.

6 Claims, 27 Drawing Sheets

FIG. 1a
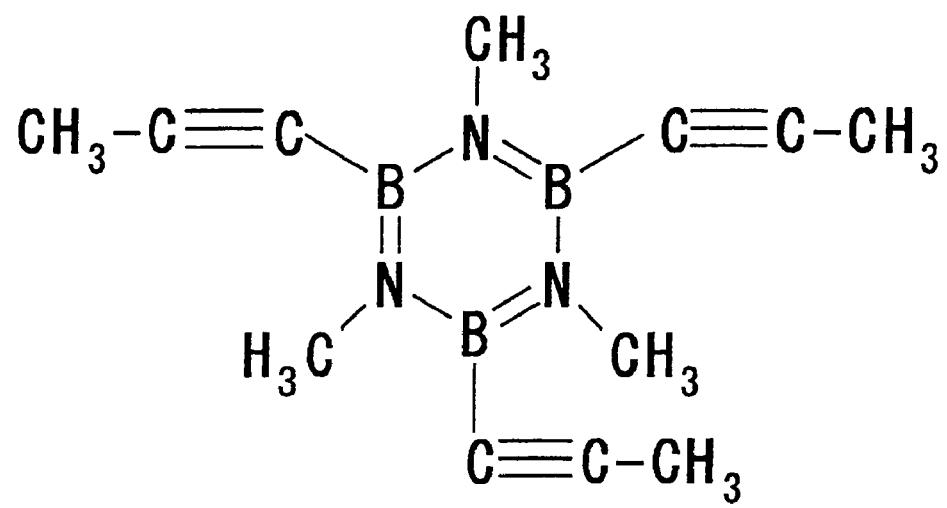
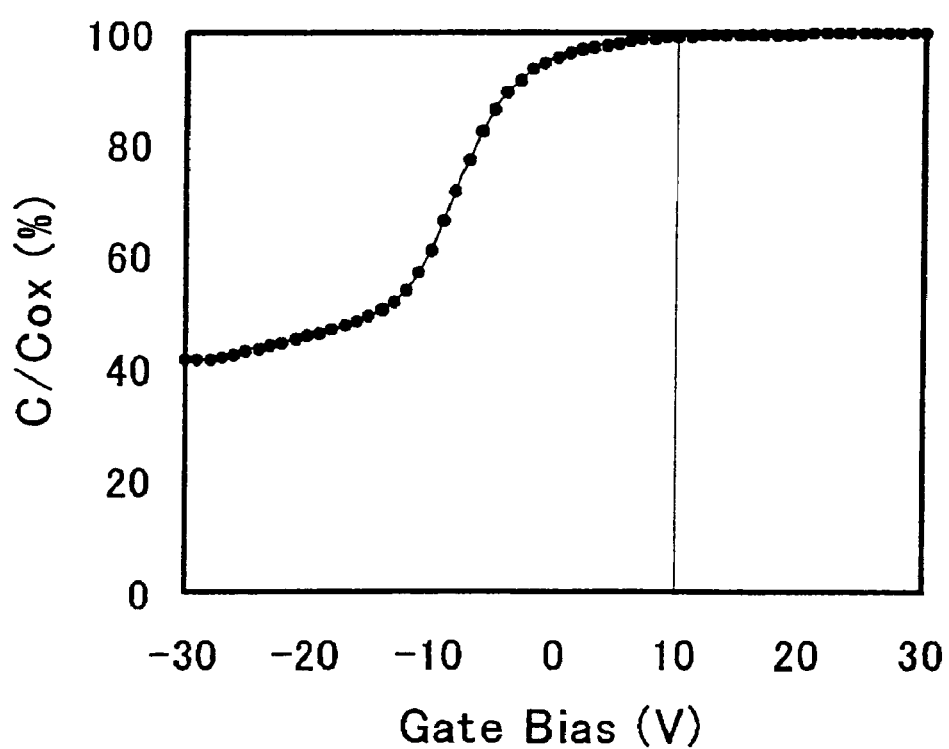
FIG. 1b

F I G. 3a
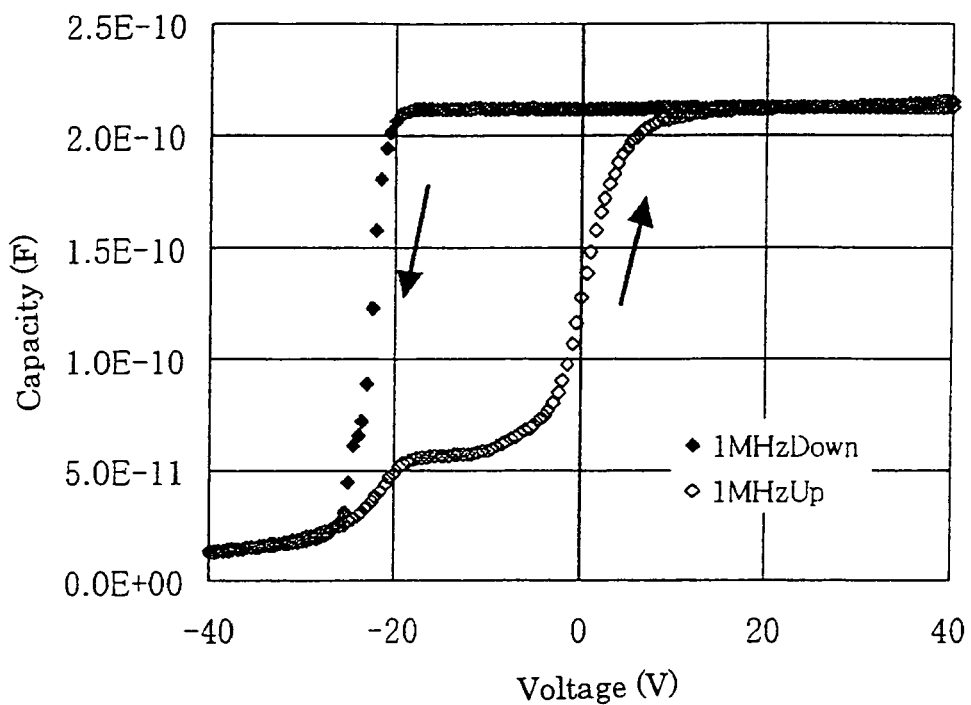
F I G. 3b
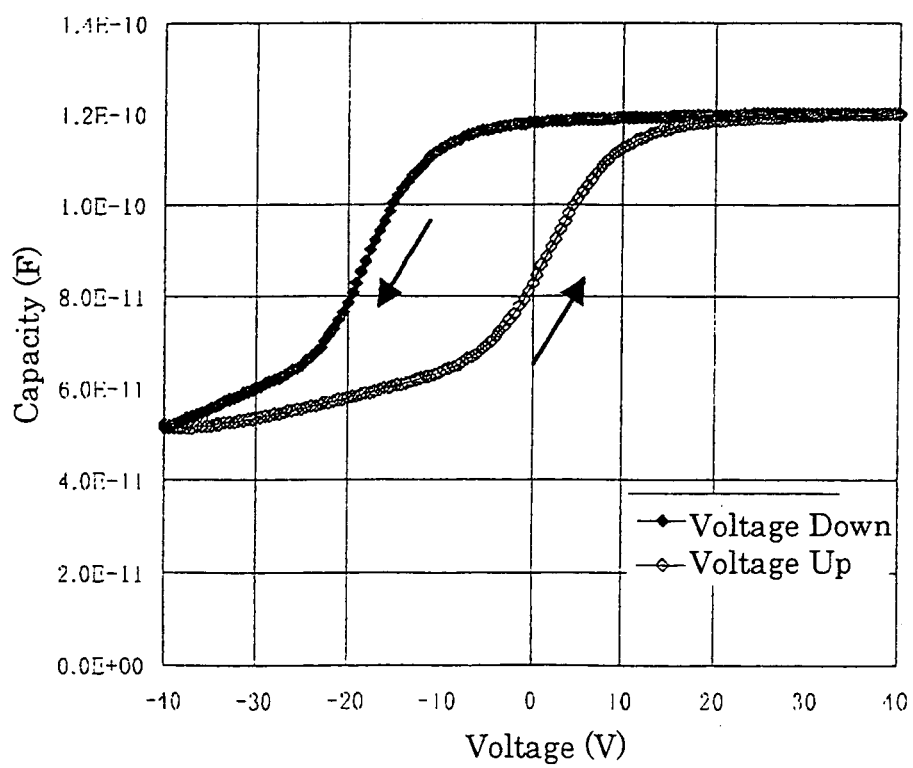

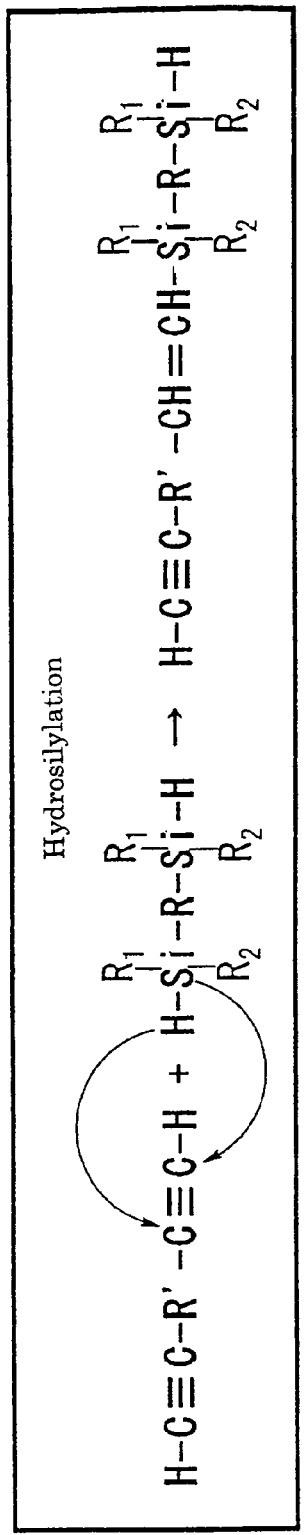
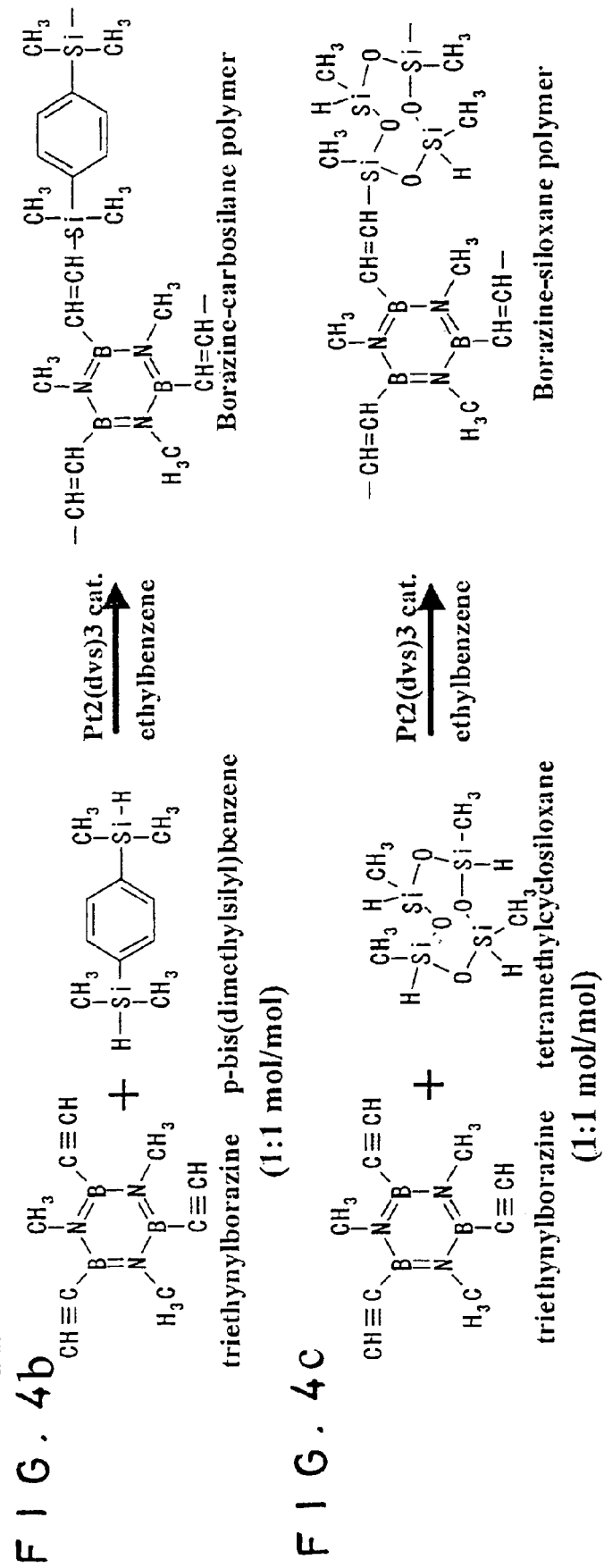
FIG. 4a
FIG. 4b
FIG. 4c

Attachment of metal mask to sample

Removal of mask after evaporation of aluminum

Groove width 350 nm

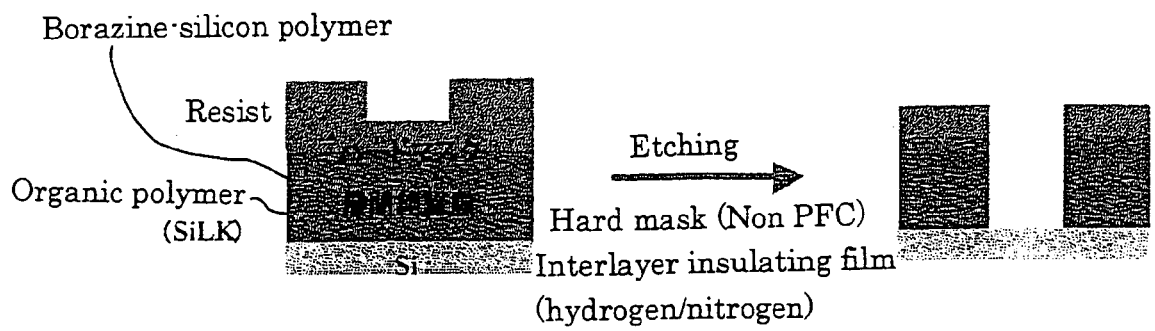
FIG. 12a
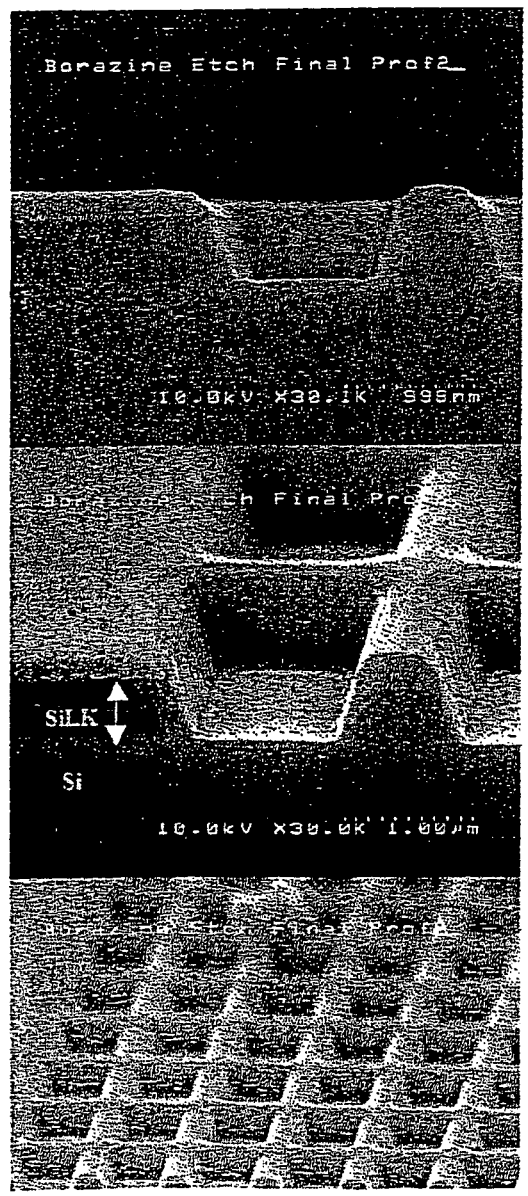
FIG. 12b
FIG. 12c
FIG. 12d

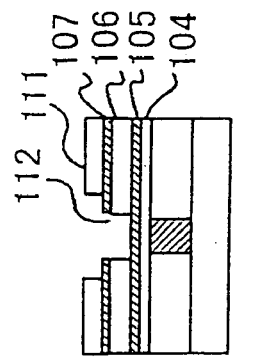
FIG. 13a
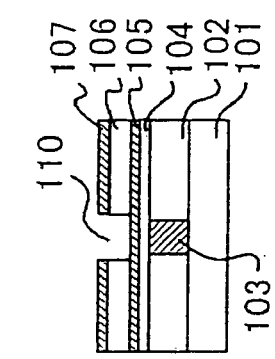
FIG. 13e
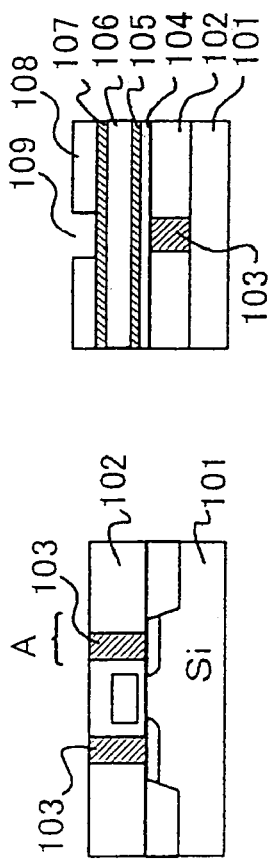
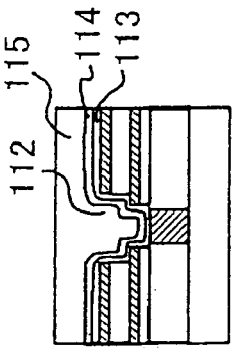
FIG. 13d
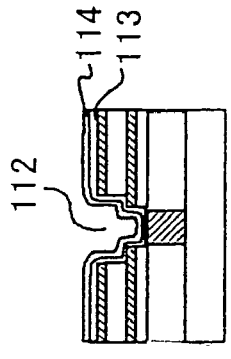
FIG. 13h
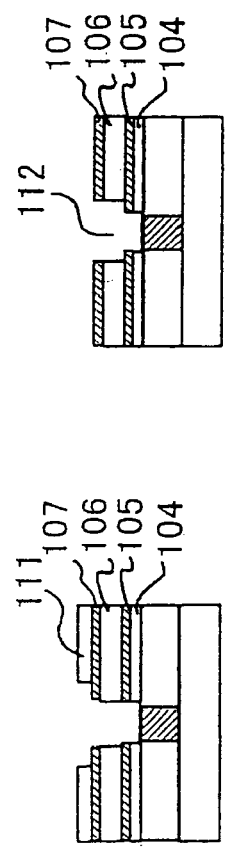

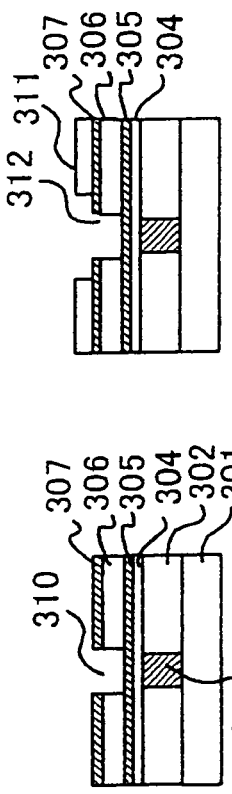
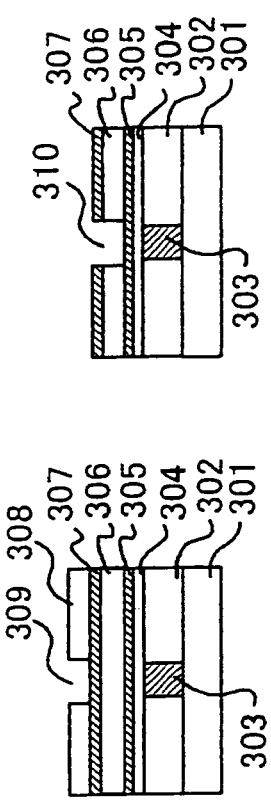
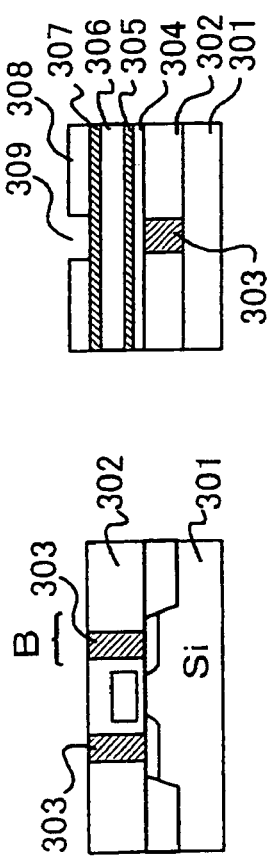
FIG. 16a  FIG. 16b  FIG. 16c  FIG. 16d
FIG. 16e  FIG. 16f  FIG. 16g  FIG. 16h

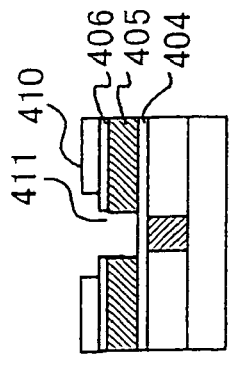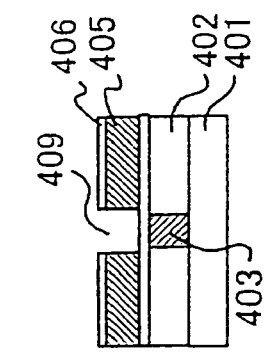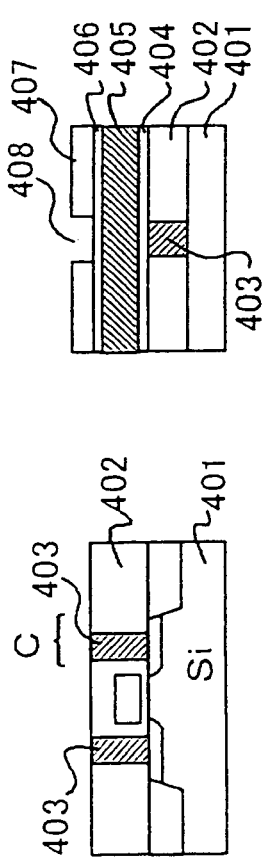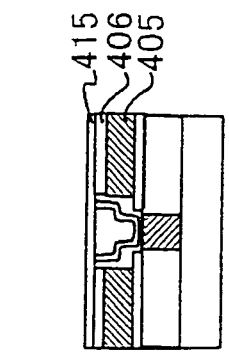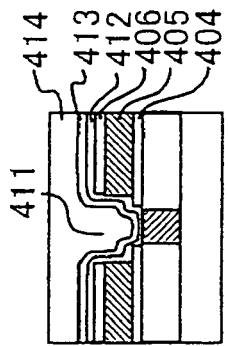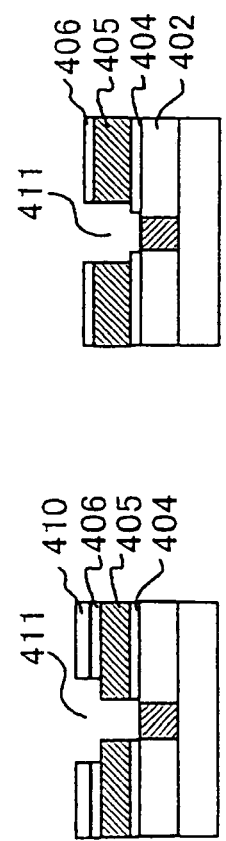

| | Structure | Cu atoms/cm3 |
|---|---|---|
| 1 | Si / Cu(500nm) / OP(660nm) | $5 \times 10^{18}$ |
| 2 | Si / Cu(500nm) / BSP(120nm) / OP(660nm) | $8 \times 10^{17}$ |
| 3 | Si / OP(660nm) / Cu(300nm) | $6 \times 10^{17}$ |
| 4 | Si / OP(660nm) / BSP(180nm) / Cu(300nm) | $1 \times 10^{17}$ |

Annealing
400°C
6hrs

Annealing
400°C
6hrs

Annealing
400°C · 6hrs

LOW DIELECTRIC CONSTANT INSULATING MATERIAL AND SEMICONDUCTOR DEVICE USING THE MATERIAL

BACKGROUND OF THE INVENTION

1. Field of the Invention

This invention relates to a low dielectric constant insulating material to be used as an interlayer insulating film for multilayer interconnection in an integrated circuit and a semiconductor device using the material.

2. Description of the Prior Art

The demand for further integration of ultra large-scale integrated (ULSI) circuits has been continuing to mount. This high integration requires the electric wires to be disposed densely by narrowing the intervals between the adjacent electric wires and also requires the electric wires to thin and fit multilayer disposition. It is known that this high integration results in adding to the distance of wiring. The high integration, therefore, results in augmenting the distribution resistance and the parasitic capacity and induces a delay of signal that lowers the processing speed of ULSI. Thus, the solution of these defects constitutes an important task.

For the sake of suppressing the increase of such signal delay in the wirings, the introduction of a low resistance wiring material and a low dielectric constant interlayer insulating material is indispensable from the viewpoint of material and processing technique. The feasibility of the Cu wirings having lower resistance than the conventional aluminum (Al) wirings and various interlayer insulating films using a low dielectric constant material has been being studied. They partly have been already reduced to practical use.

In the case of microprocessor units (MPU), the roadmap for wiring technique which is inserted in Non-Patent Document 1 (ITRS2002: International Technology Roadmap for Semiconductors 2002 Edition, 2002 Semiconductor Industry Association) has a description to the effect that the effective dielectric constant which indicates the relative dielectric constant of the whole wiring layers in a design room of 65 nm is required to fall in the range of 2.3 to 2.7. This indicates that even an interlayer insulating as a simple unit requires a material of low relative dielectric constant.

For an interlayer insulating film, silicon dioxide ($SiO_2$) that can be stacked at a temperature in the range of 200 to 350° C. and formed by plasma CVD has been used hitherto. It has as high a relative dielectric constant as about 4. A fluorine atom (F), when introduced into $SiO_2$, lowers the dielectric constant of $SiO_2$. Thus, the $SiO_2$ that has introduced a fluorine atom has been introduced for practical use. The dielectric constant of $SiO_2$ decreases, depending on the amount of fluorine atom introduced therein. The hygroscopicity of the insulating film increases when the fluorine content exceeds 20%. Since the $SiO_2$, therefore, is not allowed to contain fluorine atom in an amount exceeding 20%, the dielectric constant is lowered only to the degree of 3.

Further, it has been known that the dielectric constant of $SiO_2$ is lowered when the density thereof is lowered. The study on the $SiO_2$ of lowered density (porous silica, porous $SiO_2$) is being pursued energetically. For the porous $SiO_2$, the practice of decreasing the density of $SiO_2$ by introducing voids therein has been in vogue. Thus, the porous $SiO_2$ has a conspicuously low mechanical strength as compared with the bulk $SiO_2$ and is fragile. When the formation of electric wires of Cu is tried by the so-called damascene process at the next step, these electric wires do not withstand the process of chemical mechanical polish (CMP) which is performed with the object of removing the excess of the Cu coat formed uniformly by the electrolytic plating, with the result that they peel or sustain a crack. Thus, the process incurs the solution of such defects as a problem.

The decrease of the dielectric constant of $SiO_2$ may be sought by introducing an organic group containing a carbon atom therein. When a methyl group ($CH_3$—) is introduced, for example, the dielectric constant is decreased, depending on the content of the methyl group. One version of this method that uses as a raw material an organic silane having a high vapor pressure and molds a film of this organic silane by plasma CVD and a low dielectric constant insulating film consequently obtained have already been proposed for practical use. The feasibility of another version of the method which forms an organic group-containing $SiO_2$ by using a liquid raw material containing an organic group, depositing this raw material on the surface of a substrate by the coating technique, and subjecting the resultant coated substrate to a heat treatment is now being studied. When the produced film manifests improved reliability, this version may be possibly put to practical use. Further, the method for molding an organic polymer material on the substrate by the coating technique now forms a subject of an active project of research and development directed at a low dielectric constant interlayer insulating material.

The low dielectric constant interlayer insulating film, as described in detail above, encloses numerous voids, contains an organic group and consists of an organic film. When the dry etching step is tried to mold this film in an expected wire pattern, this operation requires an insulating layer called "a hard mask."

Concerning the term "hard mask," when the object of patterning a film is realized by using a material manifesting a large selective ratio during dry etching to the film expected to have the pattern transferred thereto, causing a shaped pattern transferred to a resist to be tentatively transferred to a film called a "hard mask" and using the pattern so transferred to the hard mark as a mask, the material which is formed on the top surface of the target film is referred to as a "hard mask." $SiO_2$, $Si_3N_4$, SiC, SiON, etc. have hitherto been used for it. These materials have high relative dielectric constants in the range of 4.5 to 7 and have the problem of exalting the effective relative dielectric constants of respective insulating films for multilayer interconnection.

The hard mask is necessary for several reasons. The first reason is that owing to the necessity for transferring increasingly fine patterns in the future, the thickness of the film of resist will generally tend to decrease in accordance as the exposure wavelength decreases and consequently the focal depth decreases as well. This reason does not originate in the use of a low dielectric constant interlayer insulating film. It resides in the fact that since the thickness of the film of resist decreases in reality, the resist vanishes in the midst of dry etching and the necessary transfer of a pattern is not realized.

As the second reason, the fact that the low dielectric constant material, while being dry-etched, does not acquire a selection ratio relative to the resist and therefore necessitates a hard mask is cited. The porous $SiO_2$ incorporates therein voids (porosity) for the purpose of lowering density as described above. Thus, the porous $SiO_2$ is generally brittle and vulnerable to ion impact and, therefore, encounters difficulty in forming trenches and holes in expected shapes. An organic group-containing $SiO_2$ does not withstand a dry etching process using ordinary perfluorocarbon (PFC) as an etching gas when the resist used in the form of film vanishes because it contain an organic group. For this reason, the organic group-containing $SiO_2$ also requires a hard mask and an etching stopper. The organic polymer low dielectric constant materials require a hard mask because they possess compositions resembling relevant resists and fail to manifest selection ratios during dry etching to the resists.

As low resistance materials, copper (Cu) wirings have been being developed for practical use. The Cu atoms are liable to diffuse and drift in the insulating film of $SiO_2$, for example. Further, Cu is easily oxidized. When Cu is used as a wiring material for the LSI, therefore, the wiring material necessitates a layer for inhibiting diffusion of Cu (barrier layer) and requires devising a process for precluding oxidation. For the Cu barrier layer, silicon carbide (SiC), silicon nitride ($Si_3N_4$), silicon oxidonitride (SiON), etc. have hitherto been used. These materials, however, have high relative dielectric constants and add to the effective dielectric constant of an interlayer insulating film for multilayer interconnection.

As the exposure wavelength has decreased as described above, the focal depth has decreased and the flatness of the surface of a substrate for transfer had gained in importance. The metallic Cu allows no easy dry etching and, therefore, the feasibility of fine interconnection with the metallic Cu has been hitherto regarded as difficult.

As a process for interconnection that solves these two problems, a method called a "damascene process" has been being developed for practical use. The damascene process first forms an interlayer insulating film and then forms trenches or holes in regions for distributing electric wires by using the ordinary technique of exposure to light and the dry etching technique as well. When the interlayer connecting holes and the wirings are formed by the application of the damascene process in an interlayer insulating film, since the wirings are disposed on the interlayer connecting holes, the wiring parts in the uppermost part of the interlayer insulating film are removed by etching and the parts of the interlayer connecting holes in the lowermost part thereof are removed. Then, a Cu barrier metal and a thin Cu layer (seed Cu film) are formed by the sputtering technique on the entire surface of a substrate. A Cu film is deposited by the electrolytic plating using the Cu layer as an electrode to bury the trenches and the holes. Thereafter, the chemical mechanical polish (CMP) process is used to remove the Cu extrusions from the trenches and the holes, and a flat surface is formed simultaneously.

The damascene process is broadly divided into two methods of production. One of these methods is called a "single damascene process" which makes the individual interconnecting layers and the interlayer connecting holes for vertically connecting the interconnecting layers by different procedures. Since the single damascene process continues to make the interconnecting layers and the interlayer connecting holes separately, it has a strong point of infallibly making them and a weak point of adding to the length of process and tending to add to the cost. The other method makes the interlayer connecting holes and the upper interconnecting layer simultaneously on the lower interconnecting layer. It is called a "dual damascene process." As compared with the single damascene process, the dual damascene process has a strong point of simplifying a process and suppressing the rise of cost and a weak point of exalting the difficulty of the dry etching technique because of the necessity for opening the holes (VIA holes) for the interlayer connecting holes while retaining the shapes of the trenches for the wirings. This method further suffers the technical difficulty of process to mount because of the necessity for depositing barrier films for Cu diffusion and seed Cu films without sacrificing reliability on the trenches and the via holes which are destined to have higher aspect ratios.

The damascene process necessitates mechanically, chemically stable electroconductive films, such as insulating films and Cu films, because it has the CMP method as an indispensable step.

As for the interlayer insulating film, Patent Document 1 (Japanese Patent No. 2968244) discloses a method which comprises adding the solution of $(HSi(OH)_xO_{3-x/2})_n$ and at least one material selected from the group consisting of phosphagens, fluorophosphagens, borazines and mixtures thereof together and applying the resultant mixture to a substrate, thereby forming a layer.

Though the insulating film obtained by this method excels in the flatness of the buried trenches, the publication of the patent discloses nothing about the dielectric constant. It has no mention whatever about borazine compounds. The materials contemplated thereby differ from those of the present invention.

Then, Patent Document 2 (JP-A 2002-317049) discloses a boron-containing polymer composition which is characterized by containing a borazine compound and a polymer obtained from a compound represented by the general formula $R^1{}_mSi(OR^2)_n$ (wherein $R^1$ denotes a hydrogen atom, an alkyl group, a vinyl group or an alkyl group possessing a functional group, n denotes an integer of than 3 or more, m denotes an integer of than 0 or more, and m+n=4), and/or a hydrolytic condensate.

It, however, discloses nothing whatever about tripropinyl compounds which constitute one of the characteristics of the present invention and which will be described specifically herein below. The Si-containing material contemplated by the publication of this patent also differs from that of the present invention.

The material which contains a six-member borazine ring comprising boron and nitrogen elements has been known to excel in electrical properties, such as a low relative dielectric constant and a low leak current, mechanical properties, such as modulus of elasticity and hardness, and thermal properties, such as resistance to heat and thermal conductivity and to be suitable for interlayer insulating materials.

As the material containing a borazine ring, borazine-silicon polymers that are organic and inorganic hybrid polymer materials are available. These polymers are obtained by the polymerization of hydrosilylation of a borazine compound having a triple bond-containing substituent bound to the boron atom of a borazine ring and a hydroxyl group-containing silane compound or siloxane compound.

To be specific, by the reaction of a trifunctional borazine compound having a triple-bond ethynyl group bound to the boron atom of borazine with a hydrosilane or a siloxane possessing two or more hydrogen atoms bound to a silicone atom (SiH), polycarbosilane or polysiloxane having a borazine ring and the moiety of silicon compound containing a silane bond or a siloxane bond alternately arranged through an organic molecular chain can be obtained.

Patent Document 3 (Japanese Patent No. 3041424), for example, describes in detail a carbosilane borazine polymer and a method for the production thereof.

Patent Document 4 (JP-A 2002-359240) describes an interlayer insulating film formed of a low dielectric constant borazine-silicon polymer and a semiconductor device formed of the film.

A polymer solution is obtained, for example, by performing the hydrosilylating polymerization using B,B,B-triethynyl-N,N,N-trimethyl borazine and 1,3,5,7-tetramethylcyclotetrasiloxane which is a cyclic siloxane in the presence of a platinum catalyst, $Pt_2(dvs)_3$ (wherein dvs denotes 1,3-divinyl (1,1,3,3-tetramethyl-1,3-disiloxane). The Patent Document has a disclosure to the effect that a polymer film of a network configuration is obtained by applying this polymer of a linear configuration to a wafer by spin coating and heat-treating the resultant coated wafer in the atmosphere of nitrogen ($N_2$) or argon (Ar) at a temperature in the range of 200 to 400° C.

The polymer thus obtained has been found to possess excellent electrical properties, mechanical properties and thermal properties as evinced by a relative dielectric constant of 2.76, a modulus of elasticity of 14.6 GPa, a hardness of 10 GPa and a temperature for 5% weight loss by heating of 564° C., for example.

Patent Document 5 (JP-A 2003-119289) discloses a method for producing a low dielectric constant material by heat-treating a material having a borazine skeleton configuration contained in the molecule of an inorganic or organic material, a low dielectric constant material and a semiconductor device incorporating the material therein.

Materials containing a borazine skeleton configuration, however, have been disclosed in detail in Patent Document 1, Patent Document 3, etc. From the specification of Patent Document 5, it is clear that the invention disclosed therein is aimed mainly at producing a polymer by forming N—B (N and B denote respectively a nitrogen atom and a boron atom constituting separate borazine skeleton configurations), B—C (B and C denote respectively a boron atom and a carbon atom constituting a borazine skeleton configuration and a benzene ring) and B—NX—B (two B's denote boron atoms constituting separate borazine skeleton configurations, N denotes a nitrogen atom binding these two borazine skeleton configurations and X denotes a hydrogen atom or an alkyl group) and linking the borazine skeleton configurations. Thus, it is plain that the disclosure of Patent Document 5 differs in gist from the disclosure of the present invention.

In Patent Document 5, however, O—B (wherein B denotes a boron atom constituting a borazine skeleton configuration and O denotes an oxygen atom joining two borazine skeleton configurations) (refer to FIG. 40 of Patent Document 5), S—B (wherein B denotes a boron atom constituting a borazine skeleton configuration and S denotes a sulfur atom joining two borazine skeleton configurations) (refer to FIG. 41 thereof), N—$SiH_2$ (wherein N denotes a nitrogen atom constituting a borazine skeleton configuration and $SiH_2$ denotes a chemical species joining two borazine skeleton configurations) (refer to FIG. 42 thereof), N—$Si(OCH_3)_2$ (wherein N denotes a nitrogen atom constituting a borazine skeleton configuration and $Si(OCH_3)_2$ denotes a chemical species joining two borazine skeleton configurations) (refer to FIG. 43 thereof) and B—PH (wherein B denotes a boron atom constituting a borazine skeleton configuration and PH denotes a chemical species joining two borazine skeleton configurations) (refer to FIG. 44 thereof) appear to be chemical species other than B and N.

The atoms or chemical species other than B and N that join these borazine skeleton configurations, however, have been originally bound to the borazine skeleton configurations. Thus, they are materials of the type different totally from the materials contemplated by the present invention.

The attempt carried out hitherto to use a low dielectric constant interlayer insulating film or Cu wiring in the ULSI multilayer interconnection has brought such problems as necessitating use of a hard mask, a barrier layer against Cu diffusion or an additional film called an etching stopper, i.e. a material possessing a high relative dielectric constant and suffering the effective relative dielectric constant of the interconnection to increase in spite of the use of a low dielectric constant interlayer insulating film having a low relative dielectric constant.

This invention is directed toward solving the problems attendant on the use of such a conventional low dielectric constant interlayer insulating film or Cu wiring in the ULSI multilayer interconnection and is aimed at preventing the exaltation of the degree of integration from adding to the effective relative dielectric constant of the multilayer interconnection by the use of a low dielectric constant interlayer insulating film.

SUMMARY OF THE INVENTION

This invention, with a view to accomplishing the above object, comprises using an insulating material possessing a borazine ring of a six-member ring configuration comprising at least boron and nitrogen elements as the material for a hard mask, a barrier layer against Cu diffusion and an etching stopper which are necessary in the use of a low dielectric constant interlayer insulating film or Cu wiring in the LSI multilayer interconnection.

More specifically, this invention concerns an interlayer insulating material that has a first characteristic that the material comprises a borazine-silicon polymer used for an insulating layer in electric wiring and obtained by hydrosilylating polymerization of (1) a borazine compound represented by Chemical Formula 8 possessing an alkyl group for a nitrogen atom and an alkyl group-substituted triple bond-containing organic group for a boron atom in a borazine ring, in which the boron atom has an acetylene group directly linked thereto or $R_2$ and an acetylene group jointly linked thereto and (2) a silicon compound represented by Chemical Formula 9 possessing at least two hydrosilyl groups or a cyclic silicon compound represented by Chemical Formula 10 possessing at least two hydrosilyl groups, in which Chemical Formula 8 to Chemical Formula 10 $R_1$ denotes an alkyl group, $R_2$ denotes —$(CH_2)$-m (m denoting an integer of 0 or more), $R_3$ denotes an alkyl group linked to an acetylene group, $R_4$ and $R_5$ each denote one identical or different monovalent group selected from ones consisting of an alkyl group, an aryl group, an aralkyl group and a hydrogen atom, $R_6$ denotes a divalent aromatic group optionally possessing a substituent group, an oxygen atom or a siloxane, such as of an oxypoly (dimethyl siloxy) group, and $R_7$ denotes an alkyl group, an aryl group or an aralkyl group.

[Chemical Formula 8]

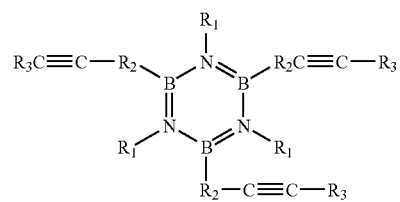

[Chemical Formula 9]

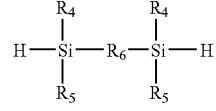

[Chemical Formula 10]

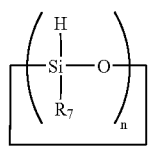

This invention also concerns another interlayer insulating material and has a second characteristic that the material comprises a borazine-silicon polymer used for an insulating layer in electric wiring and obtained by hydrosilylating polymerization of (1) a mixture of a borazine compound represented by Chemical Formula 11 possessing an alkyl group for a nitrogen atom and an alkyl group-substituted triple bond-containing organic group for a boron atom in a borazine ring, in which the boron atom has an acetylene group directly linked thereto or $R_2$ and an acetylene group jointly linked thereto and a borazine compound represented by Chemical Formula 12 possessing an alkyl group for a nitrogen atom and a triple bond-containing organic group not substituted by an alkyl group for a boron atom in a borazine ring, wherein the boron atom has an acetylene group directly linked thereto or $R_2$ and an acetylene group jointly linked thereto and (2) a silicon compound represented by Chemical Formula 13 possessing at least two hydrosilyl groups or a cyclic silicon compound represented by Chemical Formula 14 possessing at least two hydrosilyl groups, in which Chemical Formula 11 to Chemical Formula 14 $R_1$ denotes an alkyl group, $R_2$ denotes —$(CH_2)$-m (m denoting an integer of 0 or more), $R_3$ denotes an alkyl group linked to an acetylene group, $R_4$ and $R_5$ each denote one identical or different univalent group selected from ones consisting of an alkyl group, an aryl group, an aralkyl group and a hydrogen atom, $R_5$ denotes a divalent aromatic group optionally possessing a substituent group, an oxygen atom or a siloxane, such as of an oxypoly(dimethyl siloxy) group, $R_7$ denotes an alkyl group, an aryl group or an aralkyl group, $R_8$ denotes an alkyl group, $R_9$ denotes a methylene group, and n denotes an integer of 3 or more.

[Chemical Formula 11]

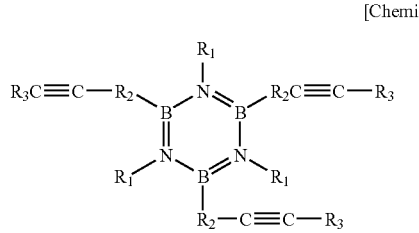

[Chemical Formula 12]

$$H-C\equiv C-R_9 \underset{R_8}{\overset{R_8}{\underset{B}{\bigg|}}} \underset{B}{\overset{N}{\underset{\|}{\bigg|}}} \underset{B}{\overset{N}{\underset{R_8}{\bigg|}}} R_9-C\equiv C-H$$
$$R_9-C\equiv C-H$$

[Chemical Formula 13]

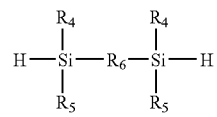

[Chemical Formula 14]

$$\left[\begin{pmatrix} H \\ | \\ Si-O \\ | \\ R_7 \end{pmatrix}\right]_n$$

This invention further concerns a semiconductor device using an interlayer insulating material that enjoys the first or second characteristic and has a third characteristic that the device has a wiring structure provided with a first wiring layer formed on a surface of a semiconductor region forming an active component or a passive component aimed at and a second wiring layer formed in an upper layer of the first wiring layer and also provided with a first insulating structure insulating the semiconductor region and the first wiring layer, a second insulating structure insulating a distribution interlayer formed of the first wiring layer, a third insulating structure contained in a structure electrically insulating the first wiring layer and the second wiring layer and forming connecting holes electrically connecting the first wiring layer and the second wiring layer, and a fourth insulating structure insulating a distribution interlayer formed of the second wiring layer, and further provided with a fifth insulating layer formed of the interlayer insulating material in (1) a region interposed between the first insulating structure and the fourth insulating structure relative to a direction of film thickness and excluding the connecting holes electrically connecting the first and second wiring layers relative to a plane, (2) a region interposed between the first insulating structure and the fourth insulating structure relative to the direction of film thickness and excluding the wiring by the first wiring layer relative to the plane, (3) a region disposed in a region higher than the first insulating structure relative to the direction of film thickness and excluding the connecting holes for electrically connecting the second and third wiring layers relative to the plane, or (4) a region higher than the first insulating structure relative to the direction of film thickness and excluding the wiring by the third wiring layer relative to the plane.

Further, this invention concerns another semiconductor device using an interlayer insulating material that enjoys the first or second characteristic and has a fourth characteristic that the device has a wiring structure provided with a first wiring layer formed on a surface of a semiconductor region forming an active component or a passive component aimed at and a second wiring layer formed in an upper layer of the first wiring layer, also provided with a first insulating structure insulating the semiconductor region and the first wiring layer, a second insulating structure insulating an interlayer formed of the first wiring layer, a third insulating structure contained in a structure electrically insulating the first wiring layer and the second wiring layer and forming connecting holes electrically connecting the first wiring layer and the second wiring layer, and a fourth insulating structure insulating an interlayer formed with the second wiring layer, and further incorporating the interlayer insulating material in one of the second, third and fourth insulating structures.

When the insulating material is used as a low dielectric interlayer insulating film for the wiring in the ULSI, the increase of the parasitic capacity between wiring layers due to the growth of the degree of integration can be suppressed and the decrease of the throughput speed can be prevented.

BRIEF EXPLANATION OF THE DRAWING

FIG. 1(a) is a structural formula of B,B,B-tripropynyl-N,N,N-trimethyl borazine and (b) is a diagram illustrating the C-V characteristic (1 MHz) of a borazine-siloxane polymer thin film.

FIG. 3(a) is a diagram illustrating the change of voltage of the capacity of a borazine film having a small chlorine content and (b) is a diagram illustrating the CV characteristic of a borazine film having undergone an argon plasma treatment.

FIG. 4(a) is a diagram illustrating a hydrosilylation reaction represented by the addition of a Si—H bond to a carbon-carbon triple bond, (b) is a diagram illustrating a borazine derivative and a carbosilane compound used for the synthesis of a borazine-carbosilane polymer and (c) is a diagram illustrating a borazine derivative and a silicon compound used for the synthesis of a borazine-siloxane polymer.

FIG. 12(a) is a diagram showing application of a borazine-silicon polymer to a hard mask and (b), (c) and (d) are pictures of examples of application of hard mask taken with a scanning electron micrograph (SEM).

DESCRIPTION OF THE PREFERRED EMBODIMENTS

Figure 2A:
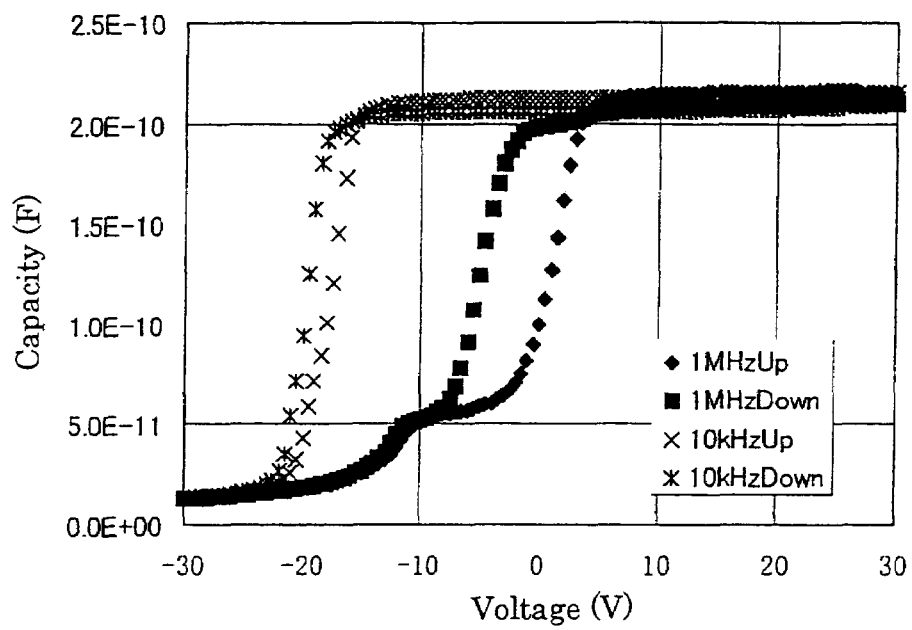
FIG. 2(a) is a diagram illustrating the voltage dependency at room temperature of the change of capacity using borazine and (b) is a diagram illustrating the change of voltage of the capacity of a borazine film having a small chlorine content.

Now, the embodiments of this invention will be described below with reference to the drawings annexed hereto. The following descriptions will be made with respect to simple embodiments with a view to facilitating comprehension. It is only plain that this invention ought not be limited to the following embodiments.

Embodiment 1

An embodiment embracing the first characteristic of this invention will be shown below. This embodiment represents a case in which a polymer similar to ethynylborazine was obtained by subjecting B,B',B"-tripropynyl-N,N',N"-trimethyl borazine (FIG. 1(a)) having a propynyl group linked to the boron atom of borazine to hydrosilylating polymerization with 1,3,5,7-tetramethyl cyclo-tetrasiloxane in a solvent of ethyl benzene in the presence of a platinum catalyst. The polymer solution thus obtained had a long life and could be uniformly applied to a surface with a spin coater. The thin film of polymer obtained by transforming the polymer solution to a network structure by a heat treatment was found to possess a low relative dielectric constant.

In a solvent of ethyl benzene under a nitrogen atmosphere, 1 mol of B,B',B"-tripropynyl-N,N',N"-trimethyl borazine having a propynyl group formed of a triple bond linked to the boron atom of borazine as a borazine derivative and 1.1 mols of the cyclic siloxane of 1,3,5,7-tetramethyl cyclotetrasiloxane as a silicon compound were subjected to hydrosilylating polymerization in the presence of a platinum catalyst at 40° C. The reaction was terminated after the unaltered reaction solution was confirmed by gas chromatography to contain absolutely no residual borazine derivative. Incidentally, this reaction solution was found, even after three months or more of storage in a refrigerator, to be in a stable state showing no sign of any change in viscosity.

This reaction solution was passed through a filter containing pores of a diameter of 0.2 μm and applied onto a Si wafer with a spin coater to form a uniform applied film. The coated wafer was heated in a heating furnace filled with an atmosphere of argon (Ar) gas at 250° C. for 30 minutes and further at 400° C. for 30 minutes to promote the transformation of the thin film to a network.

When the thin film thus obtained was tested for electric properties, thermal properties and mechanical properties, it was found to have a relative dielectric constant of 2.4, a modulus of elasticity of 6.9, a hardness of 0.46 and a temperature of 496° C. at a weight loss of 5% by heating.

This embodiment will be described below in further detail. Table 1 shows one example of the polymerization conditions for the synthesis of a polymer. The tripropynyl borazine was found to have a lower reactivity than triethynyl borazine that will be explained in detail in Embodiment 5. The reaction solution was required to suppress the survival of the unaltered monomer to the fullest possible extent. If the borazine monomer persisted, it would undergo crystallization simultaneously with the vaporization of the solvent during the application with a spin coater and the produced crystals would remain as an extraneous matter and wound render uniform application difficult.

FIG. 1(b) shows the capacity-voltage (CV) characteristic of the produced thin film. The thin film was heated in an argon (Ar) gas at 200° C. for one hour and further at 300° C. for 30 minutes. Thereafter, aluminum (Al) was deposited thereon by evaporation to form a gate electrode. The relative dielectric constant calculated from the CV characteristic was found to be 2.40 at a testing frequency of 1 MHz, a magnitude fairly small as compared with the ethynyl borazine that will be explained in Embodiment 2. This small magnitude may be explained by a supposition that the introduction of an organic group (methyl group) was effective in decreasing the relative dielectric constant.

Table 2 shows the modulus of elasticity and the hardness of the thin film determined by the nano-indentation technique. The results indicate more than halving those obtained of ethynyl borazine. In spite of a decrease achieved in the relative dielectric constant, a decline was recognized in the mechanical property. This decrease of the mechanical property may be explained by a supposition that the introduction of propynyl resulted in lowering the reactivity.

TABLE 1

Table 1: Conditions of synthesis for borazine-siloxane polymer

| No. | Borazine (mmol) | Siloxane (mmol) | Catalyst (µl) | Solvent (ml) | Temp. (° C.) | Time (hr) | *Film thickness (nm) |
|---|---|---|---|---|---|---|---|
| 1 | 1 (non-sublimation) | 1 | 10 | 10 | Room temp | 24 | |
| 2 | 1 (Sublimation) | 1.1 | 10 | 9 | Room temp. | 24 | 146 |
| 3 | 1 (Sublimation) | 1.1 | 10 | 10 | 40 | 42 | |
| 4 | 1 (Recrystallization) | 1.1 | 2 | 9 | 40 | 42 | 186 |
| 5 | 1 (Recrystallization) | 1.1 | 2 | 9 | 40 | 42 | 237 |
| 6 | 1 (Recrystallization) | 1.1 | 2 | 9 | 40 | 48 | 178 |
| 7 | 1 (Recrystallization) | 1.1 | 3 | 9 | 40 | 48 | 180 |
| 8 | 1 (Recrystallization) | 1.1 | 3 | 7 | 40 | 48 | 488 |
| 9 | 1 (Recrystallization) | 1.1 | 10 | 9 | 40 | 48 | 229 |

The film thickness was measured with an ellipsometer using a thin film obtained by annealing at 200° C. for one hour and at 300° C. for 30 minutes.

The polymerization temperature was set in the range of 20 to 40° C. and the reaction time in the range of 24 to 48 hours so as to enable the reaction to proceed sufficiently. The increase of the speed of the polymerization reaction would require an addition to the amount of the catalyst. The amount of the catalyst when large, would induce the reaction solution to gel during the course of polymerization and, when small, would add to the unaltered monomer. Since the reactivity depended largely on the lot of the polymerization catalyst to be used, the amount of the catalyst fit for a given lot was calculated and incorporated.

The charging ratio of borazine and siloxane for the reaction is generally 1:1. Since the 1,3,5,7-tetramethyl cyclotetrasiloxane used in the present embodiment had the possibility of vaporizing during a protracted reaction, the proportion of this siloxane was increased by 10%.

The decrease of the reactivity in the use of a borazine incorporating a propynyl group may be explained by supposing that the reaction of hydrosilylation was suppressed by the incorporation of a methyl group in the triple bond. It has been found that the polymer enjoys an elongated life and permits preservation in a stable condition over one half year in a refrigerator because the decrease of the reactivity results in suppressing the reaction for transformation into a network even after completion of the reaction.

TABLE 2

Table 2: Mechanical property of thin film

| Conditions for heat treatment | Modulus of elasticity (GPa) | Hardness (GPa) |
|---|---|---|
| 200° C. for one hour + 300° C. for 30 minutes | 6.0 | 0.28 |
| 200° C. for one hour + 300° C. for 30 minutes + 400° C. for 30 minutes | 6.9 | 0.46 |

It is generally considered that the mechanical property of the thin film of polymer of a network structure depends on the density of the network and that it is improved in accordance as the transformation to the network advances. This inference is evinced by the fact that the annealing performed at a high temperature promotes the transformation to the network and results in improving the mechanical property. The degradation of the mechanical property mentioned above is ascribable to the fact that the introduction of the propynyl group resulted in suppressing the reaction for the formation of a network and imparting a small network density to the produced polymer.

The use of propynyl borazine resulted in bringing the following improvement. Since a triethynyl borazine compound has a poor yield and cannot be refined by recrystallization, it has been customary to effect the refinement of this compound by sublimation. Thus, the compound cannot be deprived of impurities sufficiently during the course of synthesis and manifests no perfect reproducibility with respect to the electric property. In contrast, the tripropynyl borazine manifests a high yield in synthesis and permits refinement by recrystallization and, therefore, can supply materials of high purity.

The borazine film obtained merely by applying a relevant synthetic material by spin coating and then annealing the applied layer, describes such a CV curve as shown in FIG. 2(a). The shape of the CV curve and the amount of the flat band voltage shift ($\Delta V_{FB}$) are varied by the measuring frequency. At 10 kHz, the amount of shift is large in the direction of negative voltage. At 1 MHz, a step is produced in the neighborhood of −10 V during the rise of the voltage and the hysteresis is large between the rise and the fall of voltage. When the film thickness is in the range of 124 to 128 nm, since the $C_{max}$ was nearly fixed at 160 pF, the dielectric constant of borazine in the range of 2.14 to 2.21 was obtained. Depending on the lots of synthesis of borazine, the dielectric constants found at the measuring frequencies of 10 KHz and 1 MHz overlapped without any deviation.

Figure 2B:
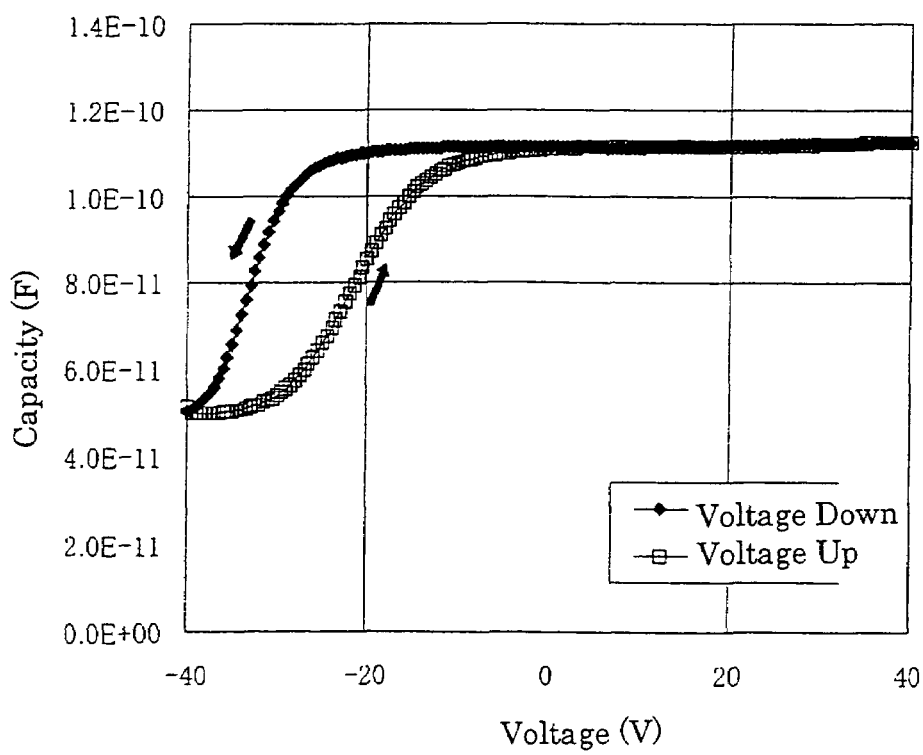

The CV curves obtained when the chlorine contents were small during the course of synthesis assumed such shapes as shown in FIG. 2(b) and FIG. 3(a). It is seen that the step in the neighborhood of −20 V disappeared at 1 MHz, whereas it was obscure at 10 kHz because the shift in the direction of negative voltage was very large. In the method of synthesis adapted to decrease chlorine, the inclination was fairly moderated probably because of the influence of the interfacial level instead of the measuring frequency.

The annealed borazine film was examined by the fluorescent X-ray technique to detect the metal contained therein. The peak values of the K$\alpha$ lines and the M$\alpha$ lines of oxygen, nitrogen, platinum (Pt) and chlorine were read out and reduced to the equivalents, such as of standard reference materials. The results are shown collectively in Table 3. Though the results of the S/N ratio were bad because the film thickness was not sufficient, all the samples allowed detection of oxygen and the oxygen contents so detected indicated decreasing trends proportionately as the lengths of argon treatment increased.

TABLE 3

Table 3: Fluorescent X-ray spectra of contained metals

| Name of sample | | | Oxygen | Nitrogen | Platinum | Chlorine |
|---|---|---|---|---|---|---|
| Atmosphere | Bias (W) | Treatment (sec) | O-K$\alpha$ kcps | N-K$\alpha$ kcps | Pt-M$\alpha$ kcps | Cl-K$\alpha$ kcps |
| Blank | | | 0.020 | <0.01 | 0.0004 | −0.005 |
| No | | | 0.589 | <0.01 | 0.0026 | 0.006 |
| Ar | 500 | 20 | 0.408 | <0.01 | 0.0034 | 0.023 |
| | 500 | 40 | 0.397 | <0.01 | 0.0007 | 0.010 |
| | 500 | 60 | 0.190 | <0.01 | 0.0033 | 0.000 |
| | 200 | 60 | 0.584 | <0.01 | 0.0028 | *0.002 |
| O$_2$ | | 60 | 0.660 | <0.01 | 0.0037 | 0.012 |
| N$_2$ | | 60 | 0.519 | <0.01 | 0.0007 | 0.003 |

As regards platinum, what appeared to be a peak was recognized, though vaguely, on an ordinary borazine film and it appeared to be minimized depending on the conditions of the argon plasma treatment. The plasmas of oxygen and nitrogen, however, showed no discernible change.

As respects chlorine, the samples other than those obtained by argon plasma (bias=200 W) permitted detection of peaks and the peaks detected were not intense enough to permit quantitative determination. That is, the analysis conducted herein revealed no element indicating the relation between the conditions of treatment and the amount of chlorine.

Next, another example will be shown. As borazine derivatives, 0.6 mol of B,B',B"-tripropynyl-N,N',N"-trimethyl borazine having a propynyl group of triple bond linked to the boron atom of borazine and 0.4 mol of B,B',B"-triethynyl-N, N',N"-trimethyl borazine were used and they were subjected to hydrosilylating polymerization with 1.1 mols of the cyclic siloxane of 1,3,5,7-tetramethyl cyclotetrasiloxane as a silicon compound in a solvent of ethyl benzene under an atmosphere of nitrogen in the presence of a platinum catalyst at 40° C. The unaltered residual borazine derivative was assayed by gas chromatography and the reaction was terminated when the residual borazine derivative content was confirmed to be 0%. This reaction solution was found to retain a stable state revealing no change in viscosity even after three months or more of storage in a refrigerator.

This reaction solution was passed through a filter containing pores of a diameter of 0.2 μm and applied onto a Si wafer by the use of a spin coater. The coated wafer was heated in a heating furnace filled with an atmosphere of argon (Ar) gas at 250° C. for 30 minutes and further at 400° C. for 30 minutes to promote the transformation of the thin film into a network. When the thin film thus obtained was tested for an electrical property, a thermal property and a mechanical property, it was found to have a relative dielectric constant of 2.5, a modulus of elasticity of 10, a hardness of 0.75 and a temperature of 523° C. at a heating weight loss of 5%.

Still another example will be shown. The borazine-silicon polymer having B,B',B"-tripropynyl-N,N',N"-trimethyl borazine as a raw material is characterized by manifesting a low dielectric constant and possessing a long life as the polymer solution, and the borazine-silicon polymer having B,B', B"-triethynyl-N,N',N"-trimethyl boraine as a raw material is characterized by excelling in such mechanical properties as modulus of elasticity and hardness. By combining these two borazine raw materials, therefore, it is made possible to obtain a borazine-siloxane polymer manifesting a low dielectric constant, excelling in mechanical properties and enjoying a long life as the polymer solution. The proportion of these two borazine compounds, therefore, was studied with a view to formulating a polymer combining the characteristics thereof. The formula consequently developed produced a polymer manifesting a low relative dielectric constant, possessing an excellent mechanical property and enjoying a very long life in combination with fine properties.

Synthesis of polymers using various borazine derivatives was studied with a view to decreasing the relative dielectric constant and elongating the polymer life. It was consequently found that the linear polymer obtained by stopping midway the hydrosilylating reaction of B,B',B"-tripropynyl-N,N',N"-trimethyl borazine covered by Chemical Formula 8 mentioned above with various silicon compounds was so stable as to avoid inducing gelation even when it was left standing at room temperature for several months.

Then, the polymer obtained by the reaction of a cyclic siloxane with 1,3,5,7-tetramethyl cyclotetrasiloxane was found to have a relative dielectric consgtant of 2.4, a magnitude fairly lower than that of a polymer using a siloxane having an ethynyl group.

The borazine-siloxane polymer obtained by subjecting B,B,B-triethynyl-N,N,N-trimethyl borazine and 1,3,5,7-tetramethyl cyclotetrasiloxane, i.e. a cyclic siloxane, to hydrosilylating polymerization was found to possess fine electric property, mechanical property and heat resistance as evinced by a relative dielectric constant of 2.76, a modulus of elasticity of 14.6 GPa, a hardness of 1.0 GPa and a temperature of 564° C. at a heating weight loss of 5%. Since the ethynyl group of the borazine ring promotes the reaction of hydrosilylation as compared with the propynyl group, it is inferred to shorten the life of the polymer solution, add to the density of the network structure formed by annealing and consequently augment the mechanical strength.

The borazine-silicon polymer using B,B',B"-tripropynyl-N,N',N"-trimethyl borazine as a raw material is suitable as a material of low dielectric constant. Some applications expect for that to this material desire the polymer to have the mechanical property thereof exalted further. For the purpose of improving the relative dielectric constant and the mechanical property of the borazine-silicon polymer and securing the stability of the polymer solution as the precursor for the thin film, studies were made on the formulation of a polymer which combines the characteristic of the polymer having as a raw material thereof triethynyl borazine capable of producing a polymer thin film excelling in the mechanical property and the characteristic of the polymer having a long life of its prepolymer solution and having as a raw material thereof tripropynyl borazine capable of producing a polymer thin film of a low dielectric constant.

It was found that the characteristic of the borazine-silicon polymer was varied by the mixing ratio of triethynyl borazine and tripropynyl borazine when they were used as mixed during the course of polymerization. In consequence of the increase of the former component, the relative dielectric constant was increased and the lift of the prepolymer solution was shortened in spite of the improvement in the mechanical property and the heat resistance and in consequence of the increase of the latter component, the dielectric constant was lowered and the stability of the prepolymer solution was markedly improved in spite of the decline of the mechanical property and the heat resistance. It was found that during the course of polymerization, the modulus of elasticity could be increased to 10 GPa or higher by adding tripropynyl borazine and triethynyl borazine together as borazine derivatives.

During the course of the synthesis by the reaction of hydrosilylation of boraine derivatives and a silicon compound, the molar ratio of triethynyl borazine and tripropynyl borazine as borazine derivatives is in the range of 97:3 to 0:100 and preferably 90:10 to 0:100.

In Chemical Formula 8, the substituent group $R_1$ for the nitrogen atom of borazine identically or differently denotes a monovalent group selected from ones consisting of an alkyl group, an aryl group and an aralkyl group. As concrete examples of the monovalent group, alkyl groups, such as methyl group, ethyl group, isopropyl group, t-butyl group and octyl group, aryl groups, such as phenyl group, naphthyl group and biphenyl group, and aralkyl groups, such as benzyl group and phenethyl group, may be cited. The case having an acetylene group directly linked to the boron atom of borazine and the case having an acetylene group linked to the boron atom via an organic molecular side chain joining thereto methylene groups, such as methylene group and ethylene group, as $R_2$ may be also cited. The number of methylene groups falls in the range of 0 to 12, preferably 0 to 6. As concrete examples of the substituent $R_3$ that has substituted the hydrogen atom of an acetylene group, alkyl groups, such as methyl group, ethyl group, isopropyl group, t-butyl group and octyl group may be cited.

In Chemical Formula 9 mentioned above, $R_4$ and $R_5$ identically or differently denote a monovalent group selected from ones consisting of an alkyl group, an aryl group, an aralkyl group and a hydrogen atom. The number of carbon atoms of the alkyl group is in the range of 1 to 24, preferably 1 to 12. The number of carbon atoms of the aryl group is in the range of 6 to 20, preferably 6 to 10. The number of carbon atoms of the aralkyl group is in the range of 7 to 24, preferably 7 to 12. To cite concrete examples of $R_4$ and $R_5$, alkyl groups, such as methyl group, ethyl group, isopropyl group, t-butyl group and octyl group, aryl groups, such as phenyl group, naphthyl group and biphenyl group, aralkyl groups, such as benzyl group and phenethyl group, and hydrogen atom may be cited. Then, $R_6$ denotes an aromatic divalent group optionally possessing a substituent group, an oxygen atom or an oxypoly (dimethylsiloxy) group. The number of carbon aoms of the aromatic divalent group is in the range of 6 to 24, preferably 6 to 12. The aromatic divalent groups include arylene groups containing a hetero atom, such as oxygen, as a linking group besides divalent aromatic hydrocarbon groups (arylene groups and others). The substituent groups that are optionally linked to the aromatic divalent groups include alkyl groups, aryl groups and aralkyl groups. To cite concrete examples of $R_6$, arylene groups, such as phenylene group, naphthylene group and biphenylene group, and substituted arylene groups, such as diphenyether group may be cited.

The silicon compounds which possess such substituent groups and possess at least two hydrosilyl groups represented by Chemical Formula 9 include bis(monohydrosilanes), bis(dihydrosilanes) and bis(trihydrosilanes). As concrete examples of these bis(hydrosilane) compounds, m-bis(dimethylsilyl) benzene, p-bis(climethylsilyl) benzene, 1,4-bis(dimethylsilyl) natphtalene, 1,5-bis(dimethylsilyl) naphthalene, m-bis(methylethylsilyl) benzene, m-bis(methylphenylsilyl) benzene, p-bis(methyl-octylsilyl) benzene, 4,4'-bis(methylbenzylsilyl) biphenyl, 4,4'-bis(methylphenethylsilyl) diphenyl ether, m-bis(methylsilyl) benzene, m-disilyl benzene, 1,1,3,3-tetramethyl 1,3-disiloxane and hydrodimethyl siloxypoly (dimethylsiloxy) dimethylsilane may be cited, though not exclusively.

As concrete examples of the cyclic silicon compounds possessing at least two hydrosilyl groups, the compounds represented by Chemical Formula 10 mentioned above may be cited. In the formula, $R_7$ denotes an alkyl group, an aryl group or an aralkyl group. The number of carbon atoms of the alkyl group is in the range of 1 to 24, preferably 1 to 12, the number of carbon atoms of the aryl group is in the range of 6 to 20, preferably 6 to 10, and the number of carbon atoms of the aralkyl group is in the range of 7 to 24, preferably 7 to 12. As concrete examples of the $R_7$, alkyl groups, such as methyl group, ethyl group, isopropyl group, t-butyl group and octyl group, aryl groups, such as phenyl group, naphthyl group and biphenyl group, and aralkyl groups, such as benzyl group and phenethyl group may be cited. The symbol n denotes an integer of 3 or more and preferably falling in the range of 3 to 10, and more preferably 3 to 6.

To cite concrete examples of these cyclic silicon compounds possessing at least two hydrosilyl groups, 1,3,5,7-tetramethyl cyclotetrasiloxane, 1,3,5,7,9-pentamethyl cyclopentasiloxane, 1,3,5,7-tetraethyl cyclotetrasiloxane, 1,3,5,7-tetraphenyl cyclotetrasiloxane and 1,3,5,7-tetrabenzyl cyclotetrasiloxane may be cited, though not exclusively.

The silicon compounds possessing two or more hydrosilyl groups may be used singly. Properly, they may be used in the form of a mixture of two or more members.

In Chemical Formula 12 mentioned above, the substituent group $R_8$ of the nitrogen atom of borazine denotes an identical or different monovalent group selected from ones consisting of an alkyl group, an aryl group and an aralkyl group. To cite concrete examples of this substituent group, alkyl groups, such as methyl group, ethyl group, isopropyl group, t-butyl group and octyl group, aryl groups, such as phenyl group, naphthyl group and biphenyl group, and aralkyl groups, such as benzyl group and phenethyl group may be cited. The case having an acetylene group directly linked to the boron atom of borazine and the case having an acetylene group linked to the boron atom via an organic molecular side chain joining thereto methylene groups, such as methylene group and ethylene group, as $R_9$ may be also cited. The number of methylene groups falls in the range of 0 to 12, preferably 0 to 6.

In the fine fabrication of a borazine-silicon polymer, the etching can be accomplished by using as an etching gas not only PFC gas, such as $C_4F_8$, but also chlorine ($Cl_2$) gas. The borazine-silicon polymer can be used as an interlayer insulating film. When chlorine ($Cl_2$) gas is used, as the etching gas, in this case, the use of the PFC gas in the etching process can be cut by 100%. Naturally, the polymer can be etched with the PFC gas as conventionally practiced by using a resist material as a mask. Further, the borazine-silicon polymer may be used as thin film materials, such as an etching stopper, a hard mask and a diffusion barrier, that serve to encompass an interlayer insulating film and bring about fine effects.

The interlayer insulating material of an organic polymer can be etched with a mixed gas of hydrogen and nitrogen. Since the hard mask for this etching requires use of an inorganic film material, such as $SiO_2$, the PFC gas is indispensable to the fabrication of the hard mask and the perfect elimination of PFC cannot be accomplished. This elimination can be achieved, however, by using the borazine silicon thin film for the hard mask.

Heretofore, inorganic film materials, such as $SiO_2$, SiC and $Si_3N_4$, have been used for hard masks, etching stoppers and diffusion barriers. These inorganic film materials generally have high dielectric constants. The wiring structure formed of these materials acquires a high effective dielectric constant and, when combined with an interlayer insulating film of a low dielectric constant, brings only a small effect of this combination. When an interlayer insulating layer having a relative dielectric constant of 2.5 is used and a hard mask, an etching stopper and a diffusion barrier which are made of $Si_3N_4$ are used, the wiring structure consequently formed has such a large effective relative dielectric constant as 3.5 and fails to manifest any appreciable effect of using the interlayer insulating material of a low dielectric constant. The thin film material using the borazine-silicon polymer having a low dielectric constant can be expected to manifest a proper effective dielectric constant.

Embodiment 2

Now, Embodiment 2 that synthesized a borazine-silicone polymer by fulfilling the second characteristic of this invention will be shown below.

The borazine-siloxane polymer that is one form of the borazine-silicon polymer possesses a substituent group containing a triple bond in the boron atom of a borazine ring as shown in FIG. 4(c). It is obtained by subjecting a borazine compound possessing an alkyl substituent group in the nitrogen atom and 1,3,5,7-tetramethyl cyclosiloxane to hydrosilylating polymerizsation.

The polymerization reaction was performed in two stages. By performing the polymerization of the first stage at room temperature or 40° C., a polymer solution formed of a linear polymer uniformly soluble in a solvent was obtained. This polymer solution was applied on a Si wafer by the use of a spin coater. At the second stage, the coated wafer was heated from 200° C. through 400° C. to obtain a thin film formed of a network polymer.

The borazine-siloxane polymer was excellent in electrical properties, such as dielectric constant, mechanical properties, such as modulus of elasticity and hardness, and further in properties, such as heat resistance as shown in Table 4.

TABLE 4

Table 4: General properties of borazine-siloxane polymer

| Electric property | Relative dielectric constant | 2.4 to 2.8 (nonporous material) |
|---|---|---|
| Mechanical properties | Modulus of elasticity | 7 to 15 GPa |
|  | Hardness | 0.5 to 1 GPa |
| Thermal property | Heating weight loss temp. | 500° C. (5%) |

In this Embodiment, a borazine and a silicon compound possessing structures shown in FIG. 4(b) were used. A boraine-silicon polymer was synthesized by using B,B',B''-triethynyl-N,N',N''-trimethyl borazine having an ethynyl group of a triple bond linked to the boron atom and a methyl group linked to the nitrogen atom in a borazine and p-bis (dimethylsilyl) benzene as a hydrosilane or the cyclic siloxane, a 1,3,5,7-tetramethyl cyclotetrasiloxane, as a siloxane and causing these components to react at an equivalent molar ratio.

As the solvent for this polymerization, ethyl benzene that had been deprived of the water component with a drying agent and subsequently distilled was used. As a polymerization catalyst, platinum ($Pt_2(dvs)_3$, in which dvs denotes 1,3-divinyl(1,1,3,3-tetramethyl-1,3-disiloxane) was used. The reaction was carried out at room temperature in an atmosphere of nirogen.

Since the borazine possesses three ethynyl groups and the silane compound possesses two and the siloxane compound four SiH groups, the reaction solution formed a cross-linked structure and induced gelation as the reaction proceeded. The gel component that was insoluble in the solvent formed a foreign matter during the application of the polymer by the spin coating and rendered uniform application to the wafer difficult. Thus, the occurrence of the gel component ought to be suppressed to the fullest possible extent.

Further, the gel component had to be removed from the polymer prior to the application to the wafer. By adjusting the amount of the catalyst, therefore, the linear polymer resulting from the addition of SiH to the ethynyl group of borazine had to be stopped before undergoing the ensuing cross-linking reaction continuously. Thus, the polymer had to be stored in a refrigerator lest the reaction should proceed.

For the purpose of use, the polymer was passed through a micro-filter, applied on a wafer by the use of a spin coater and thermally set at 200° C. for one hour and further at 300° C. for 30 minutes. Consequently, the transformation of the borazine-silicon polymer into a network proceeded.

For the purpose of terminating the reaction before the gelation advanced, the condition of the advance of the reaction had to be monitored. By utilizing the principle that the content of B,B',B''-triethynyl-N,N',N''-trimethyl borazine in the reaction solution can be determined by gas chromatography, the condition of the advance of the reaction was found by determining the unaltered borazine content in the reaction solution.

Table 5 shows the relation among the amount of the catalyst added, the reaction time and the unaltered borazine content in the reaction of B,B',B''-triethynyl-N,N',N''-trimethyl borazine, hydrosilane and 1,3,5,7-tetramethyl cyclotetrasiloxane.

TABLE 5

Table 5: General properties of borazine-siloxane polymer

| Electric property | Relative dielectric constant | 2.4 to 2.8 (nonporous material) |
|---|---|---|
| Mechanical properties | Modulus of elasticity | 7 to 15 GPa |
| | Hardness | 0.5 to 1 GPa |
| Thermal property | Heating weight loss temp. | 500° C. (5%) |

In the gas chromatography, the peak of the unaltered borazine was recognized after the elapse of 15 minutes and the peak of what seemed to be a compound resulting from the reaction of one of the ethynyl groups of the borazine compound with one of the SiH groups of the siloxane compound was recognized after the further elapse of 25 minutes. Before the addition of the catalyst, only the peak of the unaltered borazine was recognized. With the elapse of the reaction time, this peak dwindled and the peak of the compound produced by the reaction of one of the ethynyl groups of the borazine compound and one of the SiH groups of the siloxane compound appeared. As the reaction further proceeded, this peak disappeared and the peak of the solvent alone remained.

The reaction was terminated when the peak of the solvent began to persist alone. When the amount of the catalyst added was unduly small, the reaction failed to proceed and the unaltered borazine compound alone persisted. Comparison between p-bis(dimethylsilyl) benzene and 1,3,5,7-tetramethyl cyclotetrasiloxane reveals that the former compound has lower reactivity than the latter compound and does not easily induce gelation.

Even when the polymer was stored in a refrigerator prior to actual use, it showed a very short life of about one week. It was passed through a micro-filter to be deprived of foreign matter before it was applied. During the course of this filtration, it was found that when the polymer solution in the filter entrained air, it revealed such disadvantages as tending to form a gelled portion rapidly and consequently rendering uniform application difficult.

Figure 5A:
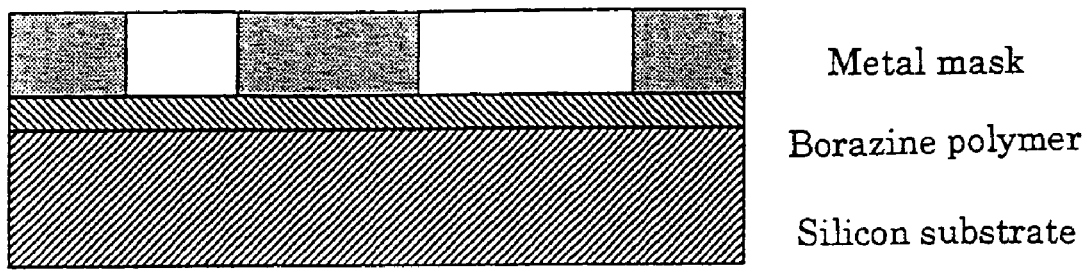
FIGS. 5(a) and (b) are cross sections of a sample having an aluminum (Al) electrode formed on a plate of stainless steel by the technique of evaporation using a metal mask having numerous fine holes opened therein and (c) is a diagram of a capacity-voltage curve of the sample shown in (a).
Figure 5B:
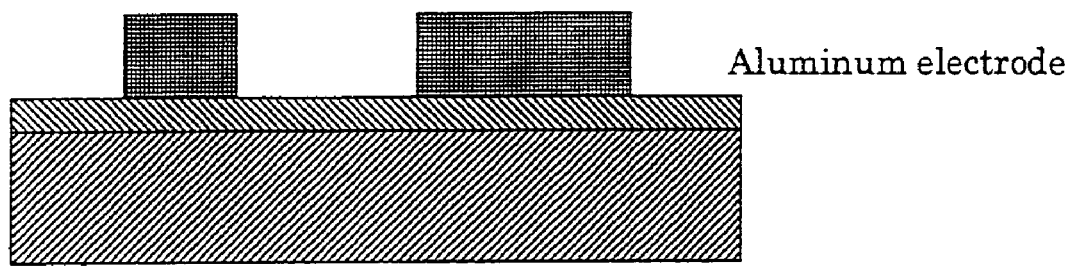
Figure 5C:
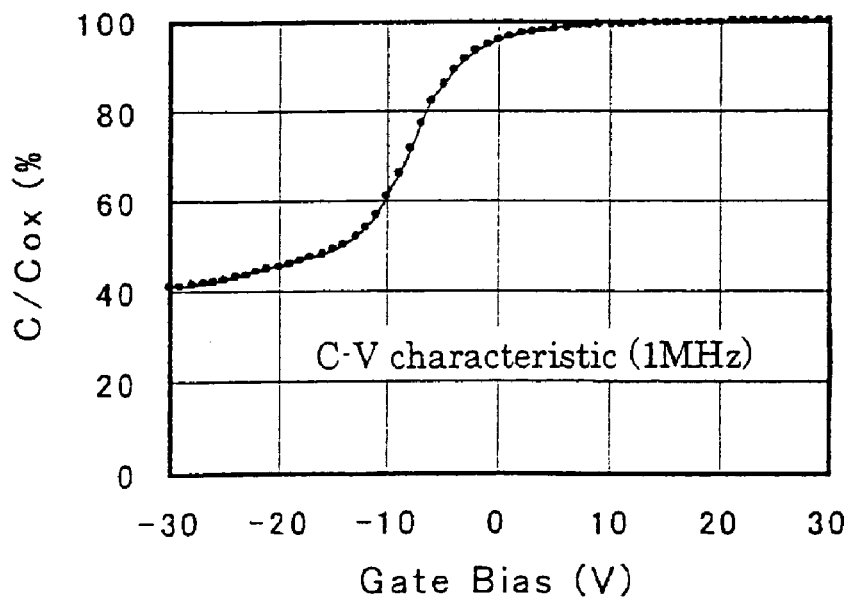

For the purpose of determining the electric properties, a MIS (metal-insulator-semiconductor) structure specimen was prepared by forming an aluminum (Al) electrode by the sputtering technique on the surface of a sample formed by accumulating a given borazine-silicon polymer. On the silicon substrate 601, a borazine-siloxane polymer solution obtained by subjecting B,B,B-triethynyl- N,N,N-tripropynyl borazine and 1,3,5,7-tetramethyl cyclotetrasiloxane, i.e. a cyclic siloxane, to hydrosilylating polymerization was coated by the use of a spin coater. The coated substrate was heat-treated at 250° C. for 30 minutes and further heat-treated at 400° C. for 30 minutes to form a polymer thin film 0.1 μm in thickness. The silicon substrate used in this case was an n-type product having a specific resistance of 9 to 12 Ωcm. An aluminum (Al) electrode was formed (FIGS. 5(a), 5(b)) through the evaporation technique using a metal mask made of a stainless steel sheet and furnished with numerous fine pores. When the specimen was subjected to a test for determining the capacity and voltage CV, it manifested a relative dielectric constant of the value of 2.5 as shown in FIG. 5(c). The Al electrode was a product having a diameter of 1 mm.

The specimen thus prepared was assayed with an analyzing device (made by Agilent Technology Corp. and sold under the product code of "HP4071") and a manual prober (made by Yuzan Shoji K. K. and sold under the product code of "OYM-401") to measure a capacity-voltage (C-V) and determine the relative dielectric constant. Incidentally, the relative dielectric constant ($\epsilon$) was calculated in accordance with the following formula using the maximum value of the C-V property, Cmax.

$$\epsilon = (Cmax \times d)/(\epsilon_0 \times S)$$

wherein S: surface area of electrode (m$^2$), d: thickness of film (m), Cmax: capacity (F), and $\epsilon_0$: relative dielectric constant (F·m$^{-1}$).

For the purpose of checking the effect exerted by the borazine ring of a borazine-silicon polymer on the relative dielectric constant, a benzene-silicon polymer was synthesized by subjecting m-diethynyl benzene, a compound having ethynyl group introduced in a benzene ring in the place of the borazine ring, and p-bis(dimethylsilyl) benzene in an equimolar ratio to a hydrosilylating reaction. These two polymers were compared in relative dielectric constant. The results are shown in Table 6.

TABLE 6

Table 6: Unaltered portion of borazine-silicon polymer during polymerization determined by gas chromatography

| Amount of catalyst (mol %) | Reaction time (hr) | Component ratios determined by gas chromatography (%) | | |
|---|---|---|---|---|
| | | Ethyl benzene (5 min) | Borazine (15 min) | Reacted borazine (25 min) |
| 0.4 | 0 | 95.10 | 4.90 | 0 |
| 0.4 | 1 | 93.57 | 3.47 | 2.96 |
| 0.4 | 2 | 96.69 | 0 | 3.31 |
| 0.4 | 3 | 100 | 0 | 0 |
| 0.4 | 72 | 100 | 0 | 0 |
| 0.16 | 72 | 97.44 | 1.18 | 1.38 |
| 0.4 | 72 | 95.02 | 3.92 | 1.06 |

It was found that the introduction of the borazine ring resulted in decreasing the relative dielectric constant. This contrast may be explained by admitting the difference between that the borazine-silicon polymer using a trifunctional borazine compound formed a three-dimensional structure and that the benzene-silicon polymer using a bifunctional benzene compound formed a linear structure and did not form a network structure.

The relative dielectric constants of borazine-silicon polymers are shown in Table 7. The relative dielectric constant varied with the structure of the silicon compound. The relative dielectric constant of the polymer using p-bis(dimethylsilyl) benzene as a silane compound, for example, was smaller than the relative dielectric constant of the polymer using 1,3,5,7-tetramethyl cyclotetrasiloxane as a siloxane compound.

TABLE 7

Table 7: Comparison of borazine-silicon polymer and benzene-silicon polymer in relative dielectric constant

| Composition of polymer | Relative dielectric constant |
|---|---|
| m-Diethynyl benzene/p-bis(dimethylsilyl) benzene | 2.82 |
| Triethynyl borazine/p-bis(dimethylsilyl) benzene | 2.52 |

The relative dielectric constant was varied also with variation in the temperature of the heat treatment of the polymer. The heat treatment further performed at a temperature in the range of 400 to 500° C. lowered class=Section2> the relative dielectric constant of the silane polymer largely and conversely increased that of the siloxane polymer. By varying the conditions of the heat treatment, the relative dielectric constant of the borazine-siloxane polymer was made to fall in the range of 1.7 to 2.8. The results are shown in Table 8.

TABLE 8

Table 8: Structure of silicon molecule of borazine-silicon polymer, conditions of heat treatment and relative dielectric constant

|  | Siloxane polymer | Silane polymer |
|---|---|---|
| 200° C. 1 h/300° C. 30 min | 2.76 | 2.52 |
| 200° C. 1 h/300° C. 30 min/400° C. 30 min | 2.94 | 2.25 |
| 200° C. 1 h/300° C. 30 min/500° C. 30 min | 3.51 | <2.1 |

The cause for this phenomenon was analyzed from the spectrum of the Fourier-transform infrared-absorption spectrometry (FT-IR). In the case of the silane polymer, the absorption at 1250 to 1275 $cm^{-1}$ due to Si—$CH_3$, absorption at 700 to 850 $cm^{-1}$ due to Si—C and absorption at 2900 to 3000 $cm^{-1}$ due to C—H were found to decrease in accordance as the temperature of the treatment was heightened. It is, therefore, inferred that the lowering of the dielectric constant by the heat treatment of the polymer was induced because the elimination of the organic group by the thermal decomposition resulted in increasing the porosity.

Similarly in the case of the siloxane polymer, the absorption at 1250 to 1275 $cm^{-1}$ due to the Si—$CH_3$, absorption at 700 to 850 $cm^{-1}$ due to the Si—C and absorption at 2900 to 3000 $cm^{-1}$ due to the C—H were found to decrease. The absorption at 1000 to 1100 $cm^{-1}$ due to the Si—O—Si increased simultaneously. It is, therefore, inferred that the decrease of the relative dielectric constant of the siloxane polymer by the additional heat treatment occurred because the oxidation of the residual SiH group promoted the transportation of the polymer to $SiO_2$.

It is inferred that the borazine-silicon polymer, on being heated, easily expels the organic group and readily gains in porosity because it is an organic-inorganic hybrid polymer excelling in heat resistance as compared with an organic polymer. By the introduction of an organic group abounding in thermal decomposability, therefore, it can be expected to have the dielectric constant thereof further lowered.

The membrane was tested for hardness and Young's modulus as mechanical properties by the use of a nano-indentater. The specimen for this measurement was obtained by applying the borazine-siloxane polymer in a thickness of 200 nm to a silicon substrate and cutting the square of 1 cm from the coated substrate. The modulus of elasticity was determined by the nano-indentation using an extremely light load thin film hardness tester (made by Hysitron Inc. and sold under the trademark designation of "Triboscoope system," annexed with an accessory made by Digital Instrumental Corp. and sold under the trademark designation of "Nanoscope-IIIa+ D3100"). With the depressing depth of the indenter fixed at about 10% of the film thickness, the membrane was measured for the modulus of elasticity as much as possible in the region of the elastic deformation of a load-displacement curve.

Figure 6:
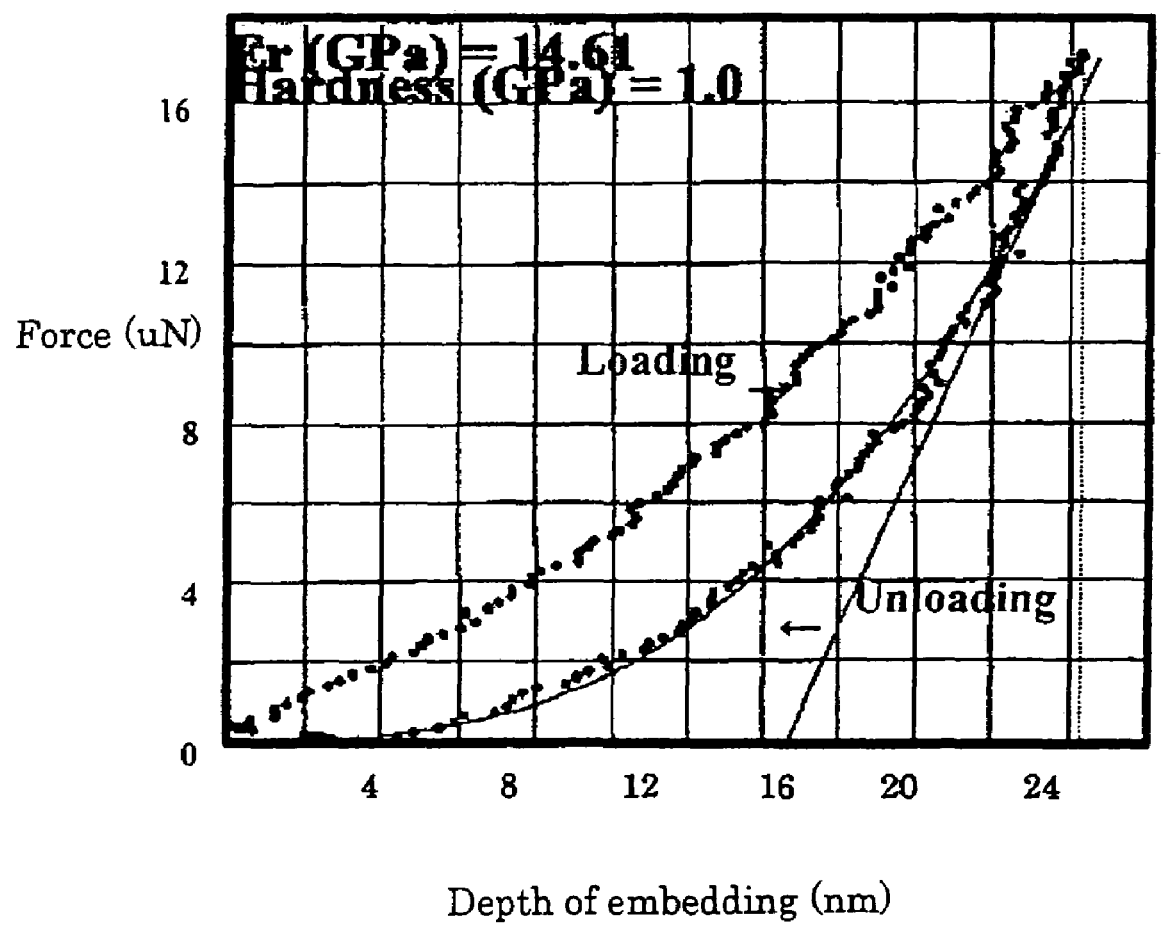
FIG. 6 is a diagram showing the relation between the force and the depth of embedding determined by the nano-indentation technique.
Figure 7A:
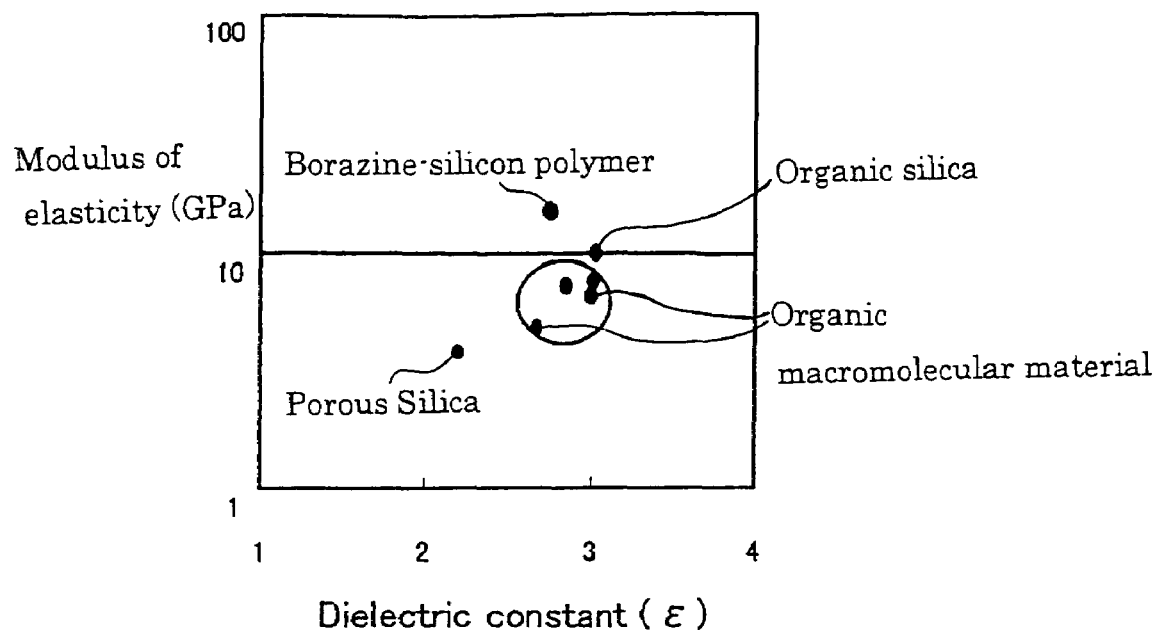
FIGS. 7(a) and (b) are diagrams respectively showing the data of modulus of elasticity and the data of hardness of various dielectric materials.
Figure 7B:
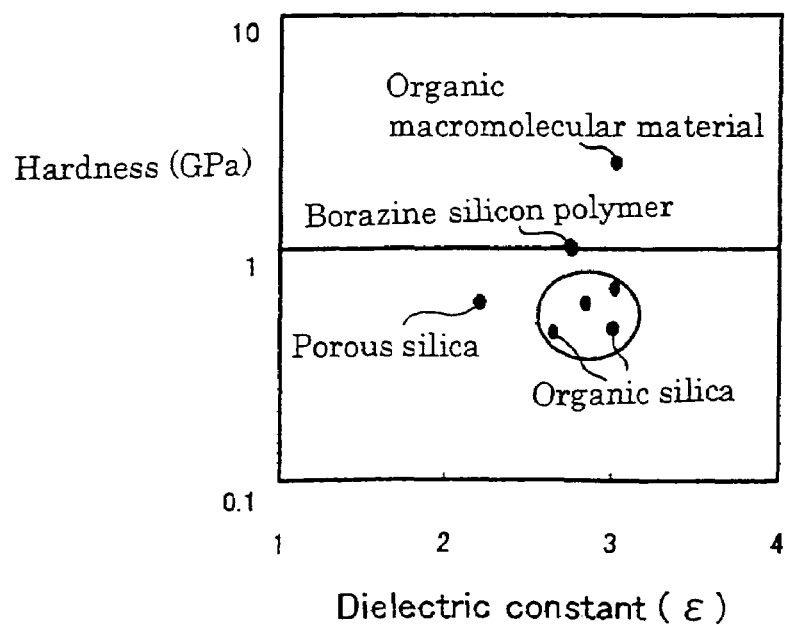

The results of the determination by the nano-indentation are shown in FIG. 6. The borazine-siloxane polymer was found to have a modulus of elasticity of 15 GPa and a hardness of 1 GPa. FIG. 7 shows the results of the determination of modulus of elasticity and hardness performed by nano-indentation on other low dielectric materials. The organic polymer materials were deficient in mechanical properties, showing modulus of elasticity and hardness both below 1. In contrast, the inorganic polymer materials excelled in both modulus of elasticity and hardness. It was found that the borazine-siloxane polymer, owing to the characteristics of an organic-inorganic hybrid polymer, excelled in both modulus of elasticity and hardness as compared with the organic polymer materials and possessed mechanical properties useful for practical applications.

Figure 8:
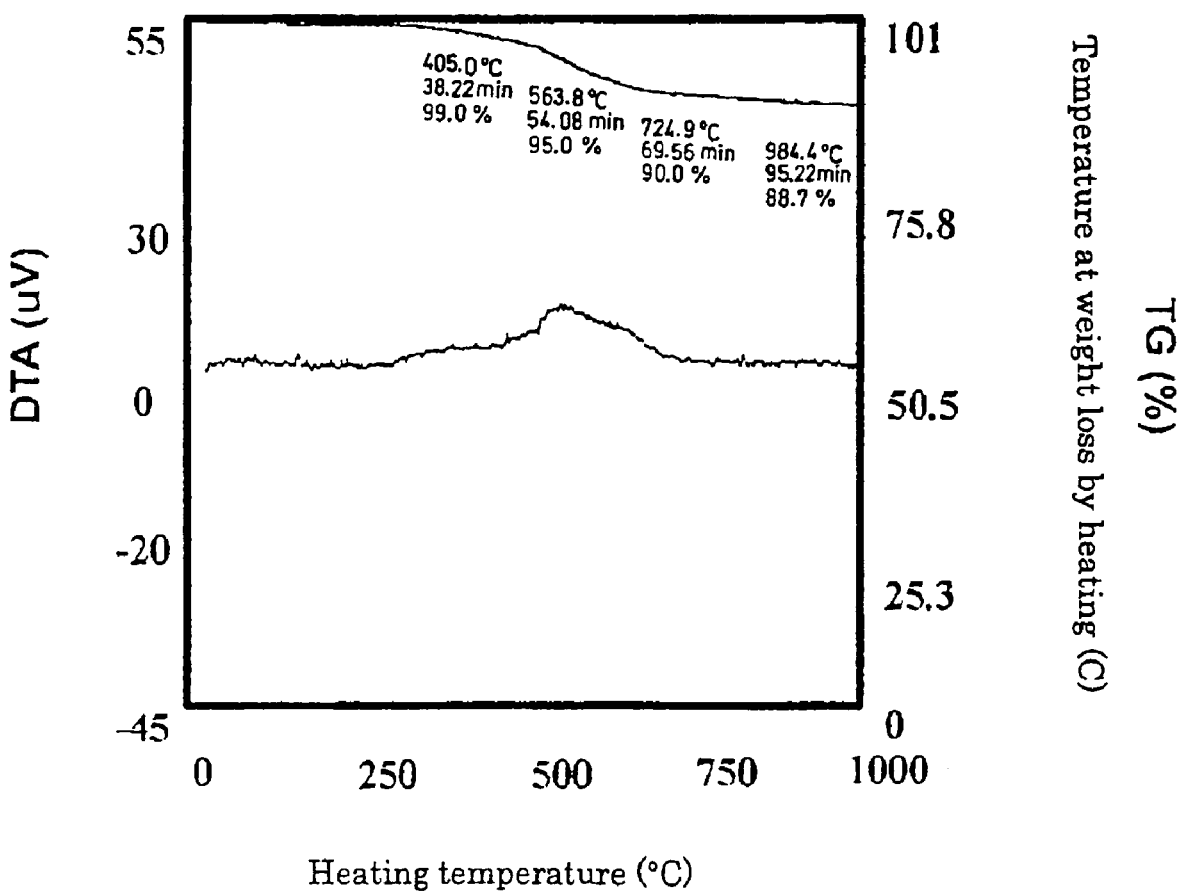
FIG. 8 is a diagram showing the TG curve of a borazine-silicon polymer.

The heat resistance of a polymer was rated through heating the polymer in an atmosphere of air from room temperature to 1000° C. and determining the loss of weight (IG measurement) caused by the heating. FIG. 8 shows the results of the loss of weight by heating. The temperature for the loss of 1% in weight was found to be 405° C., that for the loss of 5% in weight to be 564° C. and that for the loss of 10% in weight to be 725° C. The prominent excellence of the borazine-siloxane polymer in heat resistance is evident from the comparison of these magnitudes with those of polyimide that is a typical organic heat-resistant polymer material, namely a temperature on the order of 400° C. for a loss of 5% in weight and a temperature on the order of 500° C. for a loss of 10% in weight.

Figure 9:
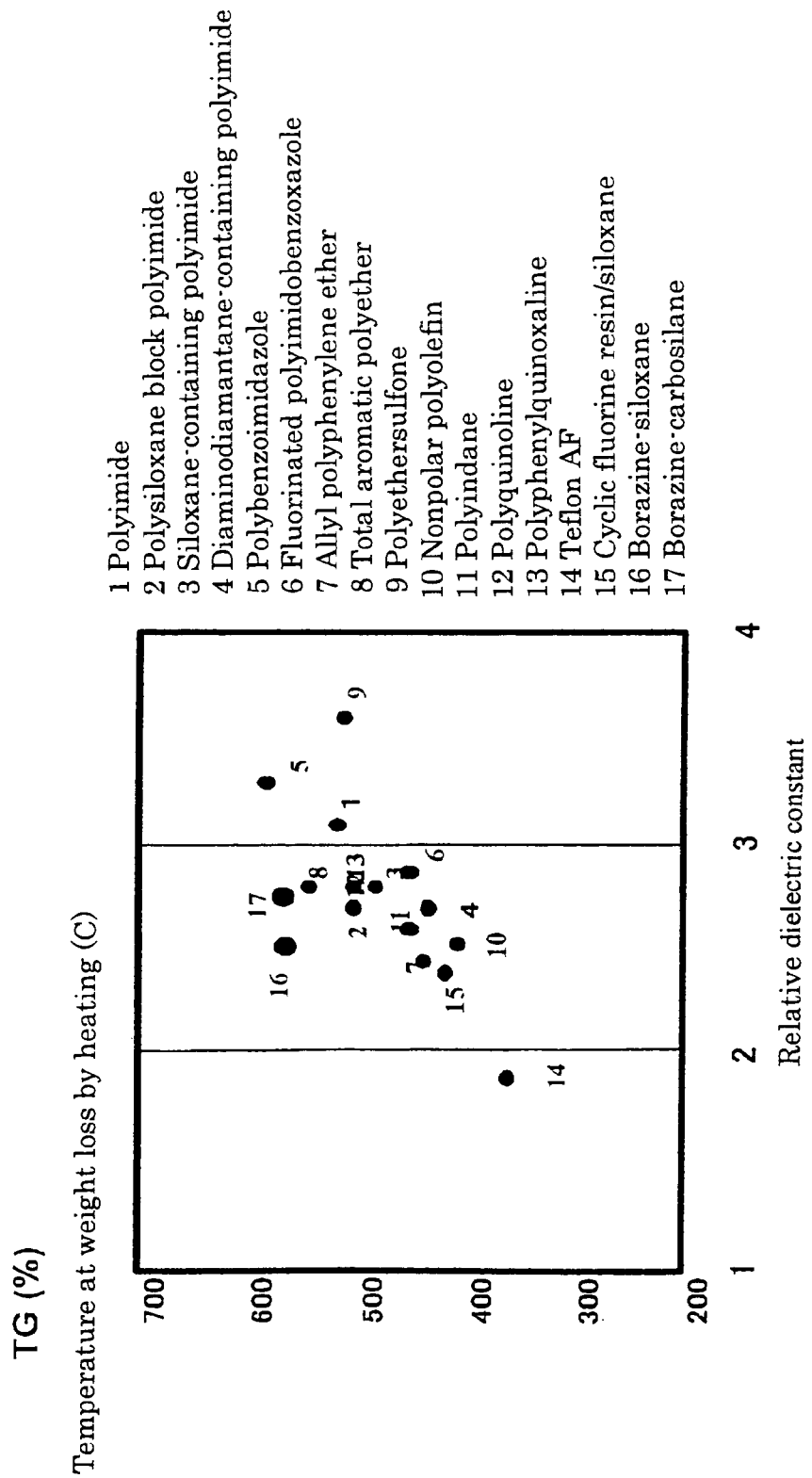
FIG. 9 is a diagram showing the data of relative dielectric constant and heat resistance of various polymers.

FIG. 9 shows the relation between the temperature for loss of weight (5%) by heating and the dielectric constant of a varying organic polymer material. It is found that fluorine polymers were deficient in heat resistance in spite of small relative dielectric constants and that borazine-silicon polymers possessed fully satisfactory heat resistance for a low dielectric constant interlayer insulating film.

Figure 10:
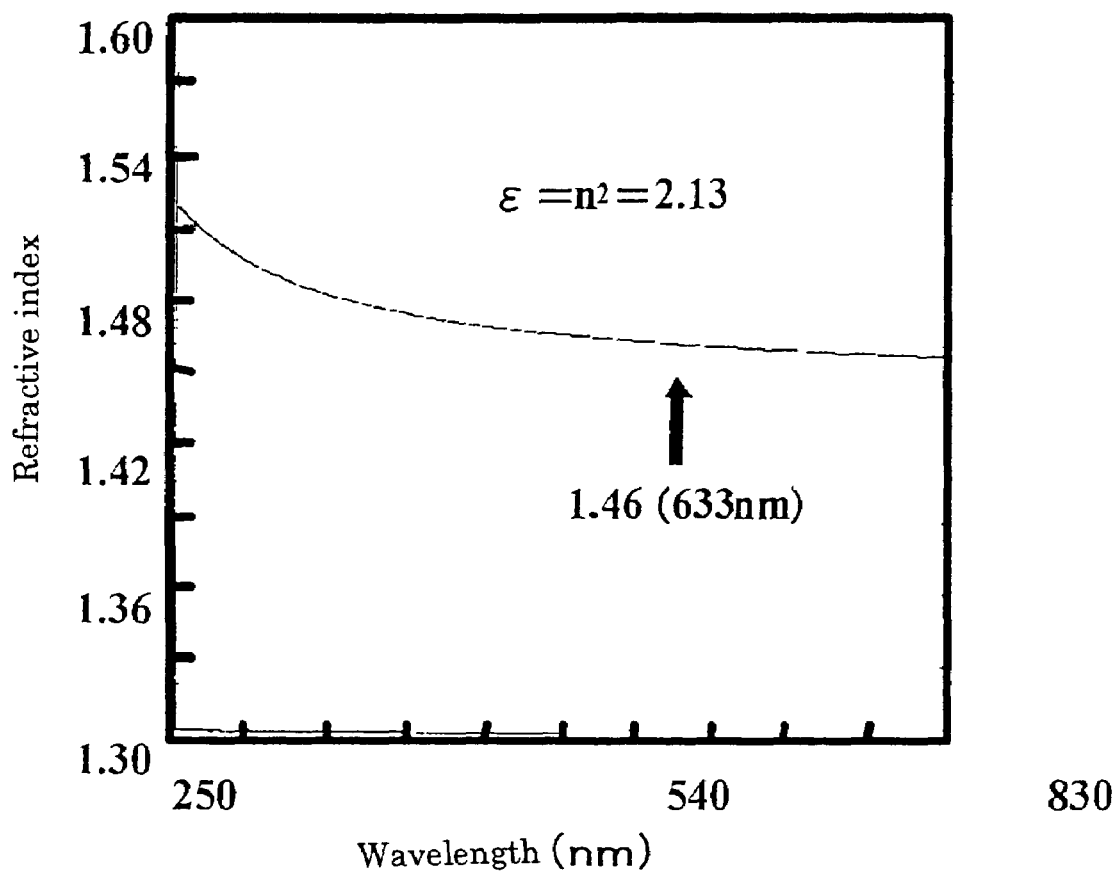
FIG. 10 is a diagram showing the refractive index of a borazine-silicon polymer.

The refractive index of the borazine-siloxane polymer was found by subjecting a sample prepared by coating a wafer with the polymer to analysis with a polarizing analyzer (ellipsometry). FIG. 10 shows the relation between the measuring wavelength and refractive index. The polymer was found to have a refractive index of 1.46 at a wavelength of 633 nm. Since $n^2$ that is the square of the refractive index n represents the electron polarizing component $\epsilon_r$ of the dielectric constant and turns out to be 2.13, the refractive index was found to have a smaller magnitude than the relative dielectric constant 2.76. This magnitude is large as compared with that of a fluorine polymer that has a small refractive index and small as compared with an ordinary organic polymer. It is fairly small as compared with the magnitude, 1.55, shown by the product of Dow Chemical Incorporation sold under the trademark designation of "SiLK (R)" and contemplated as an organic interlayer insulating film. It is smaller than the magnitude, 1.51, of the polymethyl methacrylate that is extensively utilized as an optical material. Thus, the polymer has a feasibility of being used as an optical material.

The boron atom of the borazine ring is known to react with chlorine to form $BCl_3$. Thus, the borazine-silicon polymer is thought to be capable of being etched with the chlorine gas ($Cl_2$). For the purpose of testing the borazine-silicon polymer for the etching property, a sample was prepared by depositing the borazine-siloxane polymer in a thickness of 230 nm on a silicon substrate.

Figure 11:
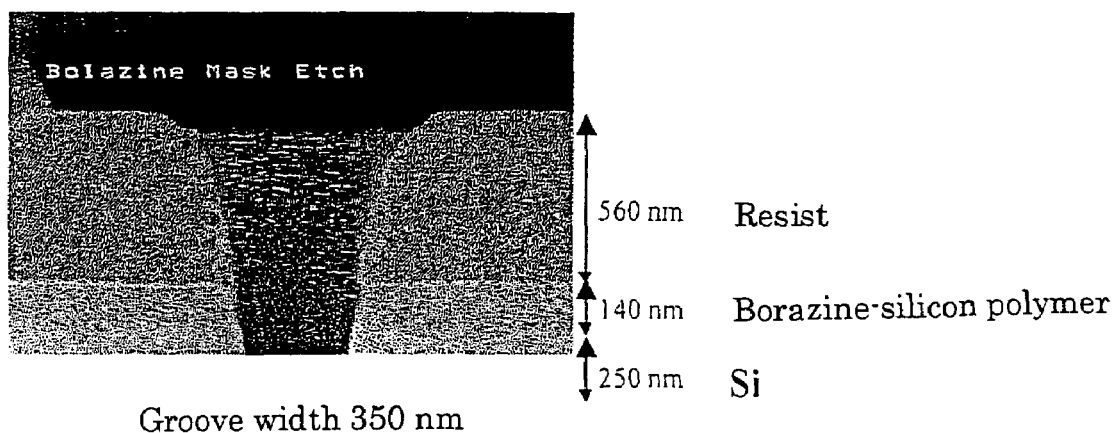
FIG. 11 is a diagram showing an etching section picture taken with a scanning electron micrograph (SEM).

Under the conditions of $Cl_2$, 100 sccm and 3 mTorr (0.40 Pa), the polymer was found to have an etching speed of 40 nm/min. The SEM photographs of the sections of etching are shown in FIG. 11 and FIG. 12(*b*) and 12(*c*). With the object of finding the selective ratio relative to the organic interlayer insulating film SiLK (R), the polymer was etched under the conditions of $H_2/N_2$ (70:30), 5 mTorr (0.67 Pa). The borazine-silicon polymer was found to have an etching speed of 50 nm/min and a selective ratio of 7.4 relative to the etching speed of SiLK, 370 nm/min, indicating that this polymer possesses a fully sufficient selective ratio.

Generally, the siloxane compound requires use of PFC (Per-Fluoro-Carbon) to be etched effectively. The borazine-siloxane polymer has borazine structures and siloxane structures alternating therein and has Si—O bonds not connected therein. It is inferred that this polymer permits etching because the borazine ring is decomposed with $Cl_2$ and the polymer chain is decomposed into monomer units.

Further, this polymer possesses a siloxane bond that is capable of being etched with the PFC gas, a borazine structure that is capable of being etched with the chlorine gas and further an organic linking chain capable of being etched with oxygen or a nitrogen/hydrogen mixed gas. It is, therefore, thought to be capable of being etched with a varying kind of gas.

When the polymer was actually etched, it was found to have proper etching speeds of 460 nm/min with the chlorine gas and 220 nm/min with the $C_4F_8/O_2$/Ar mixed gas and small etching speeds of 50 nm/min with the nitrogen/hydrogen mixed gas and 11 nm/min with the oxygen gas. Thus, the polymer is made to exhibit an excellent etching property by selecting the etching conditions.

The organic polymer interlayer insulating material and the resist material are both formed of organic polymers and, therefore, have no selectivity for the etching gas. Thus, they require $SiO_2$, SiC or $Si_3N_4$ to be deposited thereon as by the CVD and the resultant film to be used as a hard mask. To produce the hard mask, the film is required to undergo dry etching with the PFC gas. When the low dielectric constant organic polymer interlayer insulating film is introduced with a view to decreasing the consumption of the PFC, the effect of this introduction is small. Further, since $SiO_2$, SiC and $Si_3N_4$ have such large bulk relative dielectric constants of 4.3, 4.5 and 7, respectively, the elaborate use of an organic polymer interlayer insulating film of a small dielectric constant merely results in inducing a waste of the characteristic thereof. The borazine-siloxane polymer has a low dielectric constant and, therefore, is capable of being dry-etched without requiring use of the PFC gas. By combining this polymer with an organic polymer interlayer insulating material, it is made possible to use a dry-etching technique that has no use for the PFC gas having a deep effect in warming the earth and to construct a multilayer interconnection structure that permits a decrease in the effective relative dielectric constant.

Embodiment 3

FIG. 13 is a cross section of a semiconductor device representing Embodiment 3 of this invention. This embodiment embraces the third characteristic of this invention.

A silicon (Si) substrate 101 was separated into elements and fabricated in accordance with a prescribed circuit design to form an active device, such as a transistor. The active device, after having a BPSG/CVD-$SiO_2$ (102) deposited thereon, connecting holes 103 opened therein for electrical connection, and a local wiring formed therein with tungsten (W), for example, and the connecting holes filled with tungsten, was treated by the chemical mechanical polishing (CMP) to have the surface thereof flattened. Denoted by 103 in the diagram are the connecting holes that were buried with W (FIG. 13(a)).

FIG. 13(a) avoids depicting details, such as the transistor, for the sake of simplicity. The following explanation will be made with reference to the part A of FIG. 13(a), which is a magnified diagram. This invention does not need to be limited to the wiring process which is aimed at effecting electrical connection with such contact holes, but can be applied to all the so-called processes of multilayer interconnection which follow the formation of local wirings (so-called MO wirings) connected to a gate electrode as the center with a wiring material, such as W. The so-called damascene process which is adopted when a low dielectric constant interlayer insulating film is used in combination with copper (Cu) wiring is described in detail in Non-Patent Document 2 ("Latest Development of Cu Wiring Techniques," compiled by Shozo Shinmiyahara, Nobuyoshi Awaya, Kazuyoshi Ueno, and Nobuhiro Misawa (Realize K. K.)).

Then, on the resultant substrate, $SiO_2$ (104) was deposited in a thickness of 50 to 100 nm and a borazine-siloxane polymer 105 was deposited in a thickness of 100 to 200 nm by the plasma CVD. The $SiO_2$ (104) was formed by depositing tetraethoxy silane (TEOS), for example, as a raw material at a depositing speed in the range of 100 to 1000 nm/min by the use of an ordinary parallel plates plasma CVD device under the conditions of 250 to 450° C. in substrate temperature, 10 to 200 cc/min in TEOS flow rate, 100 to 500 watts in applied high frequency power and 1 to 20 Torrs in depositing pressure. The depositing conditions of the $SiO_2$ (104) are standard conditions that are generally adopted at shops. This invention is not swayed by the depositing conditions of the $SiO_2$ (104).

The borazine-siloxane polymer 105 was deposited under the following "conditions 1." When the borazine-siloxane polymer thin film formed under these conditions was manufactured into a separate MOS diode configuration, the relative dielectric constant thereof calculated from the capacity-voltage (CV) property was found to be 2.2 to 2.8.

[Conditions 1]

A borazine-siloxane polymer solution obtained by subjecting B,B',B"-tripropynyl-N,N,N-trimethyl borazine and 1,3,5,7-tetramethyl cyclotetrasiloxane, i.e. a cyclic siloxane, to hydrosilylating polymerization was coated by the use of a spin coater onto the silicon substrate having $SiO_2$ deposited thereon. The coated silicon substrate was heat-treated in an atmosphere of argon (Ar) or nitrogen ($N_2$) gas at 200 to 300° C. for 10 to 60 minutes and further at 350 to 450° C. for 10 to 60 minutes to form a polymer thin film of the structure of a network having a thickness of 80 to 150 nm. For example, the polymer thin film of the structure of a network 80 to 150 nm in thickness could be formed by performing the heat treatment in an atmosphere of argon (Ar) or nitrogen ($N_2$) gas at 250° C. for 30 minutes and further at 400° C. for 30 minutes. The relative dielectric constant of the polymer thin film determined by the CV technique was 2.5.

On the coated silicon substrate mentioned above, a SiLK (R) film 106 was deposited as an organic interlayer film in a thickness of 400 to 600 nm. The deposition of this organic interlayer insulating film 106 was attained using an ordinary spin coater and rotating the wafer at 1000 rpm for 40 seconds. By heat-treating the wafer at 250° C. for 30 minutes and further at 400° C. for 30 minutes, the thin film was formed. A borazine-siloxane polymer film 107 was deposited as a hard mask in a thickness of 100 to 200 nm under the "conditions 1" mentioned above. Further, a resist 108 was deposited thereon in a thickness of 200 to 300 nm and opened therein by an ordinary development resorting to the exposure to light to complete a resist pattern 109 in the pattern shape of the connecting holes 103 illustrated (FIG. 13(b)).

The hard mask 107 was shaped by dry etching using the resist pattern 109 as a mask and $C_4F_8/O_2$/Ar as an etching gas to copy on the hard mark 107 connecting hole patterns 109 for electrical connection with the connecting holes The hard mask was etched by the use of a NLD (Neutral Loop Discharge, magnetic neutral ray discharge) etching device under the conditions of 100 sccm in chlorine ($Cl_2$) flow rate, 10 mTorrs in pressure, 1200 Watts in plasma source power, 250 Watts in bias power, ICP (inductively coupled plasma) in discharge mode and 20° C. in substrate temperature. At this time, the etching speed of the borazine-siloxane polymer was 460 nm/min and the selective ratio to the photoresist was 6. Further, the organic interlayer insulating film 106 was dry-etched with an etching gas of $N_2/H_2$ to form connecting hole patterns 110 for permitting electrical connection (FIG. 13(c)). The organic interlayer film 106 was etched by using a NLD etching device and a mixed gas of $N_2$ and $H_2$ under the conditions of 70 sccm and 30 sccm, respectively, in flow rate of the gases, 5 mTorrs in pressure, 2000 Watts in plasma source power, 600 Watts in bias power, NLD in discharge mode and 0° C. in substrate temperature. The etching speed of the organic insulating film was 350 nm/min and the selective ratio to the borazind-siloxane polymer was 7.

Then, a resist 111 was deposited in a thickness of 200 to 300 nm and a resist pattern 112 of a pattern shape for the first wiring layer was formed by the ordinary development resorting to the exposure to light (FIG. 13(d)).

The hard mask 107 and the exposed parts of the diffusion barrier 105 and $SiO_2$ (104) were shaped through dry etching with $C_4F_8/O_2/Ar$ as an etching gas. The etching conditions used herein were identical with those for the hard mark 107 mentioned above (FIG. 13(e)).

Further, the interlayer insulating film 106 was shaped through dry etching with a $N_2/H_2$ gas (FIG. 13(f)). The etching conditions for the interlayer film 106 were the same as those used for opening the connecting holes in the organic interlayer film 106. At this time, the resist 111 was etched during the course of etching the interlayer insulating film 106. Eventually, it was substantially eliminated.

After the surface which had undergone the dry etching was given a purging treatment, a TaN/Ta film 113 was deposited as a Cu diffusion barrier layer by the sputtering technique and a seed layer of Cu (114) was further deposited in preparation for the electrolytic plating of Cu at the next step (FIG. 13(g)).

Then, on the resultant surface of the substrate, a Cu film 115 was deposited through the electrolytic Cu plating technique. At this time, a groove part 112 destined to seat the first wiring layer could be buried with the Cu film 115 without leaving a gap behind (FIG. 13(h)). After the deposition of the Cu film 115, the substrate was given a heat treatment in an atmosphere of nitrogen ($N_2$) or argon (Ar) at a temperature in the range of 300 to 450° C. for a period in the range of 10 to 30 minutes, for example, with the object of promoting the growth of grains of the Cu plated film 115 and, at the same time, lowering the contact resistance between W, a filler for the lower layer connecting holes 103, and the barrier metal TaN/Ta layer 113 and between the W and the Cu film 115.

Subsequently, the excess Cu and the TaN/Ta film in the flat part of the substrate surface were removed and the substrate surface was flattened as well by the CMP technique. Thereafter, a capping $SiO_2$ film 116 was deposited to cover the surface (FIG. 13(i)). The conditions for depositing the $SiO_2$ were the same as those for depositing the $SiO_2$ (104) mentioned above, for example. The purpose of covering the surface with the capping film 116 resided in preventing the surface of Cu from being oxidized and suppressing the absorption of the moisture in the air by the hard mask 107 and the organic interlayer film 106. As the material for the capping film, $Si_3N_4$, SiC and SiON were found effective as well as $SiO_2$. The capping layer was not necessary when the next step was executed immediately. This capping work completed the Cu wiring for the first layer.

Then, a borazine-siloxane polymer 117 was deposited on the resultant substrate in a thickness of 100 to 200 nm under the [conditions 1]. A SiLK film 118 as an organic interlayer film for forming interlayer connecting holes was deposited in a thickness of 400 to 600 nm and a borazine-siloxane polymer film 119 as an etching stopper was deposited in a thickness of 100 to 200 nm under the [conditions 1]. Further, an organic interlayer film SiLK layer 120 as an interlayer insulating film for forming a second wiring layer was deposited in a thickness of 400 to 600 nm. The depositing conditions for the interlayer films 118 and 120 were the same as those for the interlayer film 106 of the first layer mentioned above. Further thereon, a borazine-siloxane polymer film 121 was deposited as a hard mask in a thickness of 100 to 200 nm under the [conditions 1], and a resist 122 was deposited in a thickness of 200 to 300 nm. By the ordinary development resorting to exposure to light, a resist pattern 123 of the shape of interlayer connecting holes (VIA) was formed in a width of 150 to 200 nm (FIG. 13(j)).

Then, the hard mask 121 was shaped by dry etching, with the resist 122 as a mask and $C_4F_8/O_2/Ar$ as an etching gas, and the VIA resist pattern 123 of a width of 150 to 200 nm was copied onto the hard mask 121. The etching conditions for the hard mask were the same as those of the etching conditions for the hard mask 107 mentioned above, for example. Further, the organic interlayer-insulating film 120 was dry-etched with an $N_2/H_2$ etching gas to form an interlayer-connecting hole (VIA hole). The etching conditions for the organic interlayer film 120 were the same as those for shaping the interlayer connecting hole and the shaping the wiring groove in the organic interlayer insulating film 106 mentioned above, for example.

Next, the etching stopper 119 was shaped through dry etching, with $C_4F_8/O_2/Ar$ as an etching gas. The etching conditions herein were the same as those for the hard mask 121, for example. Further, the interlayer insulating film 118 was shaped through dry etching with a $N_2/H_2$ gas (FIG. 13(k)). The etching conditions for the interlayer film 118 were the same as those for the organic interlayer film 120 mentioned above. At this time, the resist 122 was gradually etched during the course of etching the interlayer film 120, etching stopper 119 and interlayer insulating film 118. Eventually, it was eliminated substantially.

Figure 13I:
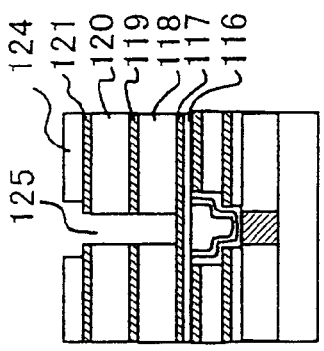
FIG. 13(a)-(p) illustrate schematic cross sections of exemplary aspects of the third embodiment of this invention.
Figure 13J:
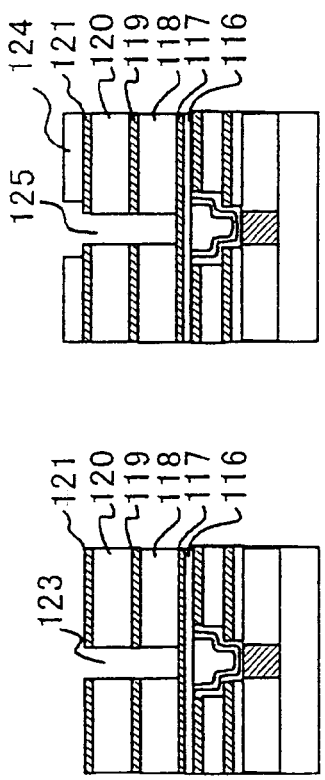
Figure 13K:
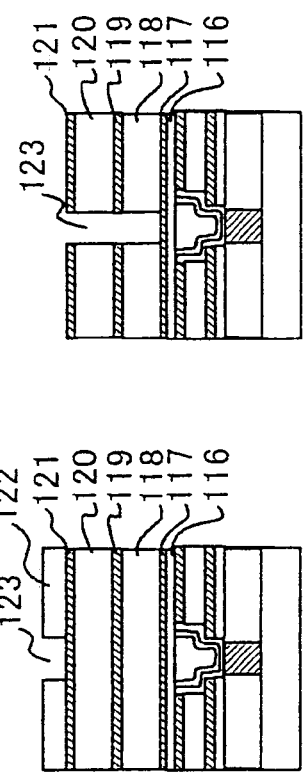
Figure 13L:
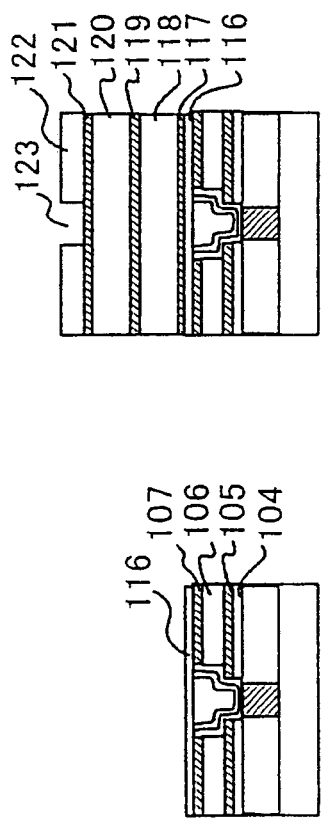
Figure 13M:
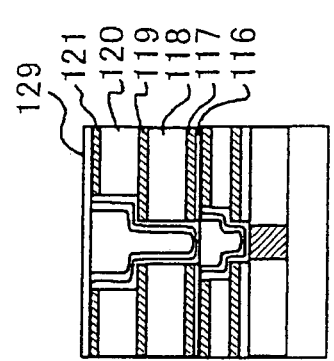

Subsequent to the washing process, a resist 124 was applied to the surface of the substrate and, by the ordinary technique of exposure to light, a wiring patter 125 was copied on the resist 124 (FIG. 13(l)). The opening parts of the hard mask 121, the Cu diffusion barrier layer 117, and the $SiO_2$ layer 116 were severally etched anisotropically, with the patterned resist 124 as a mask and the $C_4F_8/O_2/Ar$ as an etching gas. The etching conditions used here were the same as those for the hard mask 121 mentioned above, for example. Further, the interlayer-insulating film 120 was shaped anisotropically through dry etching, with the mixed $N_2/H_2$ gas as an etching gas (FIG. 13(m)). The etching conditions were the same as the etching conditions used for opening the interlayer connecting hole in the organic interlayer film 106 mentioned above. In this case, the resist 124 which had formed a trench pattern was eliminated substantially during the course of etching the interlayer insulating film 120.

Figure 13N:
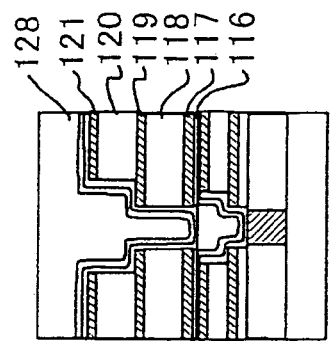
Figure 13O:
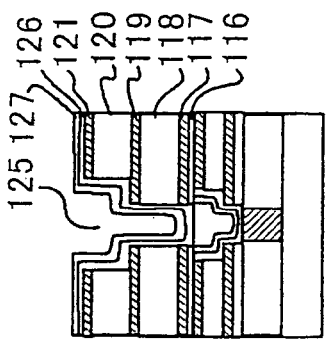

Subsequent to the surface-cleaning treatment which followed the dry etching mentioned above, a TaN/Ta film 126 was deposited as a Cu diffusion barrier layer by the sputtering technique and a seed Cu layer 127 necessary for the subsequent Cu electrolytic plating process was deposited (FIG. 13(n)). The conditions for the deposition of the TaN/Ta film 126 and the seed Cu film 127 were the same as the depositing conditions for the TaN/Ta film 113 and the seed Cu film 114 mentioned above, for example.

By the Cu electrolytic plating technique, a Cu film 128 was deposited on the surface of the resultant substrate. At this time, the part of the interlayer connecting hole (VIA) 123 and the part 125 of the groove destined to form a wiring could be buried with the Cu film 128 without leaving any gap behind (FIG. 13(o)). The conditions for the electrolytic plating of the Cu film 128 were the same as the depositing conditions for the Cu film 115 mentioned above, for example.

Subsequent to the deposition of the Cu film 128, the resultant coated substrate was given a heat treatment in an atmosphere of nitrogen ($N_2$) or argon (Ar) at a temperature in the range of 350 to 450° C. for a period in the range of 10 to 30 minutes, for example, with the object of promoting the growth of grains of the plated Cu film 128 and lowering the contact resistance of the Cu forming the first wiring layer and the Cu destined to form the filling material for the TaN/Ta layer 126, second wiring layer and interlayer connecting hole as well.

Subsequently, the excess Cu and the TaN/Ta film in the flat part of the substrate surface were removed and the substrate surface was flattened as well by the CMP technique. The conditions for the CMP were the same as the CMP conditions for the Cu film 115 mentioned above, for example. Thereafter, a capping material $SiO_2$ film 129 was deposited to cover the surface (FIG. 13(p)). The conditions for the deposition of $SiO_2$ were the same as the depositing conditions for the capping film 116 mentioned above, for example. The purpose of covering the surface with the capping material resided in preventing the surface of Cu from being oxidized and suppressing the absorption of the moisture in the air by the hard mask 121 and organic interlayer film 120. As the capping material, $Si_3N_4$, SiC and SiON, besides $SiO_2$, were found effective. The capping layer was not necessary when the next step was executed immediately.

Figure 13P:
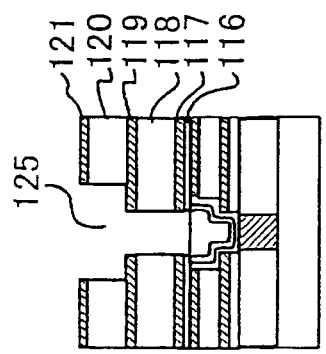

The process ranging from FIG. 13(b) through FIG. 13(p) formed two layers of multilayer interconnection having a predetermined electrical connection. The number of layers of interconnection that is necessary on the basis of design is obtained by repeating the process of FIGS. 13(b) to 13(p) up to the necessary number of layers.

The borazine polymer which was manufactured by following the procedure of Embodiment 1 while using the method of manufacture of the borazine-siloxane polymer under the "conditions 2" shown below instead was found to be similarly effective as a hard mask, an etching stopper and a Cu diffusion barrier film.

[Conditions 2]

By applying a borazine-siloxane polymer solution obtained by subjecting B,B,B-triethynyl-N,N,N-tripropynyl borazine and 1,3,5,7-tetramethyl cyclotetrasiloxane, i.e. a cyclic siloxane, to hydrosilylating polymerization with a spin coater to the silicon substrate having $SiO_2$ deposited in advance thereon and heating the resultant coated substrate at 200 to 300° C. for 10 to 60 minutes and further at 300 to 450° C. for 10 to 60 minutes, a polymer thin film of the structure of a network 100 nm in thickness was obtained. A polymer thin film of the structure of a network 100 nm in thickness was formed by performing the heat treatment at 250° C. for 30 minutes and further at 400° C. for 30 minutes. This polymer was found to have a relative dielectric constant of 2.8 as determined by the CV technique.

When the two layers of interconnection thus obtained were tested for line-to-line capacity and line-to-line leak current, the properties consequently found were both satisfactory.

By using the borazine-siloxane polymer having this small relative dielectric constant of 2.5 as a Cu diffusion barrier film, an etching stopper and a hard mark, the effective relative dielectric constant could become 2.6 as compared with the conventional structure of interconnection to enable the wiring capacity to be lowered. Consequently, the produced semiconductor device was enabled to produce a high-speed operation.

A model wiring structure using borazine-siloxane polymer in various thin film materials (hard mask (HM), etching stopper (ES) and diffusion barrier (DB)) of a low dielectric constant interlayer insulating film was presumed (FIG. 14) and tested for wiring capacity by simulation in accordance with the finite-element method to determine the effect of using the borazine-siloxane polymer as thin-film materials.

The model wiring structure was computed, based on the structure of a 65 nm technology node of a load map of ITRS2001, as possessing a wiring aspect ratio of 1.7 in wiring and 1.6 in interlayer connecting hole (Via) and 1:1 in ratio of wiring width and wiring interval. The conditions presumed are shown in Table 9.

TABLE 9

Table 9: Numerical values used in computation of effective relative dielectric constant by the infinite-element method

| Aspect ratio of wiring | Wiring part | 1.7 |
|---|---|---|
|  | Interlayer connecting hole part | 1.6 |
| Widths of wiring and spaces |  | 1:1 |
| Relative dielectric constant | Interlayer insulating film | 2.7 |
|  | Borazine polymer | 2.5, 2.8 |
|  | $SiO_2$ | 4.3 |
|  | SiC | 4.5 |
|  | $Si_3N_4$ | 7.0 |

Figure 14:
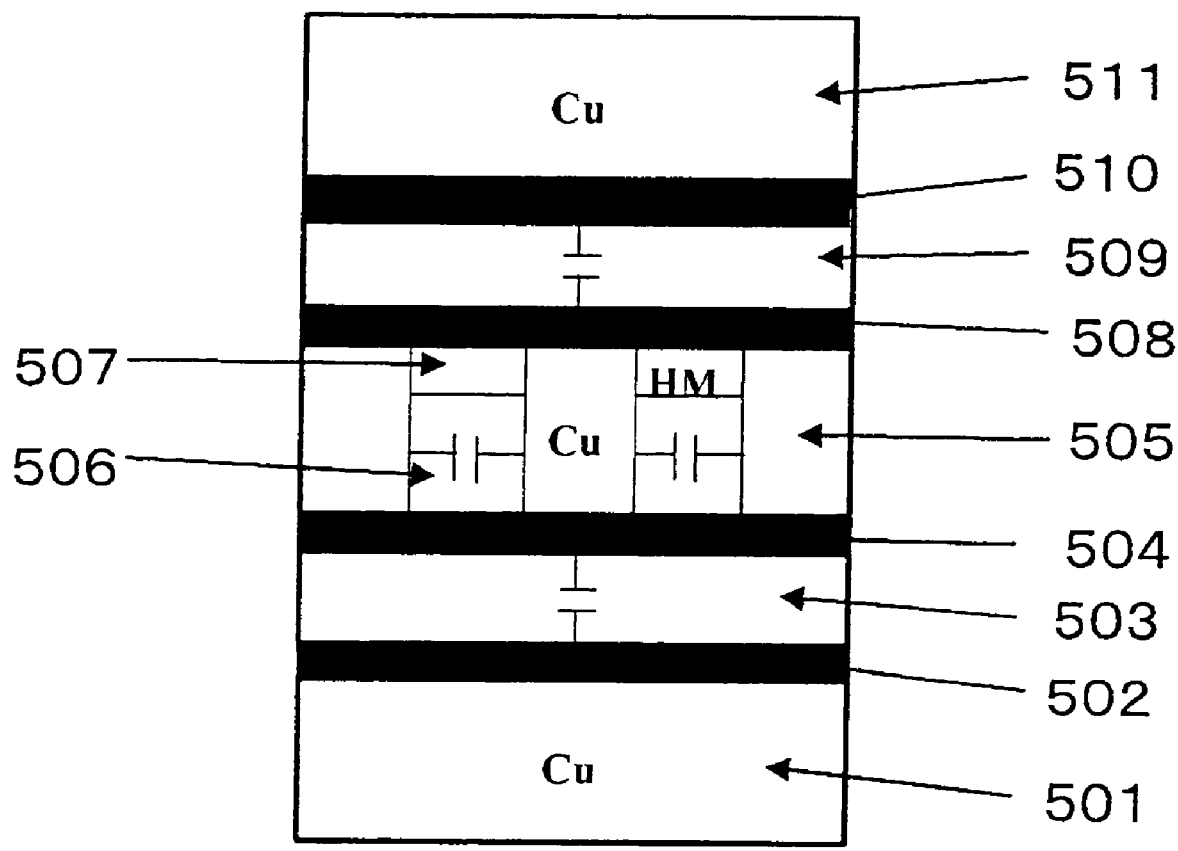
FIG. 14 is a diagram showing a model wiring structure used in the simulation of an effective dielectric constant by the finite-element method.

Borazine-siloxane polymer (computed by assuming two cases having 2.5 and 2.8 as magnitudes of relative dielectric constant), $SiO_2$ (relative dielectric constant of 4.3), SiC (relative dielectric constant of 4.5) and $SiO_2$ (relative dielectric constant of 7) individually used in a hard mask, an etching stopper and a diffusion barrier film, with an interlayer insulating film of a relative dielectric constant of 2.7 properly interposed therein, were examined to determine their effective relative dielectric constants by computation. In a special case, computation was also made when the interlayer film was formed of a borazine-siloxane polymer. The hard masks, etching stoppers and diffusion barrier films were presumed to have thickness of 25% and thickness of 10% of the thickness of the interlayer insulating film for the sake of the computation of the effective relative dielectric constant. The magnitudes found by computation are shown in Table 10. The model structure used herein is shown in FIG. 14.

TABLE 10

Table 10: Comparison (simulation) of effective dielectric constants ($K_{eff}$) of thin films of varying materials used in diffusion barrier, etching stopper and hard mask

| | Material for thin film | | | | | |
|---|---|---|---|---|---|---|
| Diffusion barrier | BSP (2.5) | BSP (2.8) | SiC | SiC | $Si_3N_4$ | $Si_3N_4$ |
| Etching stopper | BSP (2.5) | BSP (2.5) | $SiO_2$ | SiC | $Si_3N_4$ | $Si_3N_4$ |
| Hard mark | BSP (2.5) | BSP (2.5) | $SiO_2$ | SiC | $Si_3N_4$ | $Si_3N_4$ |
| Interlayer insulating film | (Relative dielectric constant = 2.7) | | | | | |
| Effective relative dielectric constant (film thickness 25%) | 2.6 | 2.7 | 3.4 | 3.5 | 3.7 | 4.4 |

TABLE 10-continued

Table 10: Comparison (simulation) of effective dielectric constants ($K_{eff}$) of thin films of varying materials used in diffusion barrier, etching stopper and hard mask

| | Material for thin film | | | | | |
|---|---|---|---|---|---|---|
| Effective relative dielectric constant (film thickness 10%) | 2.7 | 2.7 | 3.0 | 3.1 | 3.2 | 3.5 |

It is noted from Table 10 that the effective relative dielectric constant of a wiring structure using SiC in a diffusion barrier and $SiO_2$ in an etching stopper and a hard mask was 3.0, that of a wiring structure using SiC invariably in the thin film materials mentioned above was 3.1, that of a wiring structure using $Si_3N_4$ in a diffusion barrier and $SiO_2$ in an etching stopper and a hard mask was 3.2 and that of a wiring structure using $Si_3N_4$ invariably in all the thin film materials was 3.5, indicating that the effective relative dielectric constants in all the combinations invariably exceeded 3.0. When the borazine-siloxane polymer is presumed to be used in a diffusion barrier, an etching stopper and a hard mask, the effective relative dielectric constant would be 2.7, a magnitude accomplishing the target of not more than the level of 2.7 necessitated by the 65 nm technology node. This magnitude approximates the actually measured value and indicates the effectiveness of the borazine polymer in lowering the effective relative dielectric constant.

Embodiment 4

Now, an embodiment embracing the fourth characteristic of this invention is shown in FIG. 15. This diagram is a cross section of a semiconductor device representing Embodiment 4 of this invention. In this embodiment, two layers of wiring structure were manufactured through the so-called single damascene process using borazine polymers in a hard mask, an etching stopper and a diffusion barrier film.

A silicon (Si) substrate 201 was separated into elements and fabricated in accordance with a predetermined circuit design to form an active device, such as a transistor. The active device, after having a BPSG/CVD-$SiO_2$ (202) deposited thereon, connecting holes 203 opened therein for electrical connection and a local wiring formed therein and the connecting holes filled with tungsten (W), for example, was treated by the chemical mechanical polishing (CMP) method to have the surface thereof flattened. Denoted by 203 in the diagram (FIG. 15(a)) are the connecting holes that were buried with W. This diagram corresponds to FIG. 13(i) that was shown in Embodiment 1 mentioned above. The method for forming the first wiring layer was explained in Embodiment 1 mentioned above. FIG. 15(a) omits depicting details, such as a transistor for the sake of simplicity.

Similarly to the aforementioned Embodiment, FIG. 15(a) illustrates a structure comprising a plasma CVD-$SiO_2$ (204), a borazine-siloxane polymer (205), a SiLK film (206), a borazine-siloxane polymer film (207) as a hard mask, a photoresist (208), a photoresist (209) having the pattern shape of a connecting hole copied thereon, a connecting hole pattern (210) for permitting electrical connection and a photoresist (211).

Thereafter, a borazine-siloxane polymer 212 was deposited in a thickness of 100 to 200 nm. The borazine-siloxane polymer 212 was deposited under [conditions 1] or [conditions 2].

Further thereon, a SiLK (R) film 213 was deposited as an organic interlayer film in a thickness of 400 to 600 nm and a borazine-siloxand polymer film 214 was deposited as a hard mask in a thickness of 100 to 200 nm under [conditions 1] or [conditions 2]. Then, a product called a SiLK (R), for example, was deposited as an organic interlayer insulating film under the same depositing conditions as those used for the interlayer insulating film 106 of Embodiment 1 mentioned above. A resist 215 was deposited in a thickness of 200 to 300 nm and a resist pattern having copied thereon a connecting hole pattern 216 for permitting electrical connection was formed in a width of 150 to 200 nm by the ordinary development resorting to exposure to light (FIG. 15(b)).

Then, the hard mask 214 was shaped by dry etching to form thereon a connecting hole pattern 216 having a diameter of 150 to 200 nm, with the resist pattern as a mask and $C_4F_8$/$O_2$/Ar as an etching gas. The etching conditions for the hard mask 214 were the same as the etching conditions for the hard mask 107 used in Embodiment 1. Further, the organic interlayer insulating film 213 was shaped through dry etching, with $N_2$/$H_2$ as an etching gas, to form a wiring hole. The etching conditions for the organic interlayer insulating film 213 were the same as the etching conditions for the interlayer insulating film 106 used in Embodiment 1 mentioned above. The diffusion barrier 212 was shaped through dry etching, with the $C_4F_8$/$O_2$/Ar again used as an etching gas, to form a connecting-hole pattern in the diffusion barrier 212. The $SiO_2$ (211) was continuously shaped. Consequently, a connecting hole 217 for permitting electrical connection was formed and the surface of the W that had buried the connecting hole 203 in the lower layer was exposed. At this time, the resist 215 was gradually etched during the course of etching the hard mask 214, interlayer insulating film 213, diffusion barrier 212 and $SiO_2$ (211). It was substantially eliminated (FIG. 15(c)) eventually.

Thereafter, the resist 215 still remaining was removed and the surface formed by dry etching was subjected to a cleaning treatment. Then, a TaN/Ta layer 218 was deposited as a Cu diffusion barrier layer on the cleaned surface by the sputtering technique and a Cu seed layer 219 was deposited in preparation for the electrolytic plating of Cu at the next step.

On the resultant surface of the substrate, a Cu thin film 220 was deposited by the electrolytic plating technique. At this time, the part of the hole destined to form an interlayer connecting hole (VIA) could be buried with copper 220 without leaving any gap behind (FIG. 15(d)). After the Cu (220) had been deposited, the resultant coated substrate was subjected to a heat treatment in an atmosphere of nitrogen ($N_2$) or argon (Ar) at a temperature in the range of 350 to 450° C. for a period in the range of 10 to 30 minutes, for example, with the object of promoting the growth of grains of the plated Cu and lowering the contact resistance between the W as a filler for the lower layer connecting hole and TaN/Ta and between the W and Cu as well.

Thereafter, the excess Cu and the TaN/Ta adhering to the flat part of the surface of the substrate were removed and the surface of the substrate was flattened by the CMP technique. A capping material $SiO_2$ (221) was deposited to cover the surface of the substrate (FIG. 15(e)). The depositing conditions for the $SiO_2$ were the same as the depositing conditions for the capping film 116 used in Embodiment 1 mentioned above. The purpose of covering the surface with the capping material resided in preventing the surface of the deposited Cu (220) from being oxidized and suppressing the absorption of the moisture in the air by the hard mask 214 and the organic interlayer film 213. As the capping material used for this purpose, $Si_3N_4$, SiC and SiON, besides $SiO_2$, were found effective. The capping layer was not necessary when the next step was executed immediately. As a result, the interlayer connecting hole buried with Cu was formed.

Then, the process for producing a second Cu wiring as an upper layer wiring was to be initiated. As the first step, a borazine-siloxane polymer 222 was deposited in a thickness of 100 to 200 nm. The borazine-siloxane polymer 222 was deposited under [conditions 1] or [conditions 2].

A SiLK film 223 was deposited thereon as an organic interlayer film in a thickness of 400 to 600 nm. The depositing conditions of the SiLK (R) were the same as the depositing conditions for the organic interlayer insulating film 213 mentioned above. A borazine-siloxane polymer film 224 was further deposited as a hard mask in a thickness of 100 to 200 nm under [conditions 1] or [conditions 2]. Further, a resist 225 was deposited thereon in a thickness of 200 to 300 nm and a resist pattern 226 of a pattern shape for the second wiring layer was formed by the ordinary development resorting to the exposure to light (FIG. 15(f)).

The hard mask 224 was shaped by dry etching, with the patterned resist 225 as a mask and the $C_4F_8/O_2/Ar$ as an etching gas, and the connecting hole pattern 226 for electrical connection with the interlayer connecting hole 220 was copied to the hard mask 224. The etching conditions for the hard mask 224 were the same as the etching conditions for the hard mark 121 used in Embodiment 1 mentioned above. Further the organic interlayer-insulating film 223 was shaped through dry etching, with $N_2/H_2$ as an etching gas, to form the connecting hole pattern 226 for permitting electrical connection (FIG. 15(g)). The etching conditions for the organic interlayer film 223 were the same as the etching conditions for the aforementioned interlayer insulating film 213. At this time, the resist 225 was eliminated substantially during the course of etching the interlayer film 223.

Figure 15D:
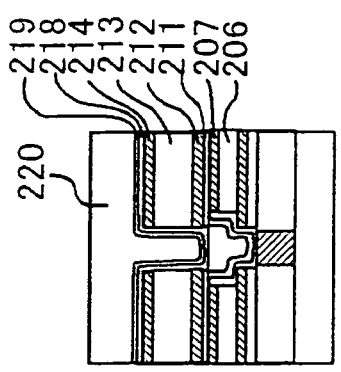
FIG. 15(a)-(j) illustrate schematic cross sections of exemplary aspects of the fourth embodiment of this invention.
Figure 15H:
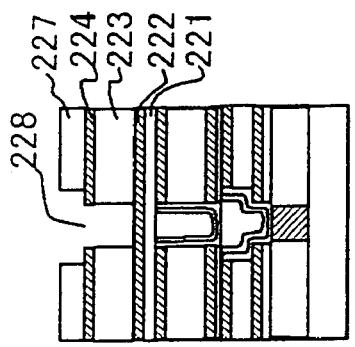
Figure 15C:
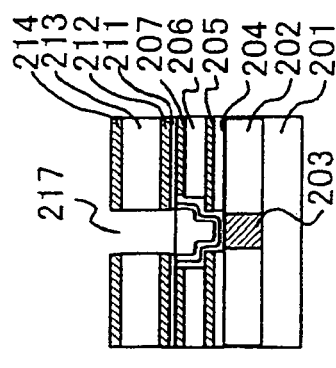
Figure 15G:
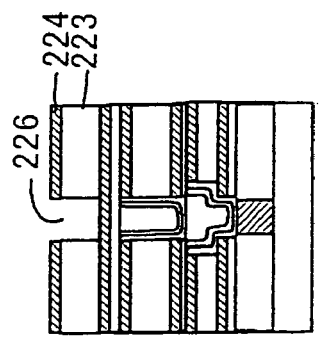
Figure 15B:
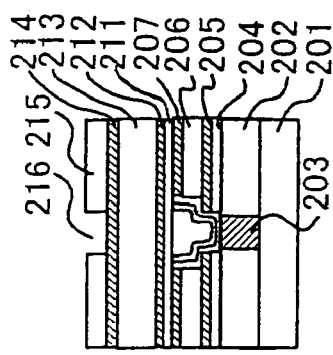
Figure 15F:
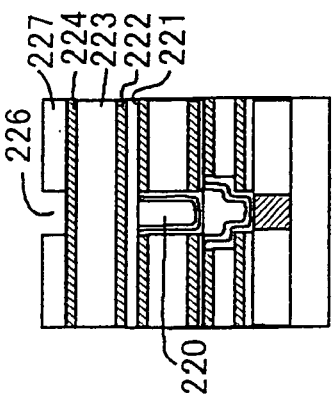
Figure 15A:
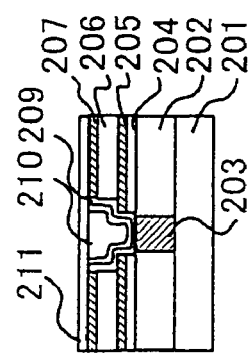
Figure 15E:
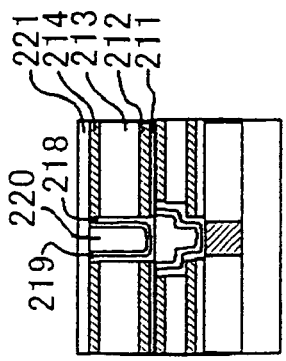
Figure 15J:
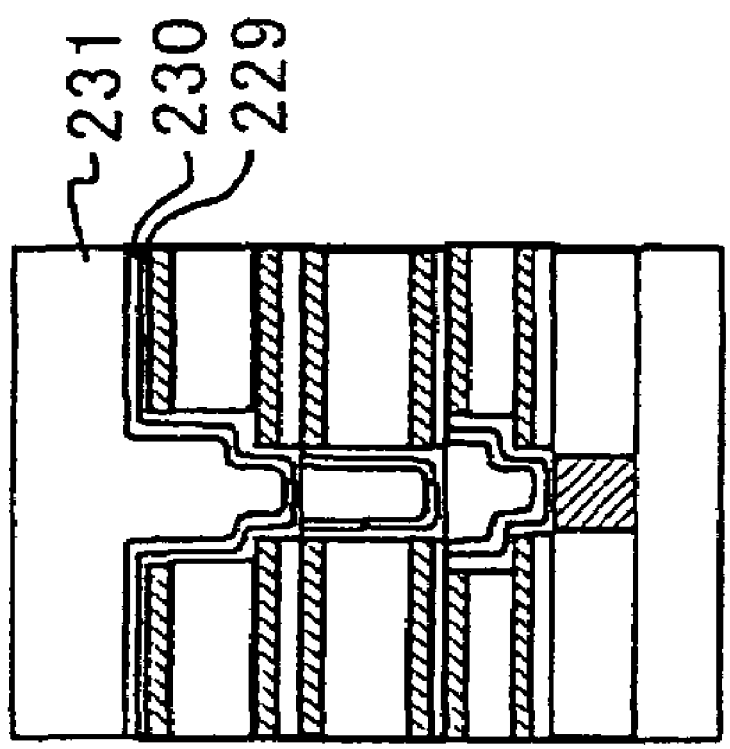
Figure 15I:
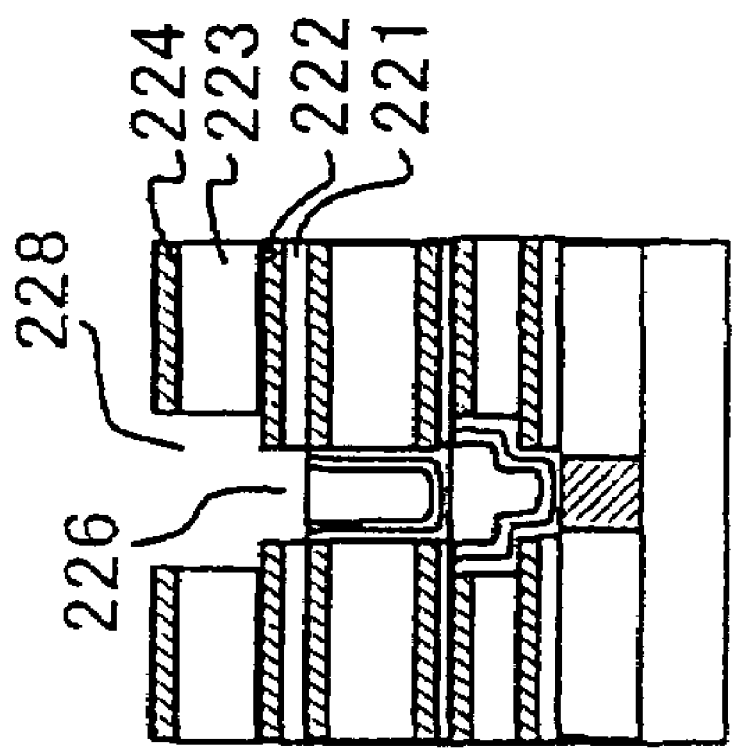
Figure 16L:
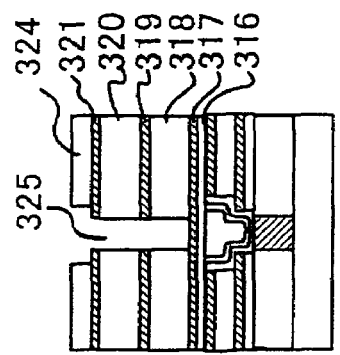
FIG. 16(a)-(p) illustrate schematic cross sections of exemplary aspects of the fifth embodiment of this invention.
Figure 16J:
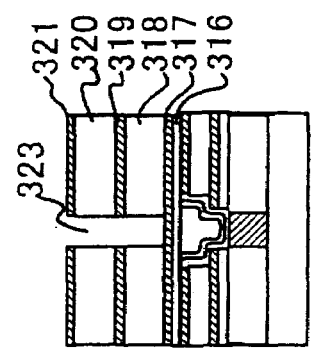
Figure 16K:
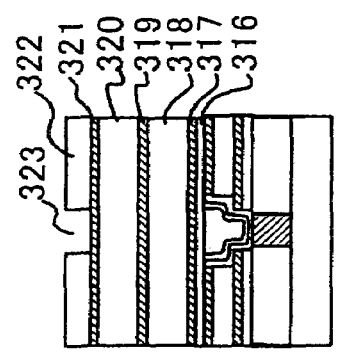
Figure 16I:
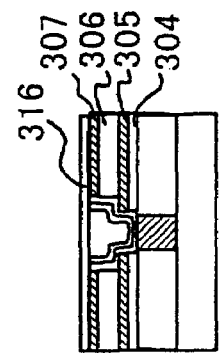
Figure 16P:
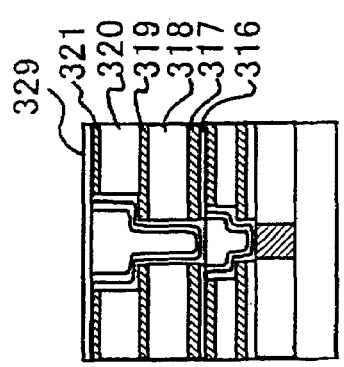
Figure 16O:
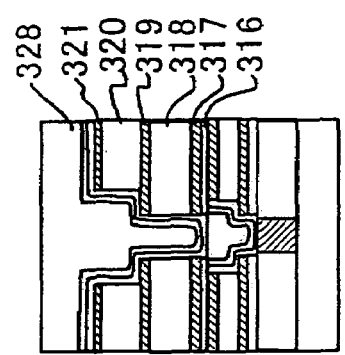
Figure 16N:
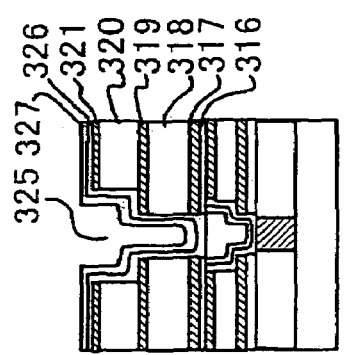
Figure 16M:
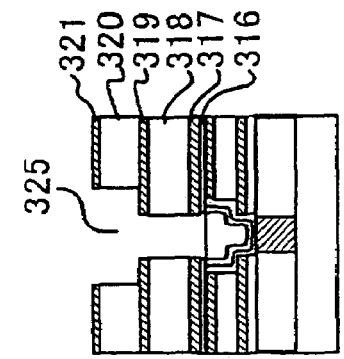

Then, a resist 227 was deposited in a thickness of 200 to 300 nm and a resist pattern 228 of a pattern shape for the second wiring layer was formed by the ordinary development resorting to the exposure to light (FIG. 15(h)).

The hard mask 224 and the exposed parts of the diffusion barrier 222 and the $SiO_2$ (221) were shaped through dry etching, with the $C_4F_8/O_2/Ar$ as an etching gas. The etching conditions herein were the same as those for the hard mask 224. Further, the interlayer insulating film 223 was shaped through dry etching, with the $N_2/H_2$ as an etching gas (FIG. 15(h)). The etching conditions for the interlayer film 223 were the same as the etching conditions for the organic interlayer film 213. At this time, the resist 227 was gradually etched during the course terminating in the step of etching the interlayer insulating film 223. It was eliminated substantially eventually.

Then, the surface that had undergone the dry etching was given a cleaning treatment. On the cleaned surface of the substrate, a TaN/Ta film 229 was deposited as a Cu diffusion barrier layer by the sputtering technique and a seed layer Cu (230) was deposited in preparation for the electrolytic plating of Cu at the next step.

In consequence of this electrolytic plating of Cu, a Cu film 231 was deposited on the resultant surface of the substrate. At this time, the part 228 of the groove destined to form a second wiring layer could be buried with the Cu film 231 without leaving any gap behind (FIG. 15(j)). Subsequent to the deposition of the Cu film 231, the resultant coated substrate was subjected to a heat treatment in an atmosphere of nitrogen ($N_2$) or argon (Ar) at a temperature in the range of 300 to 450° C. for a period in the range of 10 to 30 minutes, for example, with the object of promoting the growth of grains of the plated Cu and lowering the contact resistance between the Cu as the filler for the lower layer connecting hole 220 and the barrier metal TaN/Ta layer 229 and between the Cu and the seed Cu layer 230 as well.

Subsequently, the excess Cu and the TaN/Ta film adhering to the flat part of the surface of the substrate were removed and the surface of the substrate was flattened by the CMP technique. Thereafter, a capping material $SiO_2$ film 232 was deposited to cover the surface of the substrate (FIG. 15(k)). The depositing conditions for the capping material $SiO_2$ film 232 were the same as the depositing conditions for the capping material 116 used in Embodiment 1. The purpose of covering the surface with the capping material resided in preventing the surface of the Cu from being oxidized and suppressing the absorption of the moisture in the air by the hard mask 224 and the organic interlayer film 223. As the capping material used for this purpose, $Si_3N_4$, SiC and SiON, besides $SiO_2$, were found effective. The capping layer was not necessary when the next step was executed immediately. As a result, the Cu wiring for the second layer was formed, and the first wiring layer, the interlayer connecting hole and the second wiring layer which were satisfactory for the purpose of electrical connection could be formed. In the present Embodiment, the structure finally obtained had a borazine-siloxane polymer in the upper and lower interfaces of the first interlayer insulating film forming the first wiring layer, in the upper and lower interfaces of the second interlayer insulating film forming the interlayer connecting hole and in the upper and lower interfaces of the third interlayer insulating film forming the second wiring layer. The multilayer interconnection in the necessary number of wiring layers could be realized by repeating the procedure depicted in FIG. 15.

Embodiment 5

FIG. 16 is a cross section of a semiconductor device according to Embodiment 5 of this invention. By this Embodiment, it was found that even in the case of an inorganic $SiO_2$ low dielectric constant interlayer insulating film, the borazine polymer functioned as a hard mask, an etching stopper and a Cu diffusion barrier layer and exhibited a low relative dielectric constant of 2.2 to 2.8, a magnitude smaller than the conventional material.

A silicon (Si) substrate 301 was separated into elements and fabricated in accordance with a predetermined circuit design to form an active device, such as a transistor. The active device, after having a BPSG/CVD-$SiO_2$ (302) deposited thereon, connecting holes 303 opened therein for electrical connection and a local wiring formed therein and the connecting holes filled with tungsten (W), for example, was treated by the chemical mechanical polishing (CMP) method to have the surface thereof flattened. Denoted by 303 in the diagram (FIG. 16(a)) are the connecting holes that were buried with W.

FIG. 16(a) omits depicting details, such as a transistor, for the sake of simplicity. Further, the following explanation will be made with reference to the magnified diagram of part B of FIG. 16(a). This invention is not limited to the process of wiring which is aimed at permitting electrical connection with the contact hole. It can be applied to all the processes of the so-called multilayer interconnection which follows the formation of the local wiring (the so-called MO wiring) connected to the gate electrode as the center by the use of a wiring material, such as W.

Then, a $SiO_2$ (304) was deposited in a thickness of 50 to 100 nm and a borazine-silicane polymer 305 was deposited in a thickness of 100 to 200 nm on the resultant substrate by the plasma CVD. The depositing conditions for the $SiO_2$ (304)

were the same as the depositing conditions for the SiO$_2$ film 104 in Embodiment 1, for example. These depositing conditions for the SiO$_2$ (304) were standard conditions generally employed at mass-producing shops. This invention is not swayed by the depositing conditions of SiO$_2$ (304).

The borazine-siloxane polymer 305 was deposited under [conditions 1] or [conditions 2] described in detail in relation to Embodiment 1. When the borazine-siloxane polymer thin film formed under these conditions was manufactured into a separate MOS diode structure, the relative dielectric constant of this diode structure determined based on the capacity-voltage (CV) characteristic thereof was found to be 2.2 to 2.8.

An MSQ film 306, i.e. the so-called low dielectric constant insulating film, was deposited thereon in a thickness of 400 to 600 nm as a first interlayer insulating film. The MSQ film 306 was deposited by applying the polymer on a wafer with a spin coater operated at a rotational frequency of 1000 rpm for a period of 30 seconds, drying the deposited coat at 150 to 250° C. to expel the solvent and heating it at 400 to 450° C. for 30 minutes till a thin film was formed. A borazine-siloxane polymer film 307 was deposited in a thickness of 100 to 200 nm as a hard mask or a Cu diffusion barrier layer under [conditions 1] or [conditions 2]. Further, a resist 308 was deposited in a thickness of 200 to 300 nm and a resist pattern 309 of a pattern shape was formed by the ordinary development resorting to exposure to light (FIG. 16(b)).

The hard mask 307 was shaped by dry etching, with the patterned resist 308 as a mask and the C$_4$F$_8$/O$_2$/Ar as an etching gas, and the connecting hole pattern 309 for permitting electrical connection with the connecting hole 303 was copied onto the hard mask 307. The etching conditions for the hard mask were the same as the etching conditions for the hard mask 107 described in Embodiment 1. This invention does not need to be limited to these etching conditions. Further, the interlayer insulating film 306 was shaped by dry etching to form a connecting hole pattern 310 intended to permit electrical connection (FIG. 16(c)).

Then, a resist 311 was deposited in a thickness of 200 to 300 nm, and a resist pattern 312 of a wiring pattern shape for the first wiring layer was formed by the ordinary development resorting to the exposure to light (FIG. 16(d)).

Then, the hard mask 307, diffusion barrier 305 and exposed parts of the SiO$_2$ (304) were simultaneously shaped through dry etching, with the C$_4$F$_{8/O2}$/Ar as an etching gas. The etching conditions herein were the same as those for the hard mask 307 mentioned above, for example (FIG. 16(e)). Further, the interlayer insulating film 306 was shaped through dry etching, with the same gas as an etching gas (FIG. 16(f)).

Then, the resist 311 was removed by ashing to give the surface resulting from the dry etching a cleaning treatment. Further, a TaN/Ta film 313 was deposited by the sputtering technique as a Cu diffusion barrier layer, and a seed layer Cu (314) was deposited therein in preparation for the electrolytic plating of Cu at the next step (FIG. 16(g)).

Then, on the resultant surface of the substrate, a Cu film 315 was deposited by the Cu electrolytic plating technique. At this time, the part 312 of the groove destined to form the first layer wiring could be buried with the Cu film 315 without leaving any gap behind (FIG. 16(h)). Subsequent to the deposition of the Cu film 315, the resultant substrate was subjected to a heat treatment performed in an atmosphere of nitrogen (N$_2$) or argon (Ar) at a temperature in the range of 300 to 450° C. for a period in the range of 10 to 30 minutes, for example, with the object of promoting the growth of grains of the plated Cu film 315 and lowering the contact resistance between the W as the filler for the lower layer connecting hole 303 and the barrier metal TaN/Ta layer 313 and between the W and the Cu film 315 as well.

Subsequently, the excess Cu and the TaN/Ta film adhering to the flat part of the surface of the substrate were removed and the surface of the substrate was flattened by the CMP technique. Thereafter, a capping material SiO$_2$ film 316 was deposited to cover the surface of the substrate (FIG. 16(i)). The depositing conditions for the capping material SiO$_2$ film 316 were the same as the depositing conditions for the capping material 116 used in Embodiment 1. The purpose of covering the surface with the capping material resided in preventing the surface of the Cu from being oxidized and suppressing the absorption of the moisture in the air by the hard mask 307 and the organic interlayer film 306. As the capping material used for this purpose, Si$_3$N$_4$, SiC and SiON, besides SiO$_2$, were found effective. The capping layer was not necessary when the next step was executed immediately. As a result, the Cu wiring for the first layer was formed.

Then, a borazine-siloxane polymer 317 was deposited on the resultant substrate in a thickness of 100 to 200 nm under [conditions 1] or [conditions 2]. An MSQ layer 318 as an interlayer insulating film for forming an interlayer connecting hole was deposited in a thickness of 400 to 600 nm, and a borazine-siloxane polymer film 319 was deposited in a thickness of 100 to 200 nm as an etching stopper under [conditions 1] or [conditions 2]. Further, an MSQ film 320 as an interlayer insulating film for forming a second wiring layer was deposited in a thickness of 400 to 600 nm. The depositing conditions for the interlayer films 318 and 320 were the same as the depositing conditions for the interlayer film 306 of the first layer. Further, a hard mask and a borazine-siloxane polymer film 321 of a thickness of 100 to 200 nm as a Cu diffusion barrier film were deposited thereon under [conditions 1] or [conditions 2], and a resist 322 was deposited in a thickness of 200 to 300 nm. A resist pattern 323 of an interlayer connecting hole form having a diameter of 150 to 200 nm was formed by the ordinary development resorting to the exposure to light (FIG. 16(j)).

Then, a hard mask 321 was shaped by dry etching, with the patterned resist 322 as a mask and the C$_4$F$_8$/O$_2$/Ar as an etching gas, and an interlayer connecting hole (VIA) pattern 323 having a diameter of 150 to 200 nm was copied onto the hard mask 321. The etching conditions for the hard mask 321 were the same as the etching conditions for the hard mask 107 described in Embodiment 1. Further, the interlayer insulating film 320 was shaped through dry etching to form an interlayer connection hole (VIA).

Subsequently, the etching stopper 319 was shaped through dry etching, with the C$_4$F$_8$/O$_2$/Ar as an etching gas, for example. The dry etching conditions herein were the same as the etching conditions for the hard mask 321. The interlayer insulating film 318 was also shaped through dry etching (FIG. 16(k)). The etching conditions for the interlayer film 318 were the same as the etching conditions for the organic interlayer film 320. At this time, the resist 322 was gradually etched during the course of etching the interlayer insulating film 320, etching stopper 319 and interlayer insulating film 318. It was substantially eliminated eventually.

Then, the resist was removed by ashing and the remaining surface was given a cleaning treatment. A resist 324 was applied to the cleaned surface and a second wiring pattern 325 was copied to the resist 324 (FIG. 16(l)). The hard mask 321 was shaped through dry etching and the opening parts of the Cu diffusion barrier layer 317 and SiO$_2$ layer 316 were respectively shaped by anisotropic etching, with the patterned resist 324 as a mask and the C$_4$F$_8$/O$_2$/Ar as an etching gas.

The etching conditions were the same as the etching conditions for the hard mask 321, for example. Further, the interlayer insulating film 320 was anisotropically shaped through dry etching (FIG. 16(m)). The etching conditions were the same as the etching conditions for opening the interlayer-connecting hole in the interlayer film 320.

Then, the resist 324 was removed by ashing, and the surface remaining after dry etching was given a cleaning treatment. Subsequently, a TaN/Ta film 326 was deposited as a Cu diffusion barrier layer by the sputtering technique, and a seed Cu layer 327 for the electrolytic plating of Cu at the next step was deposited (FIG. 16(n)). The depositing conditions for the TaN/Ta film 326 and the seed Cu film 327 were the same as the depositing conditions for the TaN/Ta film 313 and seed Cu film 314, for example.

A Cu film 328 was deposited on the resultant surface of the substrate by the Cu electrolytic plating technique. At this time, the part of the interlayer connecting hole (VIA) 323 and the part 325 of the groove destined to form the wiring could be both buried with the Cu film 328 without leaving any gap behind (FIG. 16(o)). The electrolytic plating conditions for the Cu film 128 were the same as the depositing conditions for the Cu film 315, for example.

Subsequent to the deposition of the Cu film 328, the resultant substrate was subjected to a heat treatment performed in an atmosphere of nitrogen ($N_2$) or argon (Ar) at a temperature in the range of 350 to 450° C. for a period in the range of 10 to 30 minutes, for example, with the object of promoting the growth of grains of the plated Cu film 328 and lowering the contact resistance between the Cu forming the first wiring layer and the TaN/Ta layer 326, between the Cu and the second wiring layer and between the Cu and the Cu destined to serve as the filler for the interlayer connecting hole.

Subsequently, the excess Cu and the TaN/Ta layer adhering to the flat part of the surface of the substrate were removed and the surface of the substrate was flattened by the CMP technique. The conditions for the CMP were the same as the CMP conditions for the Cu film 315, for example. Thereafter, a capping material $SiO_2$ film 329 was deposited to cover the surface of the substrate (FIG. 16(p)). The depositing conditions for the $SiO_2$ were the same as the depositing conditions for the capping film 316, for example. The purpose of covering the surface with the capping material resided in preventing the surface of the Cu from being oxidized and suppressing the absorption of the moisture in the air by the hard mask 321 and the low dielectric constant interlayer insulating film 320. As the capping material used for this purpose, $Si_3N_4$, SiC and SiON, besides $SiO_2$, were found effective. The capping layer was not necessary when the next step was executed immediately.

When the two layers of wiring structure thus formed were tested for line-to-line capacity and line-to-line leak current, they manifested satisfactory properties.

The borazine-siloxane polymer, i.e. a $SiO_2$-based MSQ insulating film, functioned as a low dielectric constant interlayer insulating film effectively in a hard mask, an etching stopper and a Cu diffusion barrier film and manifested such a small relative dielectric constant as 2.2 to 2.8. Thus, it exhibited an excellent characteristic of shunning largely increasing the effective relative dielectric constant of the two-layer wiring structure as compared with the conventional $SiO_2$, SiC and $Si_3N_4$. Thus, it enabled a semiconductor device to produce a high-speed operation. Naturally, the procedure demonstrated in this Embodiment would allow realization of multilayer interconnection with a necessary number of wiring layers by repeating the procedure.

Embodiment 6

FIG. 17 is a cross section of a semiconductor device representing Embodiment 6 of this invention. This Embodiment demonstrated that the borazine polymer would function as a low dielectric constant interlayer insulating film.

A silicon (Si) substrate 401 was separated into elements and fabricated in accordance with a predetermined circuit design to form an active device, such as a transistor. The active device, after having a BPSG/CVD-$SiO_2$ (402) deposited thereon, connecting holes 403 opened therein for electrical connection and a local wiring formed therein and the connecting holes filled with tungsten (W), for example, was treated by the chemical mechanical polishing (CMP) method to have the surface thereof flattened. Denoted by 403 in the diagram (FIG. 17(a)) are the connecting holes that were buried with tungsten.

FIG. 17(a) avoids depicting details, such as a transistor, for the sake of simplicity. Further, the following explanation will be made with reference to a magnified diagram of C part of FIG. 17(a). This invention is not limited to the process of wiring which is aimed at permitting electrical connection with the contact hole. It can be applied to all the processes of the so-called multilayer interconnection which follows the formation of the local wiring (the so-called MO wiring) connected to the gate electrode as the center by the use of a wiring material, such as W.

Then, SiC (404) was deposited in a thickness of 50 to 100 nm and a borazine-siloxane polymer 405 was deposited in a thickness of 250 to 350 nm on the resultant surface of the substrate by the plasma CVD. These depositing conditions for the $SiO_2$ (404) were standard conditions generally employed at shops. This invention is not swayed by the depositing conditions for the $SiO_2$ (404).

The borazine-siloxane polymer 405 was deposited under [conditions 1] or [conditions 2] which were described in detail in relation to Embodiment 1 above. When the borazine-siloxane polymer thin film formed under these conditions was manufactured into a separate MOS diode structure, the relative dielectric constant of this diode structure determined based on the capacity-voltage (CV) characteristic thereof was found to be 1.8 to 2.8. A SiC film 406 was deposited thereon as a hard mask in a thickness of 50 to 100 nm. Further, a resist 407 was deposited in a thickness of 200 to 300 nm and a resist pattern 408 of a pattern shape of the connecting hole 403 was formed by the ordinary development resorting to the exposure to light (FIG. 17(b)).

With the patterned resist 407 as a mask and the $C_4F_8/O_2$/Ar as an etching gas, the hard mask 407 was shaped by dry etching, and the connecting hole pattern for permitting electrical connection to the connecting hole 403 was copied onto the hard mask 407. This invention is not limited to these etching conditions. Further, the interlayer insulating film 405 was shaped through dry etching to form a connecting-hole pattern 409 for permitting electrical connection (FIG. 17(c)). The resist was removed by ashing and the resultant surface of the substrate was given a cleaning treatment.

Then, a resist 510 was deposited in a thickness of 200 to 300 nm and a resist pattern 411 of a wiring pattern shape for the first layer wiring was formed by the ordinary development resorting to the exposure to light (FIG. 17(d)).

Then, the hard mask 406 was shaped through dry etching, with the $C_4F_8/O_2$/Ar as an etching gas (FIG. 17(e)). Subsequently, the exposed parts of the borazine polymer interlayer film 405 and the SiC film 404 were simultaneously shaped (FIG. 17(e)).

The resist 410 was then removed by ashing and the surface of the substrate that had undergone the dry etching was given a cleaning treatment (FIG. 17(f)). Further, a TaN/Ta film 412 was deposited as a Cu diffusion barrier layer by the sputtering technique and a seed Cu film 413 was deposited in preparation for the electrolytic plating of Cu at the next step.

Then, a Cu film 414 was deposited on the resultant surface of the substrate. At this time, the part 411 of the groove destined to form the first layer wiring could be buried with the Cu film 414 without leaving a gap behind (FIG. 17(g)).

Subsequent to the deposition of the Cu film 414, the resultant substrate was subjected to a heat treatment performed in an atmosphere of nitrogen ($N_2$) or argon (Ar) at a temperature in the range of 300 to 450° C. for a period in the range of 10 to 30 minutes, for example, with the object of promoting the growth of grains of the plated Cu film 414 and lowering the contact resistance between the W as the filler for the lower layer connecting hole 403 and the barrier metal TaN/Ta layer 412 and between the W and the Cu film 414.

Subsequently, the excess Cu and the TaN/Ta film adhering to the flat part of the surface of the substrate were removed and the surface of the substrate was flattened by the CMP technique. Thereafter, a capping SiC film 415 was deposited to cover the surface (FIG. 15(h)). The purpose of covering the surface with the capping material resided in preventing the surface of the Cu from being oxidized and suppressing the absorption of the moisture in the air by the hard mask 406 and the organic interlayer film 405. As the capping material used for this purpose, $Si_3N_4$, SiC and SiON, besides $SiO_2$, were found effective. Consequently, the Cu wiring for the first layer was formed.

Then, a borazine-siloxane polymer 416 was deposited on the resultant substrate in a thickness of 250 to 350 nm as the second interlayer insulating film for forming the interlayer connecting hole under [conditions 1] or [conditions 2]. Further, a SiC film 417 was deposited as an etching stopper in a thickness of 50 to 150 nm. A borazine polymer film 418 was deposited in a thickness of 250 to 350 nm as an interlayer insulating film for forming the second wiring layer. The depositing conditions for the interlayer films 416 and 418 were [conditions 1] or [conditions 2]. Further, a SiC film 419 was deposited thereon in a thickness of 50 to 150 nm as a hard mask. Next, a resist 520 was deposited in a thickness of 200 to 300 nm. A resist pattern 521 of an interlayer connecting hole (VIA) shape having a diameter of 100 to 120 nm was formed by the ordinary development resorting to the exposure to light (FIG. 17(i)).

Then, with the patterned resist 520 as a mask and the $C_4F_8/O_2/Ar$ as an etching gas, the hard mask 520 was shaped through dry etching. Subsequently, the interlayer insulating film 418 was shaped through dry etching (FIG. 17(j)). The resist was removed by ashing and the resultant surface of the substrate was given a washing treatment. A resist 522 was applied and a second wiring pattern 523 was copied to the resist 522 by the ordinary light exposure technique (FIG. 17(k)).

Figure 17L:
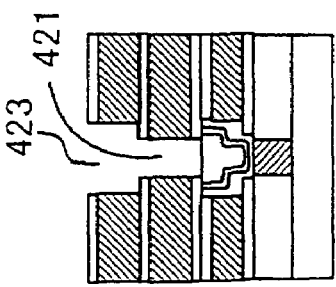
FIG. 17(a)-(n) illustrate schematic cross sections of exemplary aspects of the sixth embodiment of this invention.
Figure 17K:
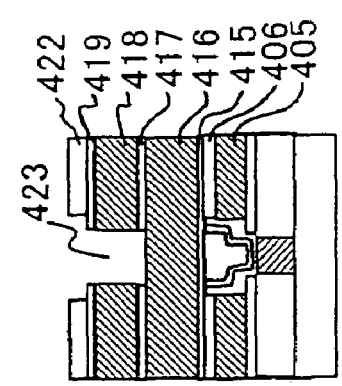
Figure 17J:
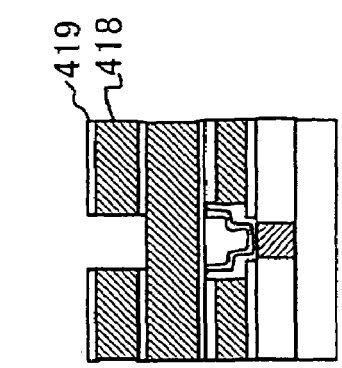
Figure 17I:
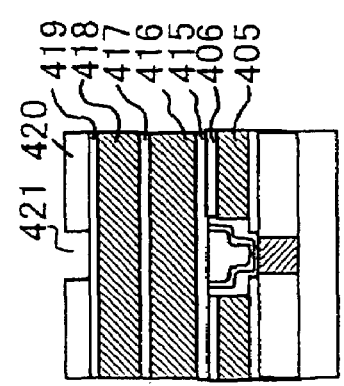
Figure 17N:
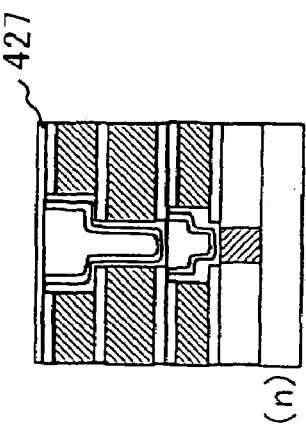
Figure 17M:
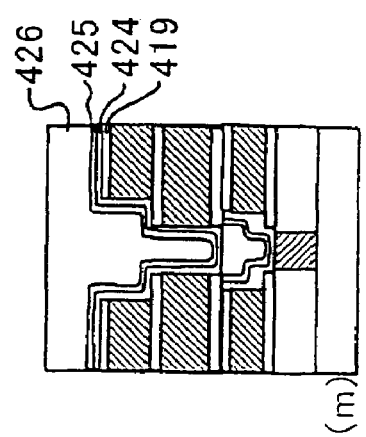

The hard mask 419 and the opening parts of the etching stopper 417 and the interlayer insulating films 418 and 416 were respectively shaped by anisotropic etching, with the patterned resist 523 as a mask and the $C_4F_8/O_2/Ar$ as an etching gas, for example (FIG. 17(l)).

Then, the resist 522 was removed by ashing and the surface of the substrate that had undergone the dry etching was given a cleaning treatment. Subsequently, a TaN/Ta film 524 was deposited as a Cu diffusion barrier layer by the sputtering technique and a seed Cu layer 525 was deposited in preparation for the electrolytic plating of Cu at the next step.

A Cu film 526 was deposited on the resultant surface of the substrate by the Cu electrolytic plating technique. At this time, the part of the interlayer connecting hole (VIA) 521 and the part 523 of the groove destined to form the wiring both could be buried with the Cu film 526 without leaving a gap behind (FIG. 17(m)). The electrolytic plating conditions for the Cu film 256 were the same as the depositing conditions for the Cu film 414, for example.

Subsequent to the deposition of the Cu film 526, the resultant substrate was subjected to a heat treatment performed in an atmosphere of nitrogen ($N_2$) or argon (Ar) at a temperature in the range of 350 to 450° C. for a period in the range of 10 to 30 minutes, for example, with the object of promoting the growth of grains of the plated Cu film 526 and lowering the contact resistance between the Cu forming the first wiring layer and the TaN/Ta film 524 and between the Cu and the Cu destined to serve as the filler for the second wiring layer and the interlayer connecting hole.

Subsequently, the excess Cu and the TaN/Ta film adhering to the flat part of the surface of the substrate were removed and the surface of the substrate was flattened by the CMP technique. The CMP conditions were the same as the CMP conditions for the Cu film 414. Thereafter, a capping SiC film 527 was deposited to cover the surface (FIG. 17(n)). The depositing conditions for SiC were the same as the depositing conditions for the capping film 415. The purpose of covering the surface with the capping material resided in preventing the surface of the Cu from being oxidized and suppressing the absorption of the moisture in the air by the hard mask 419 and the low dielectric constant interlayer insulating film 418. As the capping material used for this purpose, $Si_3N_4$, SiC and SiON, besides $SiO_2$, were found effective. The capping layer was not necessary when the subsequent step was executed immediately.

When the two layers of wiring structure thus formed were tested for line-to-line capacity and line-to-line leak current, they manifested satisfactory properties.

The borazine-siloxane polymer functioned as a low dielectric constant interlayer insulating film and manifested a small relative dielectric constant, such as 1.8 to 2.8 and, even when it was combined with a hard mask and an etching stopper of the conventional SiC, $SiO_2$ or $Si_3N_4$, exhibited an excellent characteristic of shunning largely increasing the effective relative dielectric constant of the two-layer wiring structure and, consequently, enabled a semiconductor device to produce a high-speed operation. Further, the multilayer interconnection may be formed in a necessary number of wiring layers by repeating the procedure demonstrated in the present Embodiment.

Embodiment 7

Now, Embodiment 7 of this invention will be described below. Four testing samples each provided on a silicon wafer 601 with the interface between a polymer thin film 602 and a Cu thin film 603 were prepared (FIG. 18(a)). The low dielectric constant organic polymer layer and the borazine-siloxane polymer layer in each of the samples were tested for Cu concentration by the secondary ion mass analysis method (SIMS: an instrument made by Physical Electronics Corp. and sold under the trademark designation of "Quadrupole SIMS"). The samples were also subjected to a heat treatment performed in an atmosphere of nitrogen at 400° C. for six hours to determine the effect of thermal diffusion. The sections of these samples were observed under a scanning electron microscope (SEM: made by Hitachi, Ltd. and sold under the trademark designation of "SEM S-4700") to determine the state of interface affected by Cu diffusion.

Figures 18A, 18B:
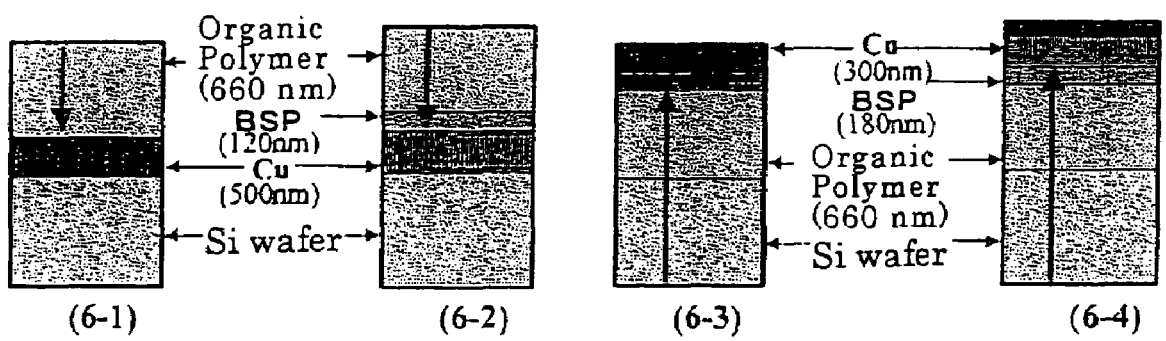
FIG. 18(a) is a schematic cross section illustrating the structure of a Cu dispersed evaluation of four testing samples (SIMS analysis performed from the direction shown by an arrow mark) and (b) is a diagram showing the thickness of the respective component layers thereof.

Sample-1 (FIG. 18(a)-(1)) was produced by forming a Cu thin film (about 500 nm) by the sputtering technique on a Si wafer, applying a borazine-siloxane polymer thereon with a spin coater, heating the coated substrate at 200° C. for one hour and further at 300° C. for 30 minutes, thereby forming a thin film having a thickness of about 120 nm, and applying thereon a SiLK with a spin coater and heating the coated substrate at 250° C. for 30 minutes and further at 400° C. for 30 minutes, thereby forming a thin film having a thickness of about 660 nm. For the purpose of comparison, Sample-2 (FIG. 18(a)-(2)) was produced through direct application of only SiLK (R) onto a Cu thin film (about 500 nm) and hardening of the applied layer. Since these samples had their polymers directly applied on the Cu thin film and then annealed, they were thought to have the possibility of suffering Cu to permeate and defile the polymers. Sample-3 (FIG. 18(a)-(3)) was produced by applying a SiLK (R) on a Si wafer and heating the coated substrate, thereby forming a thin film having a thickness of 660 nm, further applying a borazine-siloxane polymer and hardening the applied layer, thereby forming a thin film having a thickness of about 180 nm, and forming thereon a Cu thin film having a thickness of about 300 nm by evaporation. For the purpose of comparison, Sample-4 (FIG. 18(a)-(4)) was produced through application of SiLK (R) alone onto a Si wafer and heat treatment of the coated substrate to thereby form a thin film having a thickness of about 660 nm and formation of a Cu thin film having a thickness of about 300 nm by evaporation.

One group of these samples was given a heat treatment and another group of them was not given a heat treatment. They were tested for Cu concentrations in the SiLK and in the borazine-siloxane polymer by the use of the SIMS. The SIMS analysis was performed from the polymer layer on the uppermost side in Sample-1 and Sample-1 and from the rear side of the Si substrate in Sample-3 and Sample-4.

Figure 19:
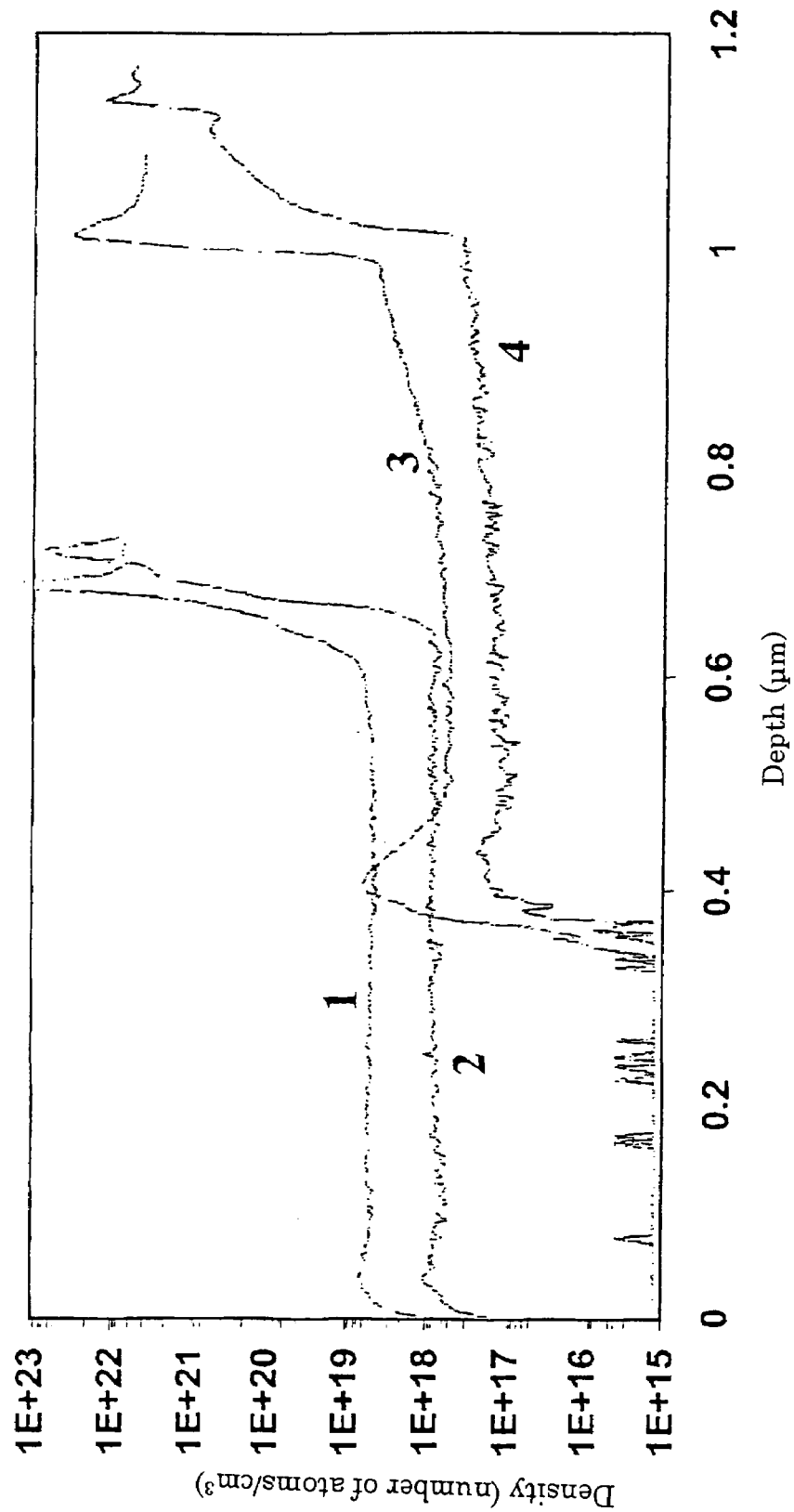
FIG. 19 is a diagram showing the conditions of Cu diffusion in samples of different structures determined by the SIMS.
Figure 20A:
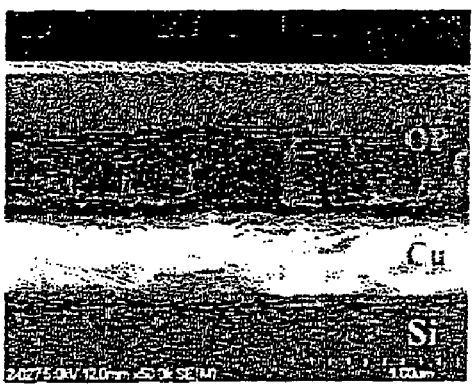
FIGS. 20(a), (b), (c) and (d) are diagrams showing sectioned SEM photographs (upper: sample 1, lower: sample 3) of Si/organic polymer/Cu interfaces before and after annealing.
Figure 20B:
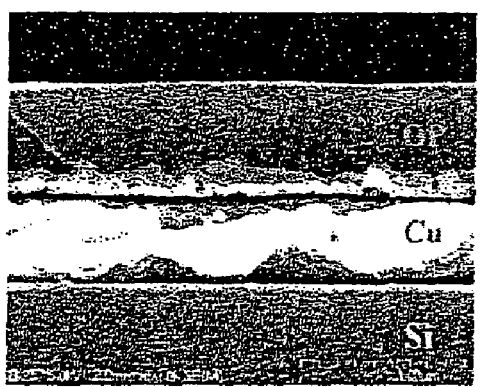
Figure 20C:
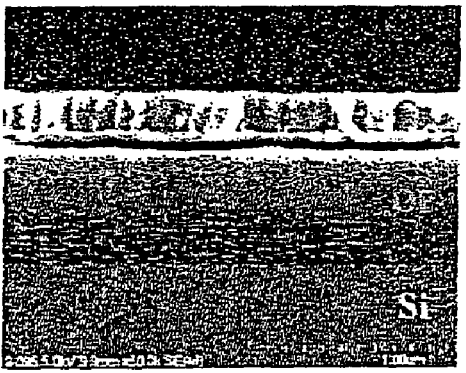
Figure 20D:
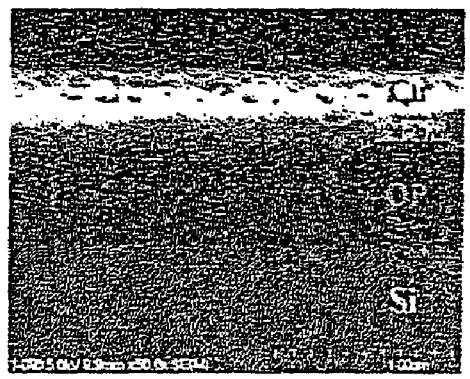

The four samples were examined with the SIMS to determine the states of Cu diffusion prior to a heat treatment. The results are shown in FIG. 19. Comparison of the Cu concentrations found in the organic polymers of these samples reveals that the organic polymer of Sample-1 obtained by directly applying the organic polymer on the Cu thin film on the Si wafer and hardening the applied layer had the highest Cu concentration and that this Cu concentration was higher by nearly two places of decimals than the Cu concentration found in Sample-4 of the worst results produced by applying the organic polymer on the Si wafer and hardening the applied layer, further applying the borazine-siloxane polymer thereon and hardening the applied layer and depositing the Cu thin film thereon by evaporation. The Cu concentration in the organic polymer was widely varied by the method used for the production of sample. Since the sample obtained by directly applying the organic polymer on the Cu thin film and hardening the applied layer gave the coated substrate during the course of hardening a heat treatment of 400° C., the diffusion of Cu in the polymer occurred during the course of this heat treatment. It is inferred that this diffusion may be one cause for the wide difference.

In Sample-2 which had the borazine-siloxane thin film disposed in the interface between the Cu thin film and the organic polymer, the borazine-siloxane polymer was found to manifest a Cu concentration smaller by one place of decimal and bring a discernible effect in suppressing the Cu diffusion. Since this sample similarly hardened the borazine-siloxane polymer and the organic polymer on the Cu thin film at elevated temperatures, it is inferred that the Cu was thermally diffused in both the polymers in the course of this heat treatment.

In Sample-3 and Sample-4, since the Cu thin film was deposited by evaporation after the organic polymer had been hardened, it is inferred that the Cu concentration was scarcely increased by thermal diffusion. Sample-3 had the Cu directly deposited by evaporation on the organic polymer thin film, it presumably had the possibility of inducing diffusion of Cu during the course of the evaporation. Sample-4 that had the smallest Cu concentration in the organic polymer revealed the smallest diffusion of Cu owing to the interposition of the borazine-siloxane polymer thin film and showed the Cu concentration in the organic polymer approximating closely to the limit of detection by the SIMS.

From the results described above, the borazine-siloxane polymer is found to have a discernible effect in preventing Cu from diffusing into the insulating film.

Figures 21A, 21C:
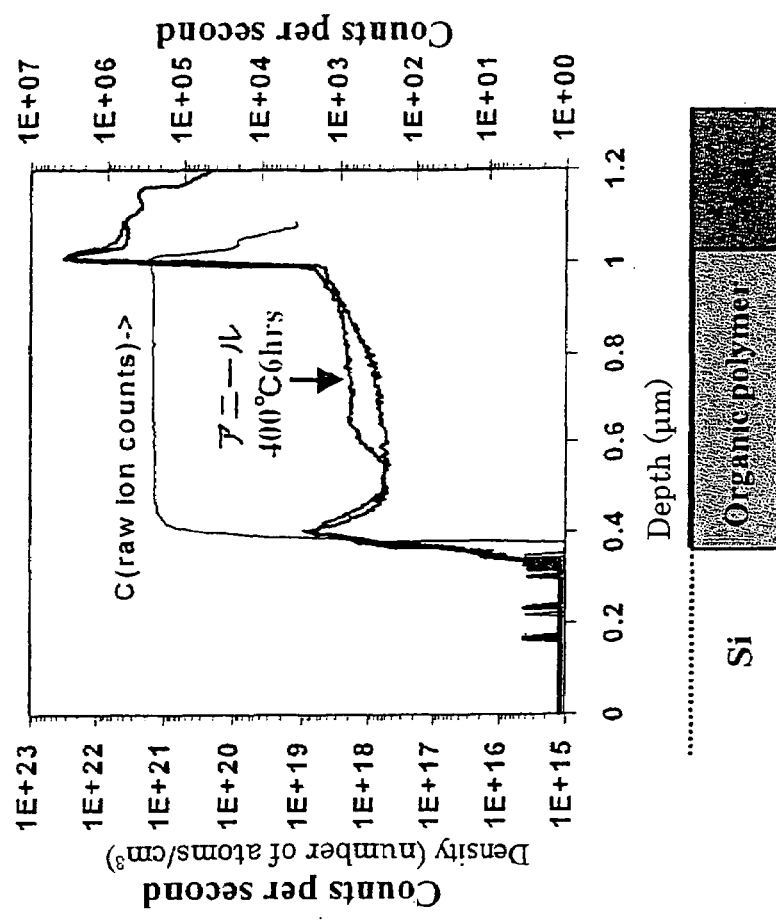
FIGS. 21(a) through (d) are diagrams showing the conditions of Cu diffusion in the organic polymers illustrated in (c) and (d), respectively, as determined before and after annealing by the use of the SIMS.
Figures 21B, 21D:
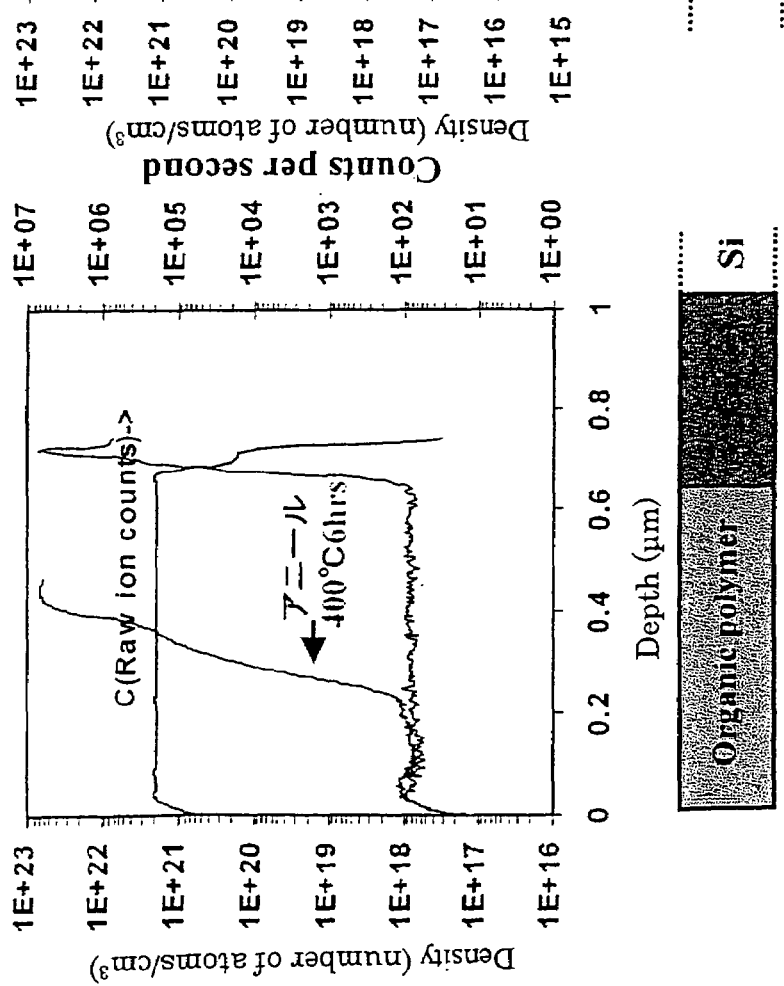

The samples were respectively subjected to a heat treatment performed in an atmosphere of nitrogen at 400° C. for six hours to investigate the states of diffusion of Cu in the organic polymer and in the borazine-siloxane polymer. Sample-1 and Sample-3 that allowed Cu and the organic polymer to contact directly along the interface because of the absence of the borazine-siloxane polymer were given a heat treatment and the sections thereof were observed by the use of the SEM. As noted clearly from FIG. 20, both the samples were found to have produced a noticeably denatured layer in the organic polymer. These samples were tested for Cu concentration in the organic polymer by the use of the SIMS and the results are shown in FIG. 21. In Sample-1, the Cu concentration in the organic polymer was continuously intense from the Cu interface through the depth of the polymer, indicating conspicuous thermal diffusion of Cu. Sample-3 did not show such a conspicuous change in the Cu concentration as in Sample-1. This sample, when compared with the sample that had not undergone the heat treatment, was found to have Cu diffused, though at a low concentration, to two thirds of the organic polymer layer. The appearance of the conspicuously denatured layer as observed in Sample-1 may be possibly ascribed to the fact that the organic polymer was spread on the Cu thin film and hardened thereon.

Figure 22:
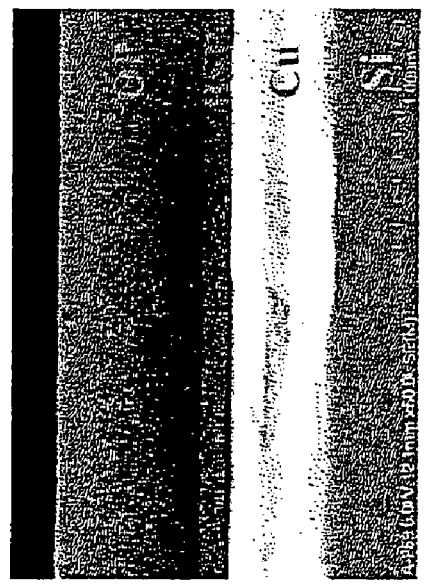
FIG. 22 is a diagram showing the section SEM photographs of a Si/Cu/borazine polymer/organic polymer interfaces before and after annealing.
Figure 22:
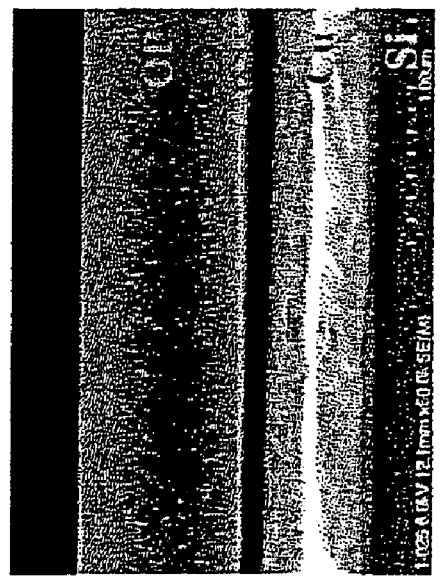

Then, Sample-2 that involved the insertion of the borazine-siloxane thin film was subjected to a heat treatment under the same conditions as described above. When the section of this sample was observed under the SEM, it showed absolutely no discernibly denatured layer in the organic polymer due to the heat treatment as shown in FIG. 22 and showed no denatured layer in the interface between the Cu and the borazine-siloxane polymer. The results clearly indicate that the borazine-siloxane polymer suppressed the Cu diffusion in the organic polymer.

Figure 23A:
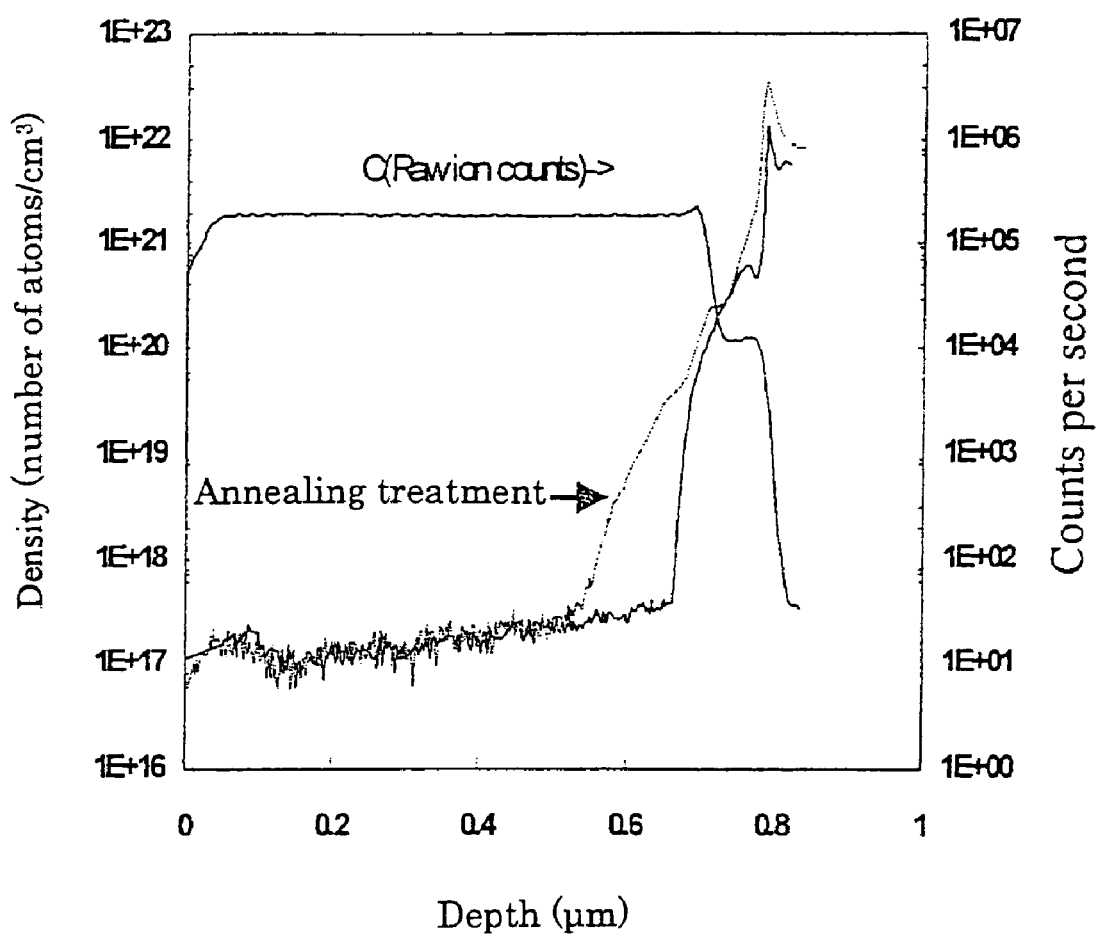
FIG. 23(a) is a diagram showing the conditions of Cu diffusion in the borazine polymer/organic polymer illustrated in (b) as determined before and after annealing by the use of the SIMS.
Figure 23B:

FIG. 23 shows the change of the Cu concentration in the direction of the depth of the polymer layer as found by the SIMS. The heat treatment heightened the Cu concentration in the neighborhood of the interface between the borazine-siloxane polymer and the organic polymer from the level existing prior to the heat treatment and, as a whole, induced the state of Cu diffusion existing prior to the heat treatment. Comparison of the results of FIG. 23 and those of FIG. 21 reveals that the borazine-siloxane polymer had the effect of suppressing the Cu diffusion.

Figure 24:
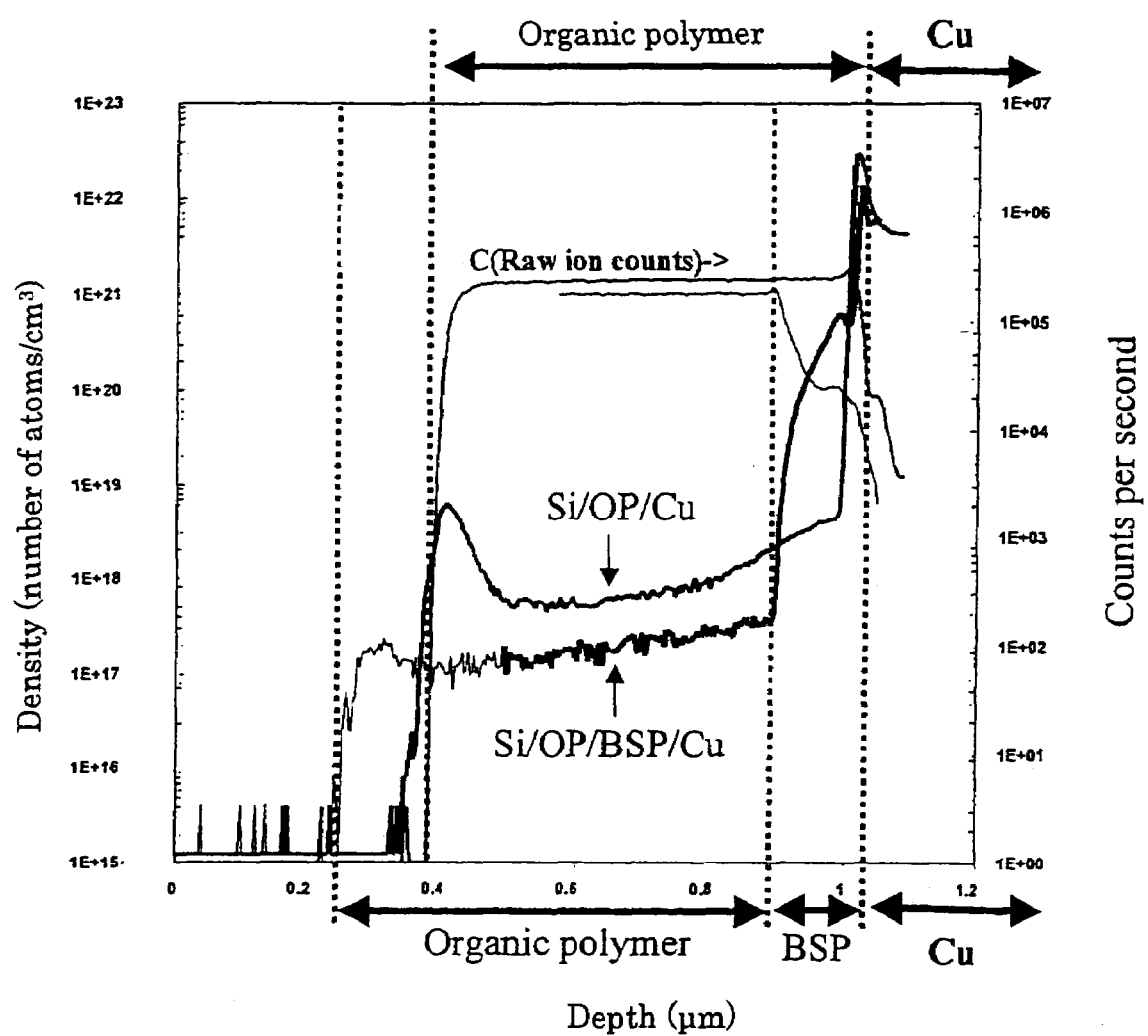
FIG. 24 is a diagram depicting comparison of the condition of Cu diffusion in an organic polymer and a BSP (sample 3 and sample 4 having undergone no annealing treatment) as determined by the use of the SIMS.

For the sake of comparing the organic polymer and the borazine-siloxane polymer in terms of the phenomenon of Cu diffusion, the results of the SIMS measurements of Sample-3 and Sample-4 are shown in FIG. 24 in such a manner that the interface between the Cu and the organic polymer and the interface between the Cu and the borazine-siloxane polymer may overlap. In the borazine-siloxane polymer, the diffusion of Cu showed a typical trend of thermal diffusion and proceeded gradually from the phase boundary of Cu toward the direction of depth. In the organic polymer, the Cu diffusion possessed something like a threshold and, beyond this point, appeared to spread at a high speed throughout the entire polymer layer.

Comparison of the speeds of Cu diffusion in the organic polymer and in the borazine-siloxane polymer apparently reveals that the diffusion speed in the organic polymer was higher by some tens of times that in the other polymer. Comparison of the Cu concentrations in the polymers adjoining the phase boundary of Cu reveals that the organic polymer had a rather smaller value than the borazine-siloxane polymer. The Cu concentration as viewed throughout the entire organic polymer layer assumed a smaller value owing to the insertion of the borazine-siloxane.

INDUSTRIAL APPLICABILITY

By using a polymer material containing borazine manifesting a low dielectric constant and possessing a function of preventing Cu diffusion as a hard mask, an etch stopper and a diffusion barrier utilized between insulating layers, it is made possible to allay the wiring capacity and consequently enable a semiconductor device to produce a high-speed operation. Further, a polymer containing a borazine ring and silicon (Si), such as a borazine-siloxane polymer, simplifies the process for the production of a semiconductor device as by allowing the application thereof to be readily attained by the use of a spin coater. Further, by using an organic macromolecular material as an interlayer insulating material, it is made possible to produce a semiconductor device by a process gentle to the global environment while perfectly obviating the necessity for using the PFC gas which has a high coefficient of warming the earth.

The invention claimed is:

1. A semiconductor device, comprising:
a wiring structure comprising
  a first wiring layer formed on a surface of a semiconductor region forming an active component or a passive component, and
  a second wiring layer formed in an upper layer of the first wiring layer,
  a first insulating structure insulating the semiconductor region and the first wiring layer,
  a second insulating structure insulating an interlayer formed of the first wiring layer,
  a third insulating structure contained in a structure electrically insulating the first wiring layer and the second wiring layer and forming connecting holes electrically connecting the first wiring layer and the second wiring layer, and
  a fourth insulating structure insulating an interlayer formed with the second wiring layer, and
  comprising in one of the second, third and fourth insulating structures an insulating material, said insulating material comprising:
a borazine-silicon polymer obtained by hydrosilylation polymerization of
a borazine compound represented by chemical formula 1 possessing an alkyl group for a nitrogen atom and an alkyl group-substituted triple bond-containing organic group for a boron atom in a borazine ring, in which the boron atom has an acetylene group directly linked thereto or $R_2$ and an acetylene group jointly linked thereto; and
a silicon compound represented by chemical formula 2 possessing at least two hydrosilyl groups or a cyclic silicon compound represented by chemical formula 3 possessing at least two hydrosilyl groups; in which:

$R_1$ denotes an alkyl group,
$R_2$ denotes —$(CH_2)$-m (m denoting an integer of 0 or more),
$R_3$ denotes an alkyl group linked to an acetylene group,
$R_4$ and $R_5$ each denote one identical or different monovalent group selected from the group consisting of an alkyl group, an aryl group, an aralkyl group and a hydrogen atom,
$R_6$ denotes a divalent aromatic group optionally possessing a substituent group, an oxygen atom, a siloxane or an oxypoly(dimethyl siloxy) group, and
$R_7$ denotes an alkyl group, an aryl group or an aralkyl group;
wherein chemical formula 1 is as follows

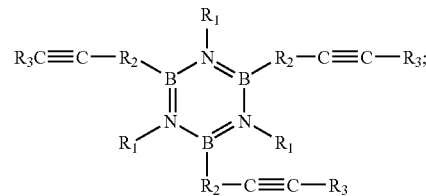

wherein chemical formula 2 is as follows

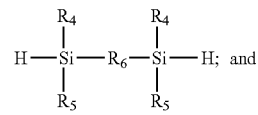

wherein chemical formula 3 is as follows

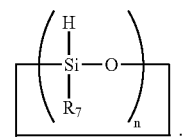

2. An insulating layer, comprising:
an insulating material;
wherein said insulating layer is between electric wirings; and
wherein said insulating material comprises:
a borazine-silicon polymer obtained by hydrosilylation polymerization of
a borazine compound represented by chemical formula 1 possessing an alkyl group for a nitrogen atom and an alkyl group-substituted triple bond-containing organic group for a boron atom in a borazine ring, in which the boron atom has an acetylene group directly linked thereto or $R_2$ and an acetylene group jointly linked thereto; and
a silicon compound represented by chemical formula 2 possessing at least two hydrosilyl groups or a cyclic silicon compound represented by chemical formula 3 possessing at least two hydrosilyl groups; in which:

$R_1$ denotes an alkyl group, $R_2$ denotes —$(CH_2)$-m (m denoting an integer of 0 or more), $R_3$ denotes an alkyl group linked to an acetylene group, $R_4$ and $R_5$ each denote one identical or different monovalent group selected from the group consisting of an alkyl group, an aryl group, an aralkyl group and a hydrogen atom, $R_6$ denotes a divalent aromatic group optionally possessing a substituent group, an oxygen atom, a siloxane or an oxypoly(dimethyl siloxy) group, and $R_7$ denotes an alkyl group, an aryl group or an aralkyl group;

wherein chemical formula 1 is as follows

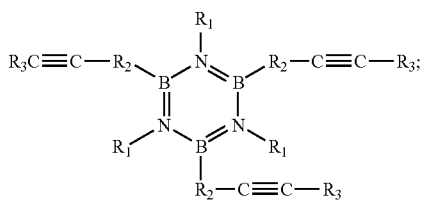

wherein chemical formula 2 is as follows

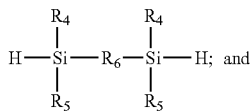

wherein chemical formula 3 is as follows

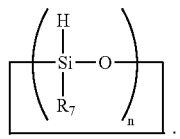

3. An insulating layer, comprising:

an insulating material;

wherein said insulating layer is between electric wirings; and wherein said insulating material comprises a borazine-silicon polymer obtained by hydrosilylation polymerization of a mixture of a first borazine compound represented by chemical formula 4 and a second borazine compound represented by chemical formula 5, the first borazine compound possessing an alkyl group for a nitrogen atom and an alkyl group-substituted triple bond-containing organic group for a boron atom in a borazine ring, in which the boron atom has an acetylene group directly linked thereto or has linked thereto R2 to which an acetylene group has been linked, the second boranzine compound possessing an alkyl group for a nitrogen atom and a triple bond-containing organic group not substituted by an alkyl group for a boron atom in a borazine ring, wherein the boron atom has an acetylene group directly linked thereto or has linked thereto R9 to which an acetylene group has been linked, the second borazine compound (formula 5) having a mixing ratio of: 90:10 to 0:100 to the first borazine compound (formula 4); and a silicon compound represented by chemical formula 6 possessing at least two hydrosilyl groups or a cyclic silicon compound represented by chemical formula 7 possessing at least two hydrosilyl groups, in which:

$R_1$ denotes an alkyl group, $R_2$ denotes —$(CH_2)$-m (m denoting an integer of 0 or more), $R_3$ denotes an alkyl group linked to an acetylene group, $R_4$ and $R_5$ each denote one identical or different univalent group selected from the group consisting of an alkyl group, an aryl group, an aralkyl group and a hydrogen atom, $R_6$ denotes a divalent aromatic group optionally possessing a substituent group, an oxygen atom, a siloxane or an oxypoly(dimethyl siloxy) group, $R_7$ denotes an alkyl group, an aryl group or an aralkyl group, $R_8$ denotes an alkyl group, $R_9$ denotes a methylene group, and n denotes an integer of 3 or more;

wherein chemical formula 4 is as follows

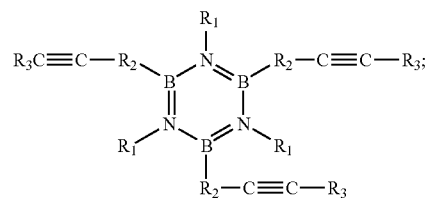

wherein chemical formula 5 is as follows

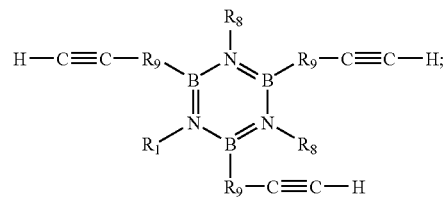

wherein chemical formula 6 is as follows

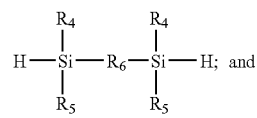

wherein chemical formula 7 is as follows

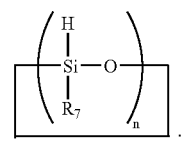

4. An ultra large scale integrated circuit (ULSI), comprising:
an USLI multilayer interconnection; and
an insulating layer between electric wirings, said insulating layer comprising an insulating material which comprises
a borazine-silicon polymer obtained by hydrosilylation polymerization of
a borazine compound represented by chemical formula 1 possessing an alkyl group for a nitrogen atom and an alkyl group-substituted triple bond-containing organic group for a boron atom in a borazine ring, in which the boron atom has an acetylene group directly linked thereto or $R_2$ and an acetylene group jointly linked thereto; and
a silicon compound represented by chemical formula 2 possessing at least two hydrosilyl groups or a cyclic silicon compound represented by chemical formula 3 possessing at least two hydrosilyl groups; in which:
$R_1$ denotes an alkyl group,
denotes —$(CH_2)$-m (m denoting an integer of 0 or more),
$R_3$ denotes an alkyl group linked to an acetylene group,
$R_4$ and $R_5$ each denote one identical or different monovalent group selected from the group consisting of an alkyl group, an aryl group, an aralkyl group and a hydrogen atom,
$R_6$ denotes a divalent aromatic group optionally possessing a substituent group, an oxygen atom, a siloxane or an oxypoly(dimethyl siloxy) group, and
$R_7$ denotes an alkyl group, an aryl group or an aralkyl group;
wherein chemical formula 1 is as follows

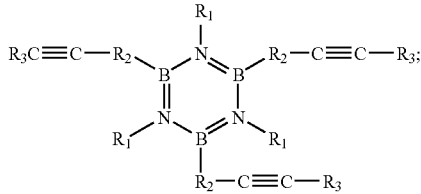

wherein chemical formula 2 is as follows

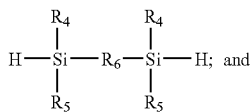

wherein chemical formula 3 is as follows

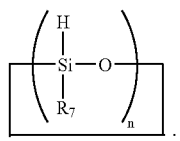

5. An ultra large scale integrated circuit (ULSI), comprising:
an USLI multilayer interconnection; and
an insulating layer between electric wirings, said insulating layer comprising the insulating material;
wherein said insulating material comprises
a borazine-silicon polymer obtained by hydrosilylation polymerization of
a mixture of a first borazine compound represented by chemical formula 4 and a second borazine compound represented by chemical formula 5, the first borazine compound possessing an alkyl group for a nitrogen atom and an alkyl group-substituted triple bond-containing organic group for a boron atom in a borazine ring, in which the boron atom has an acetylene group directly linked thereto or has linked thereto R2 to which an acetylene group has been linked, the second boranzine compound possessing an alkyl group for a nitrogen atom and a triple bond-containing organic group not substituted by an alkyl group for a boron atom in a borazine ring, wherein the boron atom has an acetylene group directly linked thereto or has linked thereto R9 to which an acetylene group has been linked, the second borazine compound (formula 5) having a mixing ratio of: 90:10 to 0:100 to the first borazine compound (formula 4); and
a silicon compound represented by chemical formula 6 possessing at least two hydrosilyl groups or a cyclic silicon compound represented by chemical formula 7 possessing at least two hydrosilyl groups, in which:
$R_1$ denotes an alkyl group,
$R_2$ denotes —$(CH_2)$-m (m denoting an integer of 0 or more),
$R_3$ denotes an alkyl group linked to an acetylene group,
$R_4$ and $R_5$ each denote one identical or different univalent group selected from the group consisting of an alkyl group, an aryl group, an aralkyl group and a hydrogen atom,
$R_6$ denotes a divalent aromatic group optionally possessing a substituent group, an oxygen atom, a siloxane or an oxypoly(dimethyl siloxy) group,
$R_7$ denotes an alkyl group, an aryl group or an aralkyl group,
$R_8$ denotes an alkyl group,
$R_9$ denotes a methylene group, and
n denotes an integer of 3 or more;
wherein chemical formula 4 is as follows

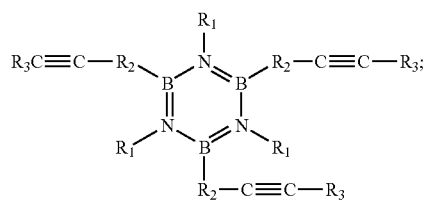

wherein chemical formula 5 is as follows

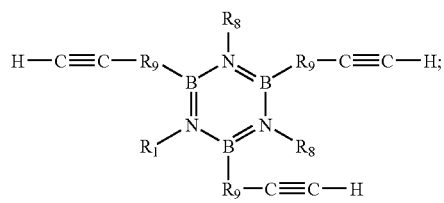

wherein chemical formula 6 is as follows

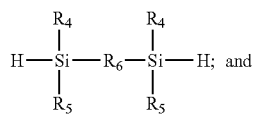 and wherein chemical formula 7 is as follows

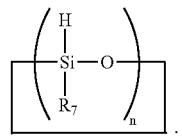.

6. A semiconductor device, comprising:

a wiring structure comprising
- a first wiring layer formed on a surface of a semiconductor region forming an active component or a passive component, and
- a second wiring layer formed in an upper layer of the first wiring layer,
- a first insulating structure insulating the semiconductor region and the first wiring layer,
- a second insulating structure insulating an interlayer formed of the first wiring layer,
- a third insulating structure contained in a structure electrically insulating the first wiring layer and the second wiring layer and forming connecting holes electrically connecting the first wiring layer and the second wiring layer, and
- a fourth insulating structure insulating an interlayer formed with the second wiring layer, and
- comprising in one of the second, third and fourth insulating structures an insulating material, said insulating material comprising:

a borazine-silicon polymer obtained by hydrosilylation polymerization of a mixture of a first borazine compound represented by chemical formula 4 and a second borazine compound represented by chemical formula 5, the first borazine compound possessing an alkyl group for a nitrogen atom and an alkyl group-substituted triple bond-containing organic group for a boron atom in a borazine ring, in which the boron atom has an acetylene group directly linked thereto or has linked thereto R2 to which an acetylene group has been linked, the second boranzine compound possessing an alkyl group for a nitrogen atom and a triple bond-containing organic group not substituted by an alkyl group for a boron atom in a borazine ring, wherein the boron atom has an acetylene group directly linked thereto or has linked thereto R9 to which an acetylene group has been linked, the second borazine compound (formula 5) having a mixing ratio of: 90:10 to 0:100 to the first borazine compound (formula 4); and a silicon compound represented by chemical formula 6 possessing at least two hydrosilyl groups or a cyclic silicon compound represented by chemical formula 7 possessing at least two hydrosilyl groups, in which:

$R_1$ denotes an alkyl group, $R_2$ denotes —$(CH_2)$-m (m denoting an integer of 0 or more), $R_3$ denotes an alkyl group linked to an acetylene group, $R_4$ and $R_5$ each denote one identical or different univalent group selected from the group consisting of an alkyl group, an aryl group, an aralkyl group and a hydrogen atom, $R_6$ denotes a divalent aromatic group optionally possessing a substituent group, an oxygen atom, a siloxane or an oxypoly(dimethyl siloxy) group, $R_7$ denotes an alkyl group, an aryl group or an aralkyl group, $R_8$ denotes an alkyl group, $R_9$ denotes a methylene group, and n denotes an integer of 3 or more;

wherein chemical formula 4 is as follows

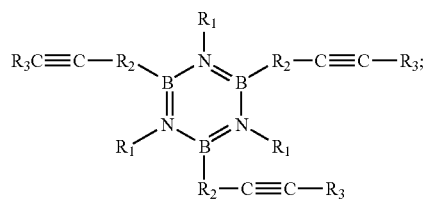

wherein chemical formula 5 is as follows

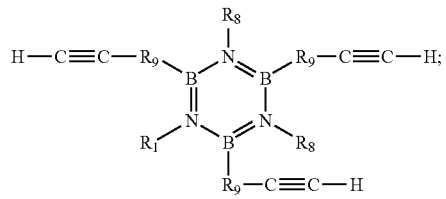

wherein chemical formula 6 is as follows

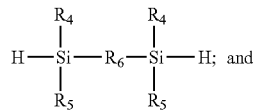 and wherein chemical formula 7 is as follows

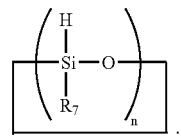.

* * * * *